(12) United States Patent
Oh et al.

(10) Patent No.: US 10,879,432 B2
(45) Date of Patent: Dec. 29, 2020

(54) QUANTUM DOT PLATE ASSEMBLY AND LED PACKAGE AND MODULE COMPRISING THE SAME

(71) Applicant: LUMENS CO., LTD., Yongin-si (KR)

(72) Inventors: Seung Hyun Oh, Yongin-si (KR); Jung Hyun Park, Yongin-si (KR); Byeong Geon Kim, Yongin-si (KR); Pyoung Gug Kim, Yongin-si (KR); Sung Sik Jo, Yongin-si (KR); Jae Yoon Lim, Yongin-si (KR); Ho Joong Lim, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/272,210

(22) Filed: Feb. 11, 2019

(65) Prior Publication Data

US 2019/0296196 A1   Sep. 26, 2019

(30) Foreign Application Priority Data

Mar. 26, 2018  (KR) .................. 10-2018-0034400
Aug. 13, 2018  (KR) .................. 10-2018-0094219
(Continued)

(51) Int. Cl.
*H01L 33/00*   (2010.01)
*H01L 33/60*   (2010.01)
(Continued)

(52) U.S. Cl.
CPC ........ *H01L 33/502* (2013.01); *H01L 33/0075* (2013.01); *H01L 33/32* (2013.01);
(Continued)

(58) Field of Classification Search
CPC .......... H01L 33/502–508; H01L 33/60; H01L 33/62; H01L 33/0075; H01L 33/32;
(Continued)

(56) References Cited

U.S. PATENT DOCUMENTS

2010/0103648 A1   4/2010  Kim et al.
2013/0083513 A1*  4/2013  Saito .................. G02F 1/133615
                                              362/97.2
(Continued)

FOREIGN PATENT DOCUMENTS

KR   10-2010-0046698 A    5/2010
KR      10-1567900 B1    11/2015
WO      2016/104404 A1    6/2016

OTHER PUBLICATIONS

International Search Report dated Apr. 3, 2019 in corresponding International Application No. PCT/KR2018/016210, filed Dec. 19, 2018.

Primary Examiner — Natalia A Gondarenko
(74) Attorney, Agent, or Firm — Mei & Mark LLP

(57) ABSTRACT

Provided is a light emitting device package including: a light emitting device; a light transmitting plate body formed above the light emitting device and including a lower light transmitting plate, a plurality of side light transmitting plates formed on an upper surface of the lower light transmitting plate, an upper light transmitting plate corresponding to the upper surface of the lower light transmitting plate and formed on upper surfaces of the plurality of side light transmitting plates, and an empty portion formed inside; a wavelength converting unit including a first wavelength converting layer formed on a lower surface of the lower light transmitting plate and a second wavelength converting layer formed in the empty portion and covering the upper surface of the lower light transmitting plate; and an adhesive layer formed between the first wavelength converting layer and the light emitting device, in which the adhesive layer is formed on at least one side and an upper surface of the light emitting device and a lower surface of the first wavelength converting layer.

18 Claims, 55 Drawing Sheets

(30) Foreign Application Priority Data

| Aug. 16, 2018 | (KR) | 10-2018-0095391 |
| Aug. 24, 2018 | (KR) | 10-2018-0099039 |
| Aug. 27, 2018 | (KR) | 10-2018-0100246 |
| Oct. 10, 2018 | (KR) | 10-2018-0120190 |
| Nov. 16, 2018 | (KR) | 10-2018-0142025 |

(51) Int. Cl.
*H01L 33/62* (2010.01)
*H01L 33/64* (2010.01)
*H01L 33/50* (2010.01)
*H01L 33/32* (2010.01)

(52) U.S. Cl.
CPC .............. *H01L 33/60* (2013.01); *H01L 33/62* (2013.01); *H01L 33/64* (2013.01); *H01L 2933/0033* (2013.01); *H01L 2933/0041* (2013.01)

(58) Field of Classification Search
CPC ....... H01L 33/483; H01L 33/64; H01L 33/52; H01L 33/54; H01L 33/642; H01L 33/641; H01L 33/644; H01L 2933/0033; H01L 2933/0041; H01L 2933/0091; H01L 33/504; H01L 33/505; H01L 33/507; H01L 25/0753; H01L 31/035218; H01L 51/502; H01L 2933/005; H01L 2933/0066–0091; H01L 2924/01101–01103; H01L 2924/01105–01107; H01L 2924/12041; H01L 33/48–648
USPC .......................... 257/98, 99, 79, 100; 438/29
See application file for complete search history.

(56) References Cited

U.S. PATENT DOCUMENTS

| 2013/0207148 | A1* | 8/2013 | Krauter | H01L 33/58 257/98 |
| 2015/0204494 | A1* | 7/2015 | Wada | H01L 24/83 313/498 |
| 2017/0222096 | A1 | 8/2017 | Fan | |
| 2017/0345977 | A1 | 11/2017 | Goeoetz et al. | |
| 2019/0081218 | A1* | 3/2019 | Dawson-Elli | H01L 33/56 |
| 2019/0198729 | A1* | 6/2019 | Hayashi | H01L 33/54 |
| 2019/0245123 | A1* | 8/2019 | Fan | H01L 33/507 |

* cited by examiner

<QUANTUM DOT SIZE AND COLOR>

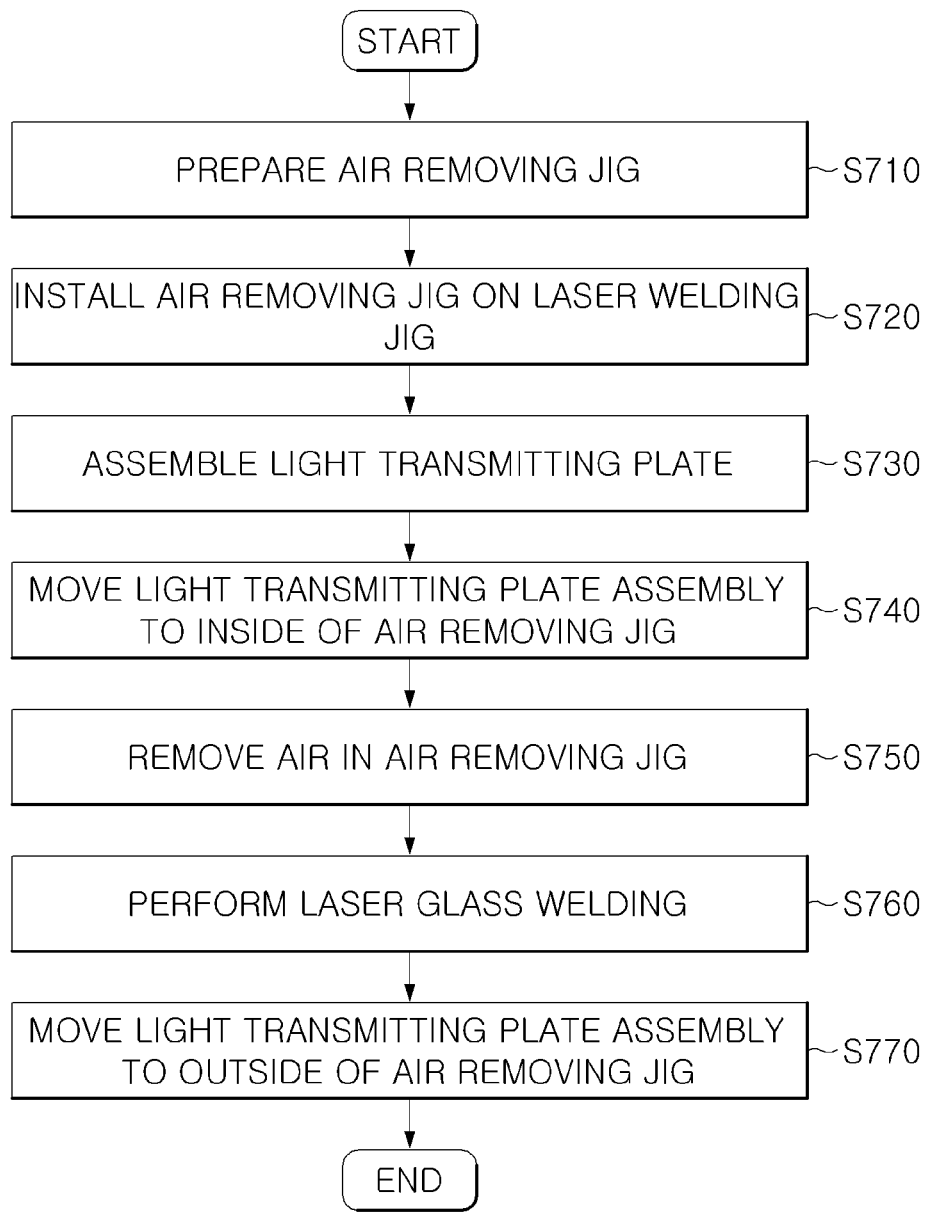

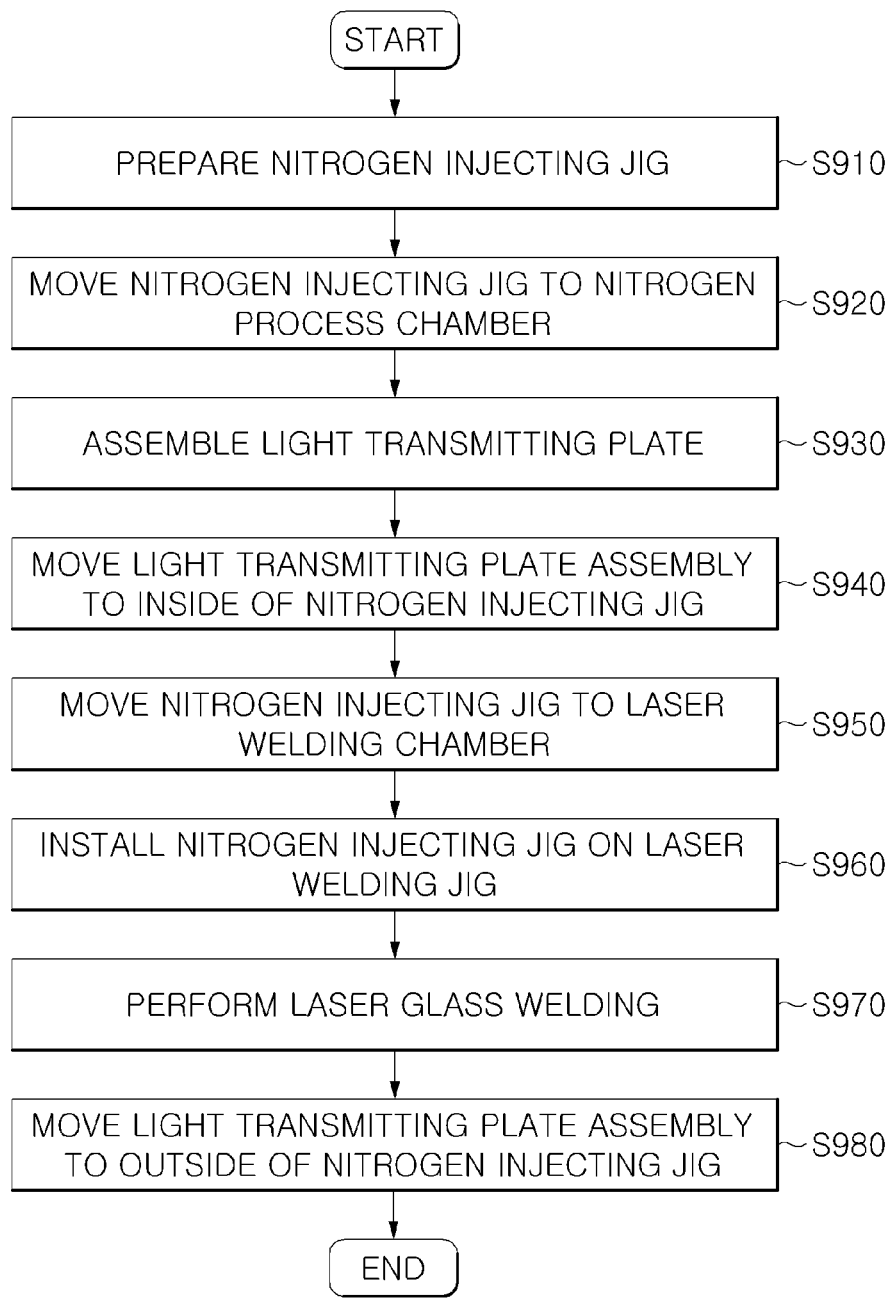

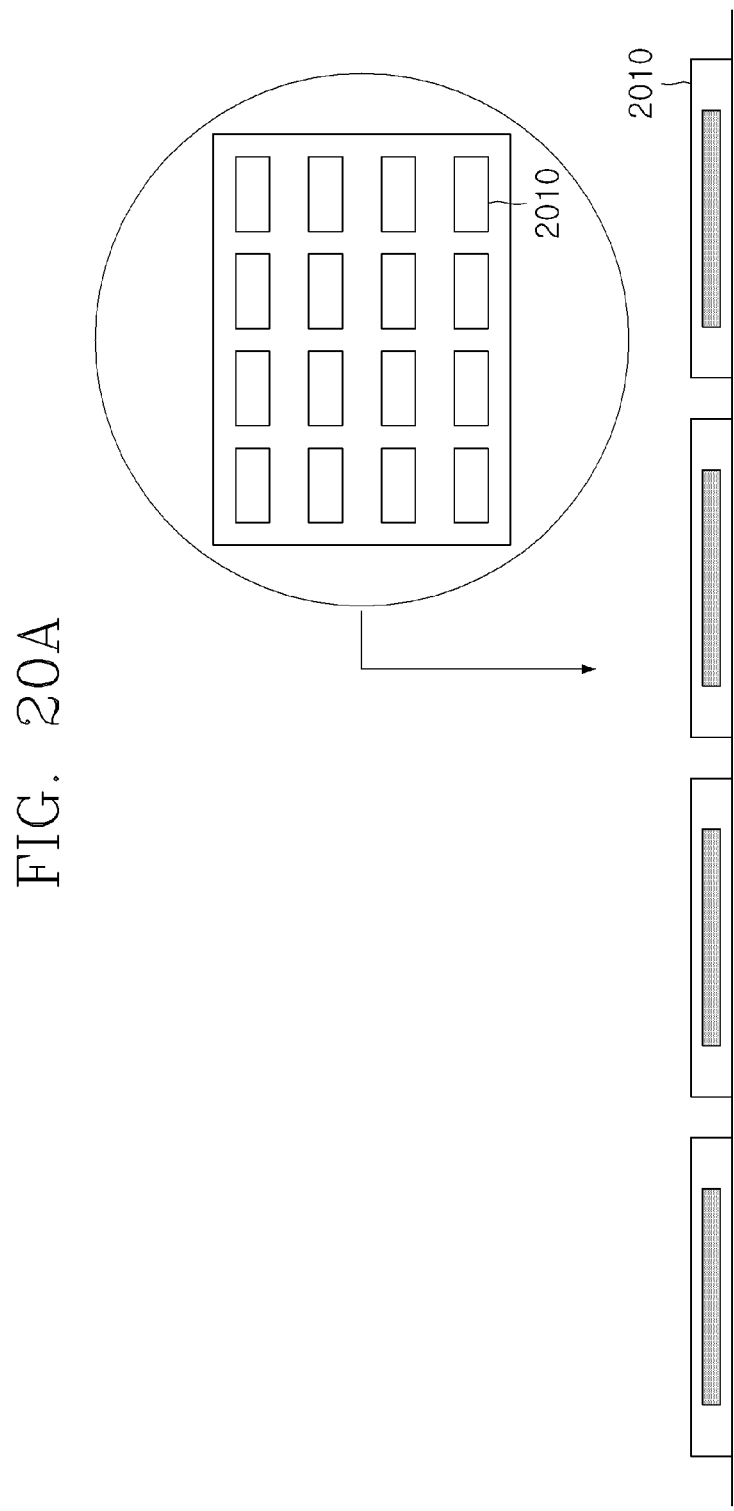

QUANTUM DOT PLATE ASSEMBLY AND LED PACKAGE AND MODULE COMPRISING THE SAME

CROSS-REFERENCE TO RELATED APPLICATIONS

This application claims priorities under 35 U.S.C. § 119 to Korean Patent Application No. 10-2018-0034400 filed on Mar. 26, 2018, Korean Patent Application No. 10-2018-0094219 filed on Aug. 13, 2018, Korean Patent Application No. 10-2018-0095391 filed on Aug. 16, 2018, Korean Patent Application No. 10-2018-0099039 filed on Aug. 24, 2018, Korean Patent Application No. 10-2018-0100246 filed on Aug. 27, 2018, Korean Patent Application No. 10-2018-0120190 filed on Oct. 10, 2018 and Korean Patent Application No. 10-2018-0142025 filed on Nov. 16, 2018, in Korean Intellectual Property Office, the entire contents of which is hereby incorporated by reference.

BACKGROUND OF THE INVENTION

Field of the Invention

The present invention relates to a quantum dot plate assembly, a light emitting device (LED) package and an LED module including the same, and more particularly, to a quantum dot plate assembly in which a QD phosphor is sealed in an empty portion of a light transmitting plate body and a light emitting device package and an LED module including the same.

Description of the Related Art

A light emitting device (LED) is a type of semiconductor device that converts electrical energy into light energy. The LED has advantages such as low power consumption, semi-permanent lifetime, a rapid response speed, safety, and environment friendliness compared with existing light sources, which include fluorescent lamps, incandescent lamps, and the like.

Therefore, many studies have been conducted to replace the existing light sources with the light emitting devices and a case of using light emitting devices as light sources of a lighting apparatus for various lamps used indoors/outdoors, liquid crystal display devices, electric sign boards, street lamps, etc. has increased.

Meanwhile, a demand for white LEDs is high in an LED field. A scheme for implementing the white LED includes a scheme for combining various colors of light emitting devices and a scheme for combining a light emitting device emitting light of a specific color and a phosphor that converts a wavelength of light emitted from a corresponding chip. Currently, a latter scheme is mainly used in order to implement the white LED, and the white LED is implemented by applying a YAG:Ce bulk phosphor on a blue light emitting device most representatively.

However, there is a problem that it is difficult to implement high color reproducibility when manufacturing a display, in a light emitting device package adopting such a bulk phosphor. In order to solve the problem, in recent years, various attempts have been made to implement the light emitting device package using the quantum dot (QD) phosphor in recent years.

Quantum dots represent nanoparticles of several tens of nanometers (nm) or less having semiconductor characteristics and are a key material which attracts a great attention because the quantum dots exhibit properties different from particles having a bulk size due to a quantum confinement effect.

However, the phosphors using the quantum dots are very vulnerable to external environmental conditions (moisture, oxygen, heat, etc.), and as a result, performance easily deteriorates. In particular, depending on a directional pattern of blue light emitted from the light emitting device, the corresponding light is attracted to the center of the quantum dot phosphor, and as a result, a thermal distribution due to excitation is concentrated on a predetermined portion of the quantum dot phosphor. Such a phenomenon has a problem of gradually increasing thermal stress toward the center of the quantum dot phosphor, which causes a reliability defect such as discoloration and carbonization.

A rail type quantum dot has a difficulty in processing depending on a rail type and is vulnerable to heat, and a film type quantum dot has a high cost problem due to the use of a large area.

In the related art, a method is used, which mixes a polymer with the quantum dots (QD) and forms the polymer mixed with the quantum dots in a sheet state and coats multiple barrier layers on the surface of a sheet in order to protect the surface of the sheet from external moisture, etc. and maintain a product lifetime. However, such a method in the related art requires much manufacturing cost because the barrier layer needs to be coated multiple times and has a limitation in perfectly protecting the quantum dots (QD) from the outside above all.

BRIEF SUMMARY OF THE INVENTION

The present invention has been made in an effort to solve the problems and other problems. The present invention has also been made in an effort to provide a quantum dot plate assembly in which a QD phosphor is sealed in an empty portion of a light transmitting plate body and a manufacturing method thereof.

The present invention has also been made in an effort to provide a quantum dot plate assembly capable of effectively emitting heat generated from a QD phosphor sealed in an empty portion of a light transmitting plate body and a manufacturing method thereof.

The present invention has also been made in an effort to provide a quantum dot plate assembly which may maintain a vacuum state by removing air which is present in an empty space between a QD phosphor disposed in an empty portion of a light transmitting plate body and an upper light transmitting plate and a manufacturing method thereof.

The present invention has also been made in an effort to provide a quantum dot plate assembly which may contain nitrogen ($N_2$) gas in an empty space between a QD phosphor disposed in an empty portion of a light transmitting plate body and an upper light transmitting plate and a manufacturing method thereof.

The present invention has also been made in an effort to provide a quantum dot plate assembly capable of improving product reliability by adding an auxiliary welding line at the time of laser glass welding and a manufacturing method thereof.

The present invention has also been made in an effort to provide a quantum dot plate assembly capable of improving the product reliability by irradiating a laser beam in a diagonal line along predetermined welding lines at the time of the laser glass welding and a manufacturing method thereof.

The present invention has also been made in an effort to provide a light emitting device package including a light emitting device, a quantum dot plate assembly on the light emitting device, and a reflection member surrounding the light emitting device and the quantum dot plate assembly and a manufacturing method thereof.

The present invention has also been made in an effort to provide a light emitting device package including a first wavelength converting layer disposed between a light emitting device and a second wavelength converting layer to change a wavelength of light emitted from the light emitting device and a manufacturing method thereof.

The present invention has also been made in an effort to provide a light emitting device package including an adhesive layer disposed between a light emitting device and a quantum dot plate assembly to scatter light emitted from the light emitting device and a manufacturing method thereof.

The present invention has also been made in an effort to provide a light emitting device package including a light transmitting plate body having a predetermined pattern formed on a surface facing a light emitting device and scattering light emitted from the light emitting device through the predetermined pattern and a manufacturing method thereof.

The present invention has also been made in an effort to provide a light emitting device package capable of efficiently reflecting light emitted from a light emitting device through an inclined surface on which a quantum dot plate assembly and a reflector meet each other and a manufacturing method thereof.

The present invention has also been made in an effort to provide a light emitting device package having a space for stably accommodating and fixing a light emitting device and capable of outputting an increased amount of light by reflecting light emitted from the light emitting device toward an upper portion of a package body and a manufacturing method thereof.

The present invention has also been made in an effort to provide an LED module including a circuit board, one or more light emitting devices mounted on the circuit board, a quantum dot plate assembly disposed on each of the light emitting devices, and a reflection member surrounding the light emitting device and the quantum dot plate assembly and a manufacturing method thereof.

An exemplary embodiment of the present invention provides a light emitting device package including: a light emitting device; a light transmitting plate body formed above the light emitting device and including a lower light transmitting plate, a plurality of side light transmitting plates formed on an upper surface of the lower light transmitting plate, an upper light transmitting plate corresponding to the upper surface of the lower light transmitting plate and formed on upper surfaces of the plurality of side light transmitting plates, and an empty portion formed inside; a wavelength converting unit including a first wavelength converting layer formed on a lower surface of the lower light transmitting plate and a second wavelength converting layer formed in the empty portion and covering the upper surface of the lower light transmitting plate; and an adhesive layer formed between the first wavelength converting layer and the light emitting device, in which the adhesive layer is formed on at least one side and an upper surface of the light emitting device and a lower surface of the first wavelength converting layer.

Another exemplary embodiment of the present invention provides a light emitting device package including: a light emitting device; a light transmitting plate body formed above the light emitting device and including a lower light transmitting plate, a plurality of side light transmitting plates formed on an upper surface of the lower light transmitting plate, an upper light transmitting plate corresponding to the upper surface of the lower light transmitting plate and formed on upper surfaces of the plurality of side light transmitting plates, and an empty portion formed inside; an adhesive layer formed between the light emitting device and the light transmitting plate body; and a wavelength converting unit including a first wavelength converting layer formed integrally with the adhesive layer and a second wavelength converting layer formed in the empty portion and covering the upper surface of the lower light transmitting plate, in which the second wavelength converting layer is a QD phosphor including a particle having a smaller size than the particle of the first wavelength converting layer.

Yet another exemplary embodiment of the present invention provides a light emitting device package including: a light emitting device emitting light of a predetermined wavelength; a quantum dot (QD) plate assembly converting a wavelength of the light emitted from the light emitting device; an adhesive layer disposed between the light emitting device and the QD plate assembly to bond the light emitting device and the QD plate assembly; and a reflection member surrounding the light emitting device and the QD plate assembly, in which the QD plate assembly includes a QD material converting the wavelength of the light and a light transmitting plate body for sealing the QD material.

BRIEF DESCRIPTION OF THE DRAWINGS

FIG. 7 is a flowchart for describing a laser welding process according to an exemplary embodiment of the present invention.

FIG. 9 is a flowchart for describing a laser welding process according to another exemplary embodiment of the present invention.

FIGS. 20A to 20D are diagrams for describing a manufacturing method of a light emitting device package according to an exemplary embodiment of the present invention.

DETAILED DESCRIPTION OF THE INVENTION

Figure 1A:
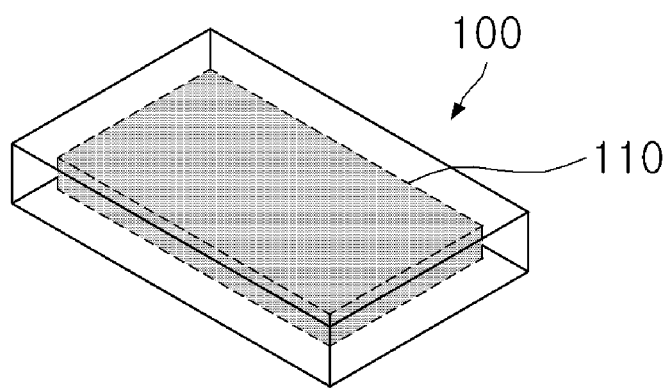
FIG. 1A is a perspective view of a QD plate assembly according to an exemplary embodiment of the present invention.

Hereinafter, exemplary embodiments disclosed in this specification will be described in detail with reference to the accompanying drawings and the same or similar components are denoted by the same reference numerals regardless of a sign of the drawing, and duplicated description thereof will be omitted. Hereinafter, in describing the exemplary embodiments according to the present invention, a case where it is disclosed that each layer (film), area, pattern, or structure is formed "on" or "under" a substrate, each layer, area, pad, or pattern, "on" and "under" includes both "directly" and "interposed with another layer (indirectly)". In addition, a criterion for on or under each layer will be described with reference to the drawings. The thickness and size of each layer in the drawings are exaggerated, omitted, or schematically illustrated for convenience and clarity of description. Further, the size of each component does not entirely reflect the actual size.

In describing the exemplary embodiment of this specification, a detailed description of related known technologies will be omitted if it is determined that the detailed description makes the gist of the exemplary embodiment disclosed in this specification unclear. Further, it is to be understood that the accompanying drawings are just used for easily understanding the exemplary embodiments disclosed in this specification and a technical spirit disclosed in this specification is not limited by the accompanying drawings and all changes, equivalents, or substitutes included in the spirit and the technical scope of the present invention are included.

The present invention proposes a quantum dot plate assembly in which a QD phosphor is sealed at an empty portion of a light transmitting plate body and a manufacturing method thereof. Further, the present invention proposes a quantum dot plate assembly capable of effectively emitting heat generated from the QD phosphor sealed in the empty portion of the light transmitting plate body and a manufacturing method thereof. In addition, the present invention proposes a quantum dot plate assembly which may maintain a vacuum state by removing air which is present in an empty space between the QD phosphor disposed in the empty portion of the light transmitting plate body and an upper light transmitting plate and a manufacturing method thereof. Further, the present invention proposes a quantum dot plate assembly which may contain nitrogen (N2) gas in the empty space between the QD phosphor disposed in the empty portion of the light transmitting plate body and the upper light transmitting plate and a manufacturing method thereof. In addition, the present invention proposes a quantum dot plate assembly capable of improving product reliability by adding an auxiliary welding line at the time of laser glass welding and a manufacturing method thereof. Further, the present invention proposes a quantum dot plate assembly capable of improving the product reliability by irradiating a laser beam in a diagonal line along predetermined welding lines at the time of welding the laser glass and a manufacturing method thereof. In addition, the present invention proposes a light emitting device package including a light emitting device, a quantum dot plate assembly on the light emitting device, and a reflection member surrounding the light emitting device and the quantum dot plate assembly and a manufacturing method thereof. Further, the present invention proposes a light emitting device package including a first wavelength converting layer disposed between a light emitting device and a second wavelength converting layer to change a wavelength of light emitted from the light emitting device and a manufacturing method thereof. In addition, the present invention proposes a light emitting device package including an adhesive layer disposed between a light emitting device and a quantum dot plate assembly to scatter light emitted from the light emitting device and a manufacturing method thereof. Further, the present invention proposes a light emitting device package including a light transmitting plate body having a predetermined pattern formed on a surface facing a light emitting device and scattering light emitted from the light emitting device through the predetermined pattern and a manufacturing method thereof. In addition, the present invention proposes a light emitting device package capable of efficiently reflecting light emitted from a light emitting device through an inclined surface on which a quantum dot plate assembly and a reflector meet each other and a manufacturing method thereof. Further, the present invention proposes a light emitting device package having a space for stably accommodating and fixing a light emitting device and capable of outputting an increased amount of light by reflecting light emitted from the light emitting device toward an upper portion of a package body and a manufacturing method thereof. Further, the present invention proposes an LED module including a circuit board, one or more light emitting devices mounted on the circuit board, a quantum dot plate assembly disposed on each of the light emitting devices, and a reflection member surrounding the light emitting device and the quantum dot plate assembly and a manufacturing method thereof.

Hereinafter, various exemplary embodiments of the present invention will be described in detail with reference to drawings.

Figure 1B:
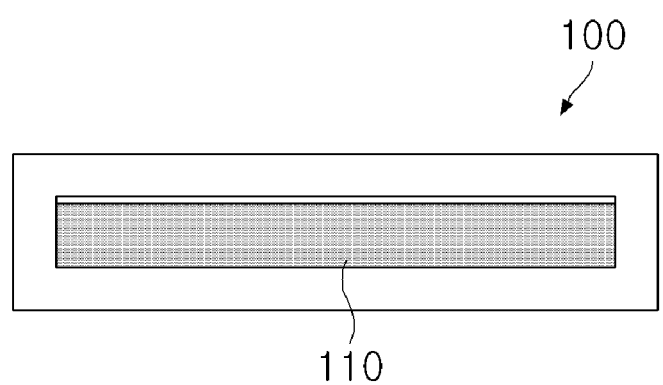
FIG. 1B is a cross-sectional view of a QD plate assembly according to an exemplary embodiment of the present invention.
Figure 1C:
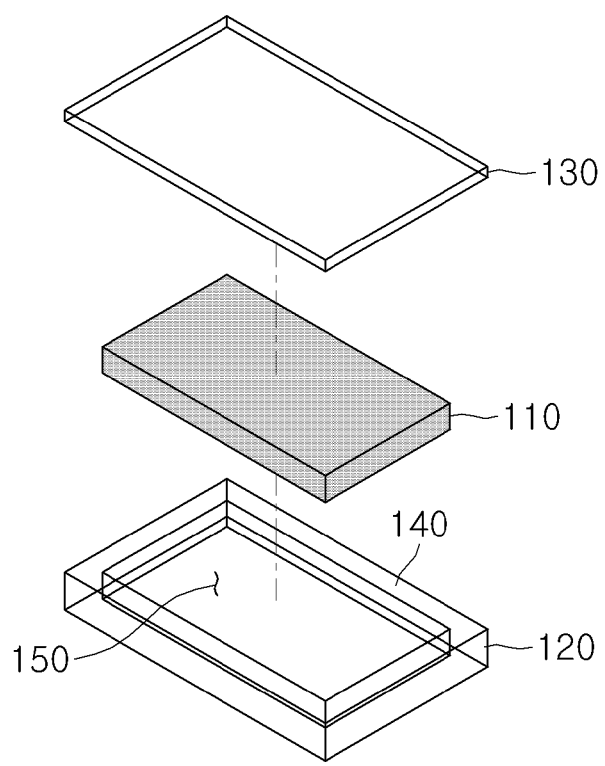
FIG. 1C is an exploded perspective view of a QD plate assembly according to an exemplary embodiment of the present invention.

FIG. 1A is a perspective view of a QD plate assembly according to an exemplary embodiment of the present invention, FIG. 1B is a cross-sectional view of a QD plate assembly according to an exemplary embodiment of the present invention, and FIG. 1C is an exploded perspective view of a QD plate assembly according to an exemplary embodiment of the present invention.

Referring to FIGS. 1A to 1C, a quantum dot plate assembly (or QD plate assembly) 100 according to an exemplary embodiment of the present invention may include a QD material 110 for converting a wavelength of light and a light transmitting plate body accommodating the QD material 110.

The QD material 110 as a color light conversion material including quantum dots may be formed by mixing or dispersing the quantum dots in a matrix material such as acrylate or epoxy polymer or a combination thereof. Hereinafter, in this specification, the QD material 110 may be referred to as a QD phosphor.

Figure 2:
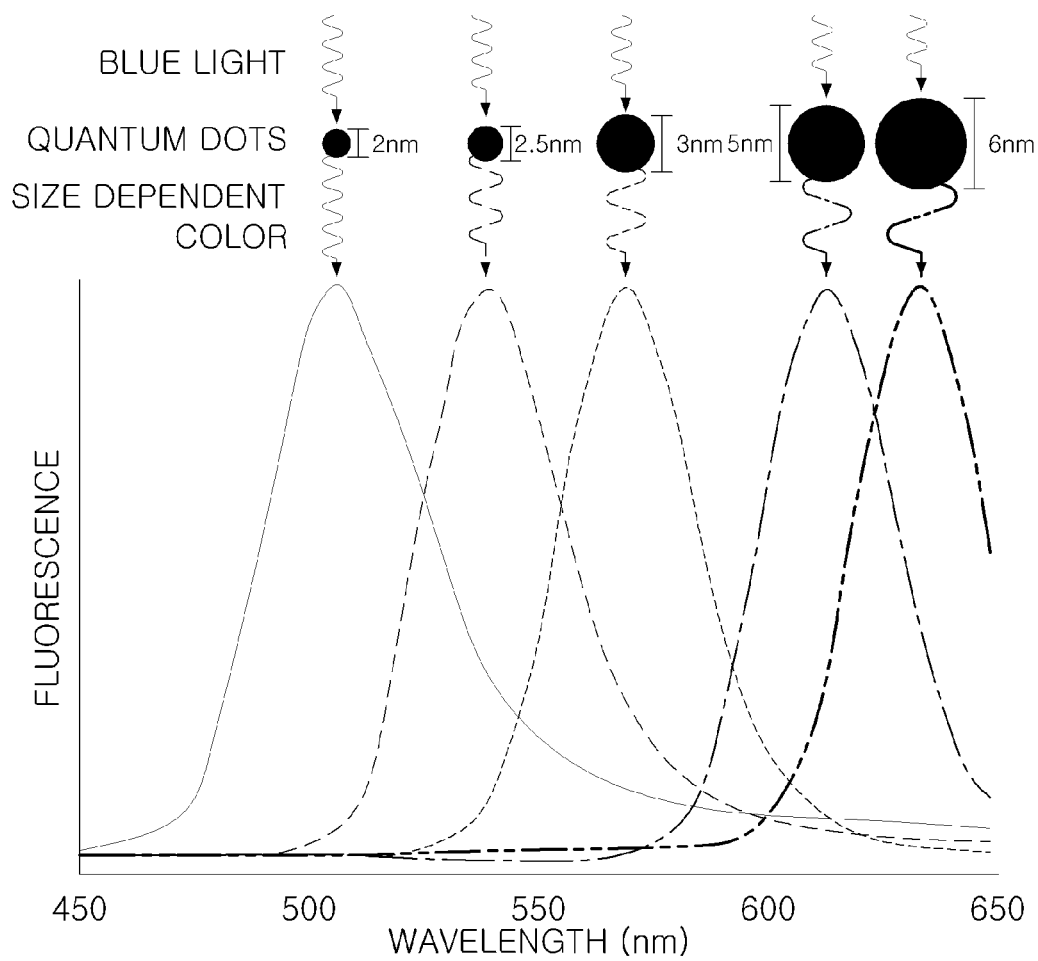
FIG. 2 is a diagram referred to for describing a relationship between a size of a quantum dot and an emission color.

The quantum dot as a semiconductor nanoparticle with a diameter of several nanometers has quantum mechanics characteristics such as a quantum confinement effect. Here, the quantum confinement effect means a phenomenon in which band gap energy becomes larger (conversely, a wavelength becomes smaller) as a size of the semiconductor nanoparticle becomes smaller. The quantum dot which is made by a chemical synthesis process may implement a desired color only by adjusting the particle size without changing the material. For example, as illustrated in FIG. 2, blue light having a shorter wavelength may be emitted as the nanoparticle size is smaller according to the quantum confinement effect and red light having a longer wavelength may be emitted as the size of the nanoparticle becomes larger. In the exemplary embodiment, the nanoparticles may have a size of approximately 100 nm or less, approximately 50 nm or less, approximately 20 nm or less, approximately 15 nm or less or may be within a size range of approximately 2 to 10 nm.

The quantum dot may be a Group II-VI, Group III-V, or Group IV material and specifically, may be CdSe, CdTe, CdS, ZnSe, ZnTe, ZnS, InP, GaP, $GaInP_2$, PbS, ZnO, $TiO_2$, AgI, AgBr, $Hg_{12}$, PbSe, $In_2S_3$, $In_2Se_3$, $Cd_3P_2$, $Cd_3As_2$, or GaAs. Further, the quantum dot may have a corer-shell structure. Here, the core may include any one material selected from the group consisting of CdSe, CdTe, CdS, ZnSe, ZnTe, ZnS, HgTe, and HgS and the shell may include any one material selected from the group consisting of CdSe, CdTe, CdS, ZnSe, ZnTe, ZnS, HgTe, and HgS.

The light transmitting plate body may include a lower light transmitting plate 120, a plurality of side light transmitting plates 140 formed on the upper surface of the lower light transmitting plate 120, and an upper light transmitting plate 130 corresponding to the upper surface of the lower light transmitting plate 120 and formed on the upper surfaces of the plurality of side light transmitting plates 140.

An empty portion (or a trench region 150) for accommodating the QD material 110 may be formed inside the light transmitting plate body.

The lower light transmitting plate 120 may be made of a transparent material having good transparency. Further, the lower light transmitting plate 120 may be made of a material having good weldability or bonding property. As a preferred exemplary embodiment, the lower light transmitting plate 120 may be made of a glass material.

The empty portion 150 and the plurality of side light transmitting plates 140 may be formed on the upper surface (or upper portion) of the lower light transmitting plate 120. A method for forming the empty portion 150 and the plurality of side light transmitting plates 140 on the upper surface of the lower light transmitting plate 120 generally includes three processes, i.e., a mechanical processing process, a chemical processing process, and an assembly process.

Figure 3:
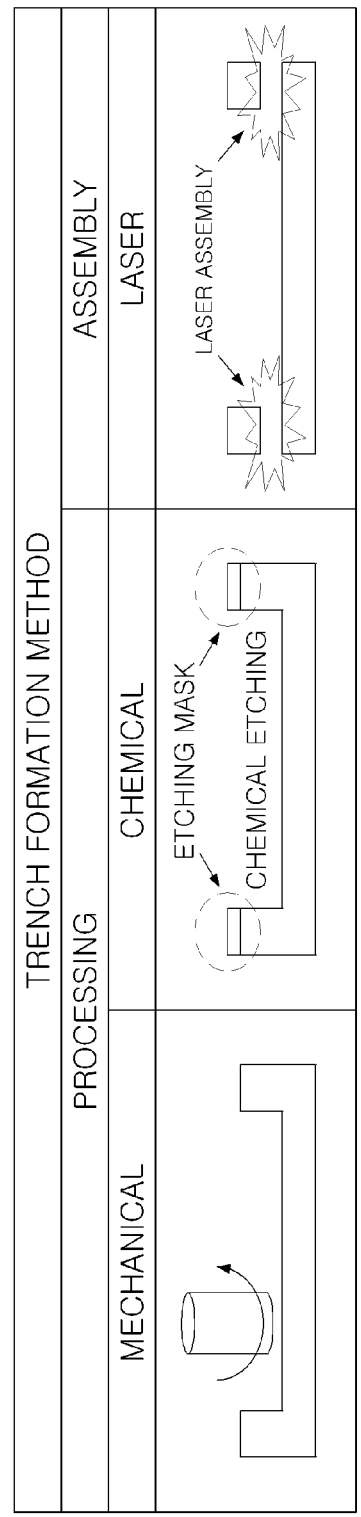
FIG. 3 is a diagram referred to for illustrating methods of forming a trench in a lower light transmitting plate.

For example, as illustrated in FIG. 3, the mechanical processing process is a process of grinding the upper surface of the lower light transmitting plate 120 with a grinder to form a trench. The chemical processing process is a process of etching the upper surface of the lower light transmitting plate 120 with an etching solution and a mask to form the trench. The assembly process is a process of welding a plurality of glass members with a laser to form the trench.

An overall shape of the lower light transmitting plate 120 may be formed by a thin plate shape and is not particularly limited thereto. The upper and lower surfaces of the lower light transmitting plate 120 may be formed in a predetermined shape (e.g., rectangular, square, circular, oval, etc.). Further, the lower light transmitting plate 120 may be formed to have a uniform thickness.

The overall shape of the empty portion 150 may be formed by the same or similar shape as an outer shape of the lower light transmitting plate 120, but is not particularly limited thereto. The upper and lower surfaces of the empty portion 150 may be formed by a predetermined shape (e.g., rectangular, square, circular, oval, etc.). Further, an area of the upper surface of the empty portion 150 may be the same as the area of the lower surface or the area of the upper surface may be larger than the area of the lower surface.

The empty portion 150 may be formed to have the uniform thickness. Further, the empty portion 150 may be formed to have a thickness corresponding to the thickness of the side light transmitting plate 140.

The plurality of side light transmitting plates 140 may be formed to surround the empty portion 150 along a top edge region of the upper surface of the lower light transmitting plate 120. As an example, the plurality of side light transmitting plates 140 may have a rectangular annular shape.

The upper light transmitting plate 130 may be made of the same material as the lower light transmitting plate 120, that is, a transparent material having good transparency and weldability. As a preferred exemplary embodiment, the upper light transmitting plate 130 may be made of the glass material.

The upper light transmitting plate 130 is disposed on upper portions of the side light transmitting plates 140 to cover the QD material 110 which is present in the empty portion 150. A region where the upper light transmitting plate 130 and the plurality of side light transmitting plates 140 meet is welded with a femto laser beam to form the QD plate assembly 100. Through such laser glass welding, the QD material 110 may be sealed in an empty space (i.e., empty portion 150) between the lower light transmitting plate 120, the upper light transmitting plate 130, and the side light transmitting plate 140.

The upper light transmitting plate 130 may include a contact portion which meets the upper portions of the plurality of side light transmitting plates 140 and a flat portion corresponding to the empty portion 150.

The overall shape of the upper light transmitting plate 130 may be formed by the thin plate shape and is not particularly limited thereto. The upper and lower surfaces of the upper light transmitting plate 130 may be formed in the predetermined shape (e.g., rectangular, square, circular, oval, etc.). The upper light transmitting plate 130 may be formed to have the uniform thickness.

The upper light transmitting plate 130 may be formed to correspond to the upper surface of the lower light transmitting plate 120. For example, the upper light transmitting plate 130 may be formed to have the same shape and size as the lower light transmitting plate 120.

The upper light transmitting plate 130 and the plurality of side light transmitting plates 140 are formed to have high flatness, so that bonding rate due to laser welding may be improved. As an example, the contact portion of the upper light transmitting plate 130 and the upper portions of the plurality of side light transmitting plates 140 may have flatness of 1 micrometer (μm) or less.

The empty space between the QD material 110 disposed in the empty portion 150 of the light transmitting plate body and the upper light transmitting plate 130 may be maintained in a vacuum state or filled with nitrogen gas ($N_2$).

The QD plate assembly 100 including the QD material 110, the lower light transmitting plate 120, the upper light transmitting plate 130, and the plurality of side light transmitting plates 140 is disposed on a light emitting device (i.e., LED chip (not illustrated)) to effectively convert the wavelength of the light emitted from the light emitting device. In addition, the QD plate assembly 100 may safely protect the QD material, which is vulnerable to external environmental conditions by sealing the QD material 110 in the empty portion 150 of the light transmitting plate body using a laser beam.

FIGS. 4A to 4E are diagrams for describing a manufacturing method of a QD plate assembly according to an exemplary embodiment of the present invention.

Figure 4A:
FIGS. 4A to 4E are diagrams for describing a manufacturing method of a QD plate assembly according to an exemplary embodiment of the present invention.
Figure 4B:
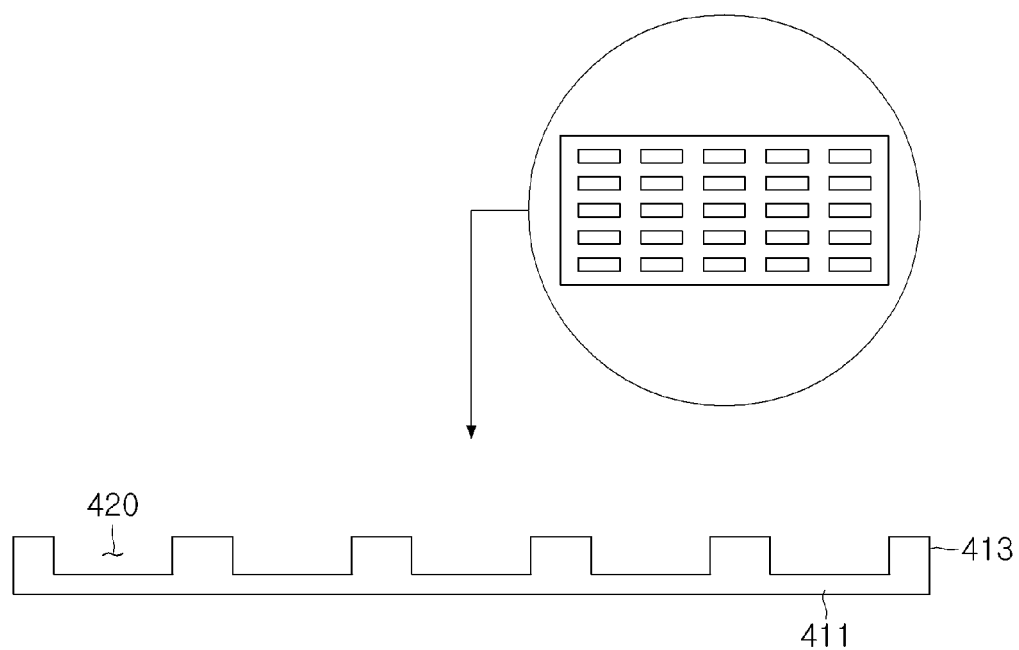

Referring to FIGS. 4A and 4B, a lower light transmitting plate (or first glass plate) 410 having a predetermined size and thickness may be created or prepared. The lower light transmitting plate 410 may have a plate shape having a predetermined shape (e.g., a rectangular shape or a square shape).

A plurality of empty portions 420 and a plurality of side light transmitting plates 413 positioned on outer peripheries of the plurality of empty portions 420 (or a plurality of side light transmitting plates 413 surrounding the plurality of empty portions) may be formed on the upper surface of the lower light transmitting plate 410. As an exemplary embodiment, the upper surface of the lower light transmitting plate 410 may be ground with a grinder to form the plurality of empty portions 420 and the plurality of side light transmitting plates 413. Meanwhile, as another exemplary embodiment, the upper surface of the lower light transmitting plate 410 may be etched by the etching solution and the mask to form the plurality of empty portions 420 and the plurality of side light transmitting plates 413.

The lower light transmitting plate 410 of which a trench process is completed may be constituted by a flat portion 411 corresponding to the plurality of empty portions 420 and the plurality of side light transmitting plates 413 extending in a vertical direction from the flat portion 411.

The plurality of empty portions 420 may be formed to be arranged on the upper surface of the lower light transmitting plate 410 in a matrix form. The plurality of empty portions 420 may be formed to be disposed at a predetermined interval. Meanwhile, as another exemplary embodiment, the plurality of empty portions 420 may be formed to be arranged on the upper surface of the lower light transmitting plate 410 in line.

Respective empty portions 420 may be formed to have the same shape and size. As an exemplary embodiment, the respective empty portions 420 may be formed in a thin rectangular parallelepiped shape. Further, the respective empty portions 420 may be formed to have the uniform thickness.

Figure 4C:
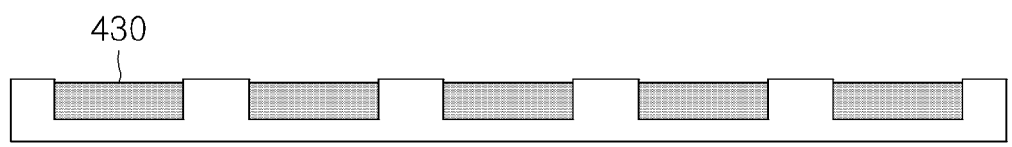

Referring to FIG. 4C, after the lower light transmitting plate 410 of which the trench process is completed is moved into the chamber, air inside a chamber may be discharged to the outside to vacuum the inside of the chamber.

In such a vacuum condition, a QD phosphor 430 may be injected into the plurality of empty portions 420 formed on the upper surface of the lower light transmitting plate 410 by using a phosphor injection device (not illustrated).

Since the QD phosphor 430 is generally in a sol state, the QD phosphor 430 is filled in an upper direction from the lower portion of each empty portion 420. The QD phosphor 430 may be injected up to a height equal to or slightly lower than the upper surfaces of the plurality of side light transmitting plates 413 through the phosphor injection device.

When the injection of all of the QD phosphor 430 is completed, the temperature inside the chamber may be raised up to a predetermined temperature to solidly cure the QD phosphor 430 injected into the plurality of empty portions 420. As a result, the QD phosphor 430 corresponds to a shape of the empty portion 420.

Thereafter, in order to perform the laser glass welding, the upper surfaces of the side light transmitting plates 413 adjacent to the QD phosphor 430 may be cleaned by using a cleaning device. Further, an upper light transmitting plate (or second glass plate 440) to be welded with the side light transmitting plates 413 may be cleaned by using the cleaning device.

Figure 4D:
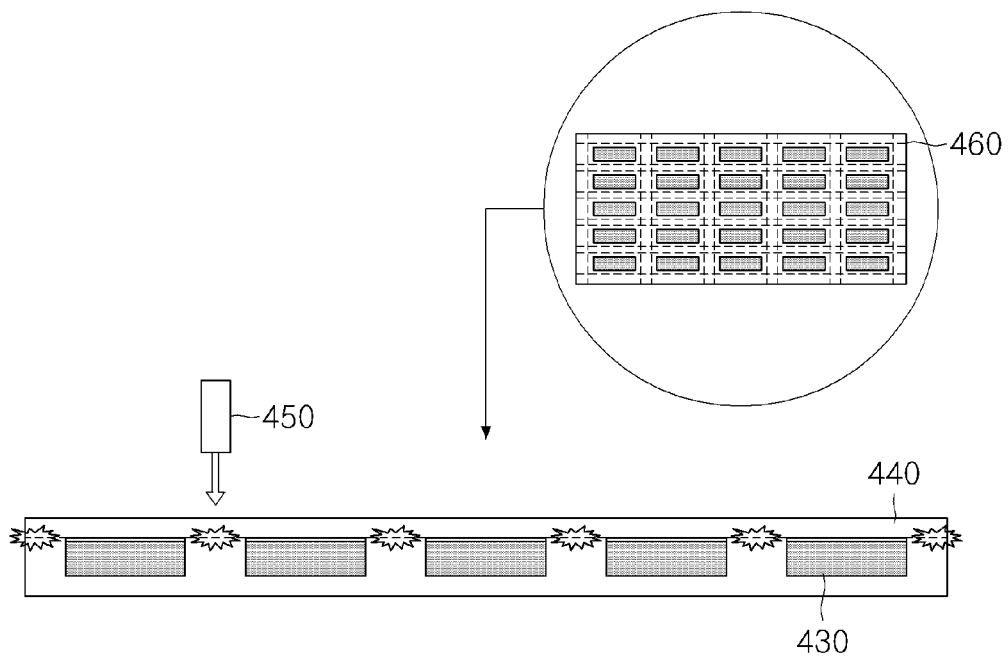

Referring to FIG. 4D, the upper light transmitting plate 440 having a predetermined shape and size may be created or prepared. Similarly, the upper light transmitting plate 440 may have a plate shape having a predetermined shape (e.g., a rectangular shape or a square shape).

The upper light transmitting plate 440 is disposed on the upper portions of the side light transmitting plates 413 to cover the QD phosphor 430 which is present in the plurality of empty portions 420. The lower and upper light transmitting plates 410 and 440 stacked as above will be referred to as a light transmitting plate assembly.

The upper light transmitting plate 440 and the plurality of side light transmitting plates 413 are formed to have high flatness, so that a bonding rate due to laser welding may be improved. As an example, the flatness of the plurality of side light transmitting plates 413 and the upper light transmitting plate 440 may have flatness of 1 micrometer (μm) or less.

While the lower and upper light transmitting plates 410 and 440 are stacked, a femto laser beam having a predetermined wavelength may be irradiated onto the upper surface of the upper light transmitting plate 440 in a vertical direction using the laser apparatus 450. In this case, the predetermined wavelength may include a wavelength of 1000 to 500 nm and more preferably may include a wavelength of 1030 to 1060 nm.

The laser apparatus 450 may irradiate the femto laser beam along a region (that is, a dotted line region illustrated in the drawing) 460 where the upper surfaces of the plurality of side light transmitting plates 413 and the lower surface of the upper light transmitting plate 440 meet each other. A glass region to which the femto laser beam is irradiated is melted at a high temperature (e.g., 2000 to 3400° C.) to bond the side light transmitting plates 413 and the upper light transmitting plate 440. The laser glass welding according to the present invention maintains a water vapor transmission rate (i.e., a degree at which moisture may permeate per unit area) less than $10^{-3}$ g/m²/day to prevent moisture from penetrating between the side light transmitting plates 413 and the upper light transmitting plate 440.

The laser glass welding allows the QD phosphor 430 to be completely sealed in the plurality of empty portions 420 which is present between the lower light transmitting plate 410 and the upper light transmitting plate 440.

Figure 4E:
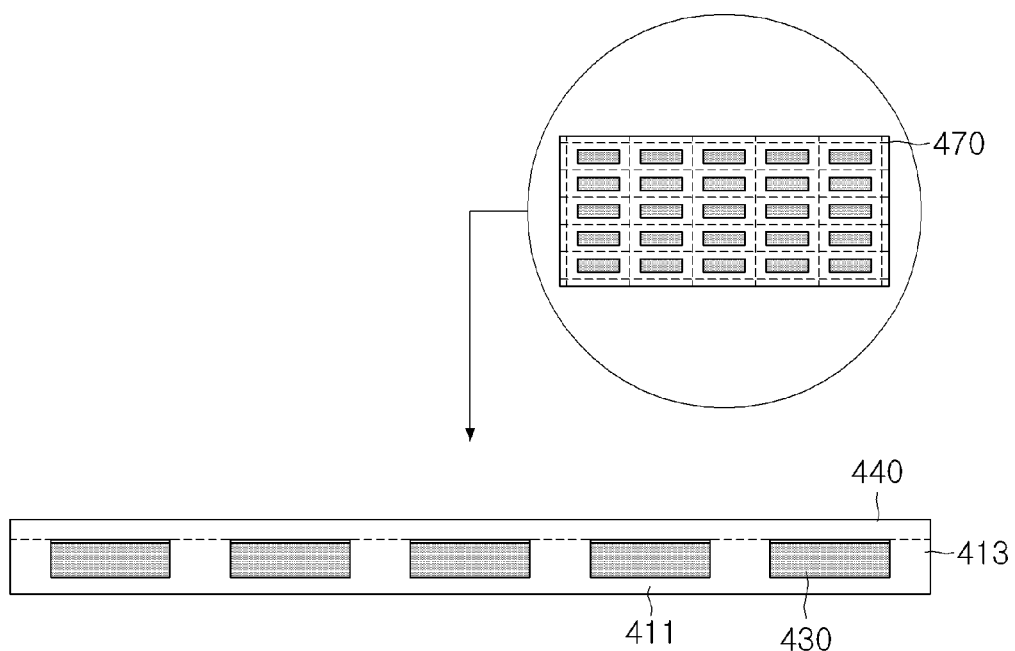

Referring to FIG. 4E, when welding the laser glass is completed, the plurality of side light transmitting plates 413 may be cut in the vertical direction to the upper surface of the upper light transmitting plate 440 along a midpoint ((i.e., a dotted line region illustrated in the drawing) 470 between respective empty portions 420 using a cutting device (not illustrated). That is, the plurality of side light transmitting plates 413 may be cut in the vertical direction by using the cutting device. A plurality of QD plate assemblies 100 may be fabricated through a cutting process depending on such a unit plate region. The cutting process may include, for example, a braking process of separating the plurality of side light transmitting plates by applying physical force by using a blade, a laser scribing process of separating the plurality of side light transmitting plates by irradiating a laser among respective empty portions, an etching process of separating the plurality of side light transmitting plates by using wet etching or dry etching, and the like and is not particularly limited thereto.

Hereinabove, in the QD plate assembly 100 created through the aforementioned processes, the QD phosphor is sealed to the empty portion of the light transmitting plate body which is integrally formed to safely protect the QD phosphor which is vulnerable to an external environmental condition. Further, in the related art, a large area is used in the form of a QD sheet, but the QD plate assembly according to the present invention may be applied to a local region by applying packaging. Thus, a low cost QD plate assembly in the form of a package may be implemented instead of a high cost QD sheet.

Figure 5A:
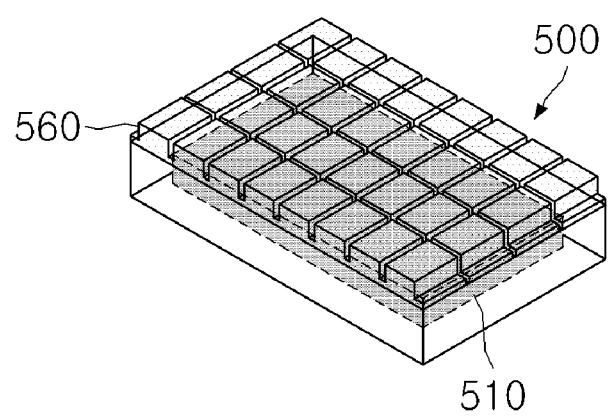
FIG. 5A is a perspective view of a QD plate assembly according to another exemplary embodiment of the present invention.
Figure 5B:
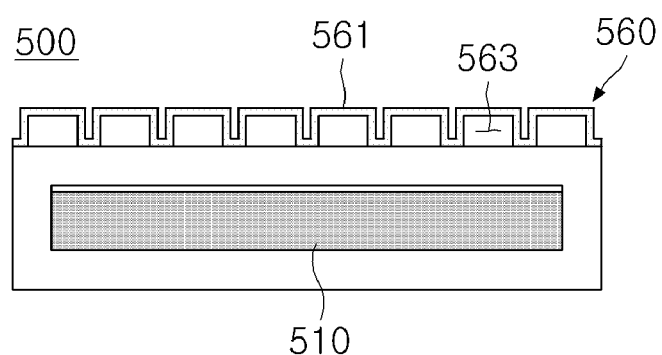
FIG. 5B is a cross-sectional view of a QD plate assembly according to another exemplary embodiment of the present invention.
Figure 5C:
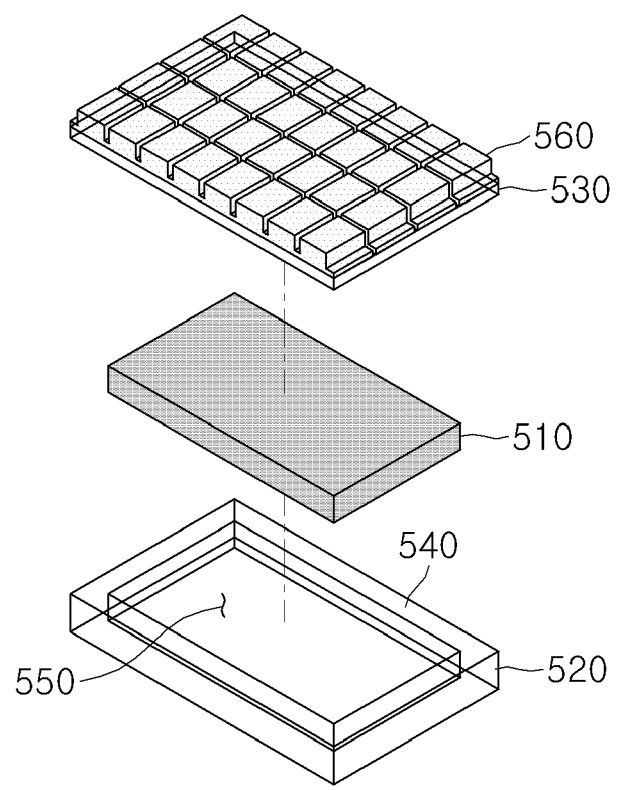
FIG. 5C is an exploded perspective view of a QD plate assembly according to another exemplary embodiment of the present invention.

FIG. 5A is a perspective view of a QD plate assembly according to another exemplary embodiment of the present invention, FIG. 5B is a cross-sectional view of a QD plate assembly according to another exemplary embodiment of the present invention, and FIG. 5C is an exploded perspective view of a QD plate assembly according to another exemplary embodiment of the present invention.

Referring to FIGS. 5A to 5C, a quantum dot plate assembly (or QD plate assembly) 500 according to another exemplary embodiment of the present invention may include a QD material 510 for converting a wavelength of light and a light transmitting plate body accommodating the QD material 510.

The light transmitting plate body may include a lower light transmitting plate 520, an empty portion 550 and a plurality of side light transmitting plates 540 formed at an upper portion of the lower light transmitting plate 520, an upper light transmitting plate 530 corresponding to an upper surface of the lower light transmitting plate 520 and formed on the upper surfaces of the plurality of side light transmitting plates 540, and a heat dissipation member 560 formed on the upper surface of the upper light transmitting plate 530.

The QD material 510, the lower light transmitting plate 520, the upper light transmitting plate 530, the plurality of side light transmitting plates 540, and the empty portion 550 of the QD plate assembly 500 according to the exemplary embodiment are the same as or similar to the QD material 110, the lower light transmitting plate 120, the upper light transmitting plate 130, the plurality of side light transmitting plates 140, and the empty portion 150 of the QD plate assembly 100 illustrated in FIGS. 1A to 1C, so that a detailed description thereof will be omitted. Therefore, hereinafter, the heat dissipation member 560 formed on the upper surface of the upper light transmitting plate 530 will be described in detail.

The heat dissipation member 560 is disposed on the upper surface of the upper light transmitting plate 530 to improve dissipation of heat generated from the QD plate assembly 500 and enhance reliability of the corresponding QD plate assembly 500.

The heat dissipation member 560 may include a heat dissipation pattern layer 561 having a predetermined repetition pattern structure and a plurality of cavity areas 563 corresponding to empty portions between the lower surface of the heat dissipation pattern layer 561 and the upper surface of the upper light transmitting plate 530.

The heat dissipation pattern layer (or a thin film layer) 561 may be made of metal oxide having excellent light transmittance and thermal conductivity. As an example, the heat dissipation pattern layer 561 may be made of aluminum oxide ($Al_2O_3$) and is not particularly limited thereto.

The heat dissipation pattern layer 561 has a structure in which a pattern having a predetermined shape is periodically repeated, so a heat dissipation area generated inside the QD plate assembly 500 may be maximally increased. In the exemplary embodiment, the shape of the predetermined pattern may be a hexahedral shape. Meanwhile, although not illustrated in the drawing, as another example, the shape of the predetermined pattern may be various shapes such as a pyramid shape, a conical shape, a hemispherical shape, and a polyhedral shape.

The heat dissipation patter layer 561 may be formed to have a predetermined thickness on the upper surface of the upper light transmitting plate 530. Further, the heat dissipation pattern layer 561 may be formed so that a height between the lower surface and the upper surface is constant (that is, so as to have the same height).

Respective cavity regions 563 may be formed to have a shape in which in which the cavity regions 563 are symmetrical to each other. That is, the respective cavity regions 563 may be formed to have the same shape and size. Further, air may be present in each cavity region 563 or may exist in a vacuum state.

As described above, in the QD plate assembly 500 according to the present invention, the heat dissipation member 560 is disposed, which includes a metal oxide layer having a predetermined repetition pattern on the upper surface of the upper light transmitting plate 530 and a plurality of cavity regions formed below the metal oxide layer to improve dissipation of heat generated from the QD plate assembly 500, thereby enhancing reliability of the corresponding QD plate assembly 500.

FIGS. 6A to 6H are diagrams for describing a manufacturing method of a QD plate assembly according to another exemplary embodiment of the present invention.

Figure 6A:
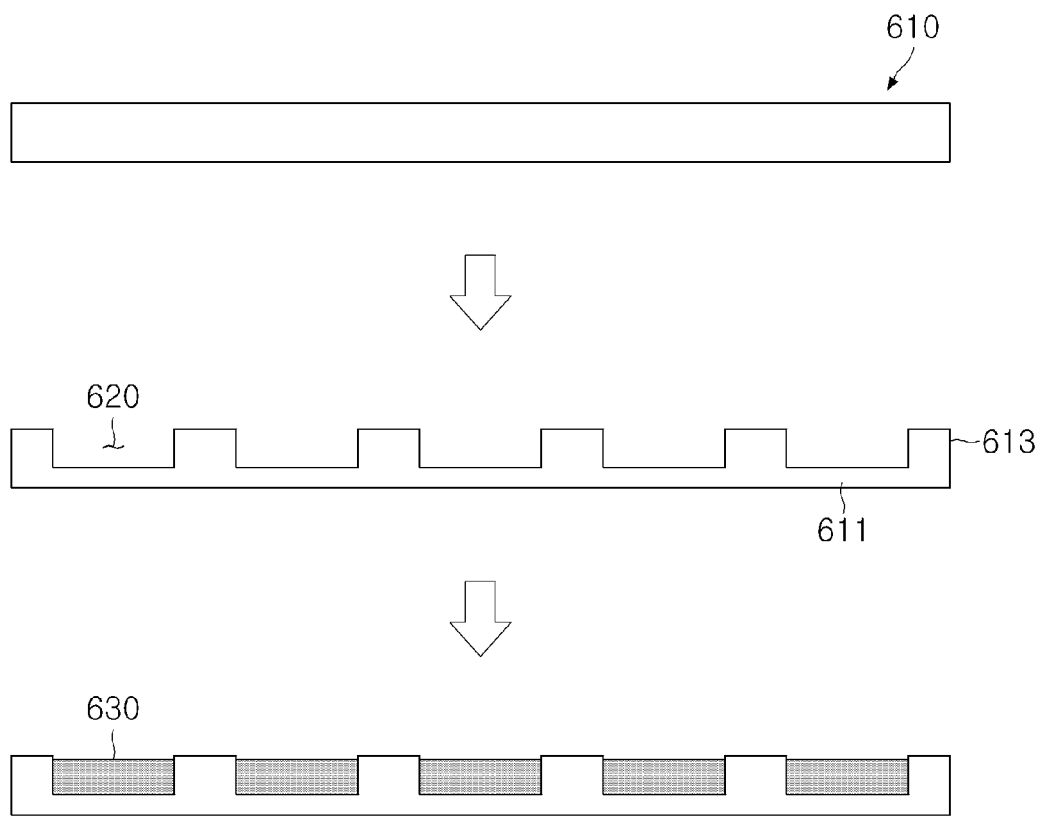
FIGS. 6A to 6H are diagrams for describing a manufacturing method of a QD plate assembly according to another exemplary embodiment of the present invention.

Referring to FIG. 6A, a lower light transmitting plate (or a first glass plate) 610 having a predetermined size and thickness may be created or prepared. A predetermined trench process is applied to the upper portion of the lower light transmitting plate 610 to form a plurality of empty portions 620 and a plurality of side light transmitting plates 613 surrounding the plurality of empty portions 620. The lower light transmitting plate 610 of which the trench process is completed may be constituted by a flat portion 611 corresponding to the plurality of empty portions 620 and a plurality of side light transmitting plates 613 extending in a vertical direction from the flat portion 611.

Thereafter, the lower light transmitting plate 610 is moved to the inside of the chamber and then, the air in the chamber is discharged to the outside to vacuum the inside of the chamber. In such a vacuum condition, a QD phosphor 630 may be injected into the plurality of empty portions 620 formed on the upper surface of the lower light transmitting plate 610 by using a phosphor injection device (not illustrated).

Figure 6B:
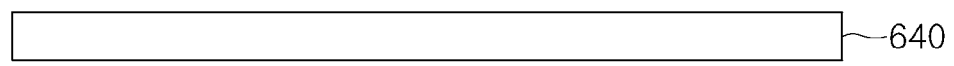
Figure 6C:
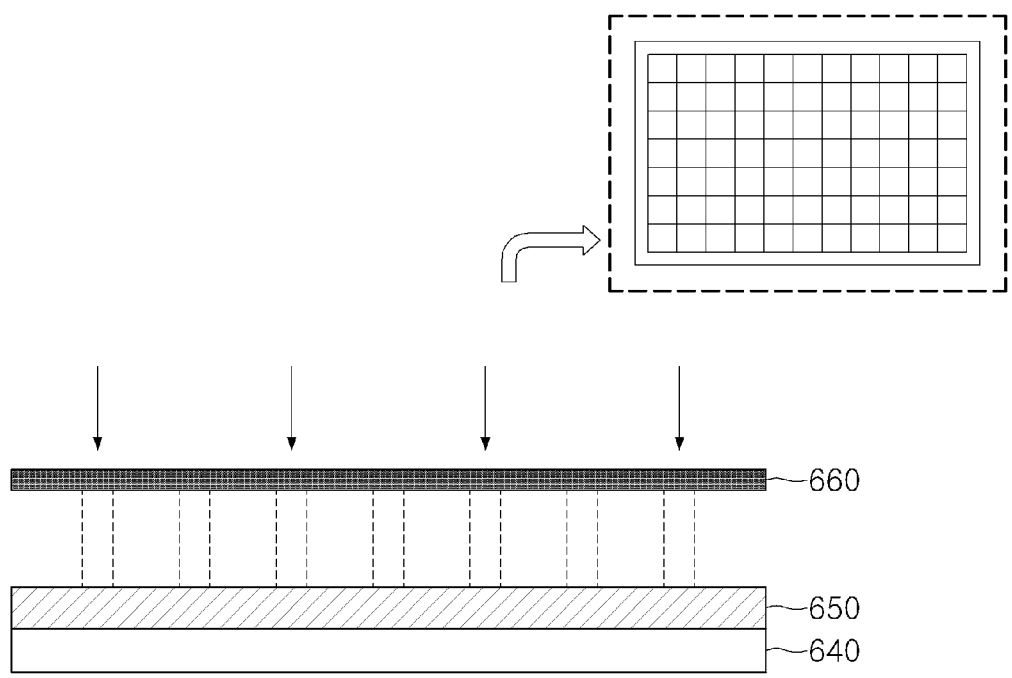

Referring to FIGS. 6B and 6C, the upper light transmitting plate 640 having a predetermined shape and size may be created or prepared. In this case, the upper light transmitting plate 640 may be formed in a plate shape corresponding to the shape of the lower light transmitting plate 610.

Thereafter, a photo resistor 650 may be coated on the upper surface of the upper light transmitting plate 640 using a spin coating method, a bar coating method, a deep coating method, etc. Meanwhile, as another exemplary embodiment, adhesive force between the upper light transmitting plate 640 and the photo resistor 650 may be enhanced by chemically treating (for example, HexaMethylDiSilazane (HMDS) treatment) the surface of the upper light transmitting plate 640 before a coating process. Further, before the coating process, a passivation layer (not illustrated) for protecting the upper light transmitting plate 640 may be formed between the upper light transmitting plate 640 and the photo resistor (PR) 650.

An exposure process for precisely aligning a mask 660 having a predetermined pattern on the photo resistor 650 formed on the upper surface of the upper light transmitting plate 640 and then, irradiating ultraviolet rays or the like may be performed.

Figure 6D:
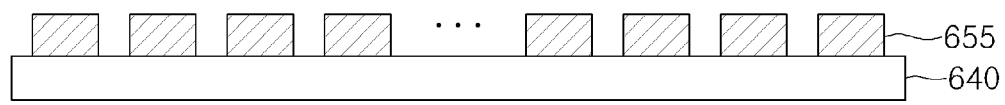
Figure 6E:
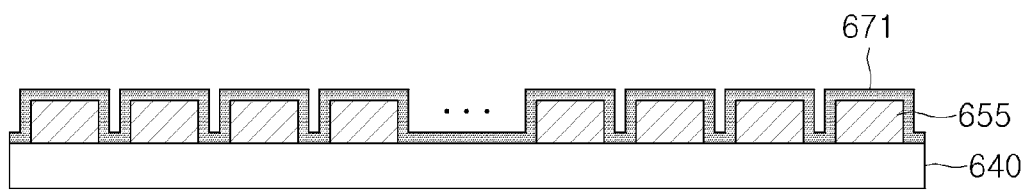

Referring to FIGS. 6D and 6E, a plurality of structures 655 may be formed on the upper light transmitting plate 640 by performing a developing process on the photo resistor 650 that is subjected to the exposure process. In this case, the plurality of structures 655 may be formed by the photo resistor 650.

The plurality of structures 650 may be arranged on the upper light transmitting plate in a matrix form. In addition, the plurality of structures 650 may be formed in a cube shape or a rectangular parallelepiped shape, but is not limited particularly thereto.

Thereafter, a metal material, more preferably an aluminum (Al) material, may be deposited on the upper light transmitting plate 640 and the plurality of structures 655. In this case, by using an atomic layer deposition method using an atomic layer deposition (ALD) apparatus or a chemical vapor deposition method using a chemical vapor deposition (CVD) apparatus, the aluminum material may be deposited on the upper light transmitting plate 640 and the plurality of structures 655. As a result, an aluminum layer 671 surrounding the upper light transmitting plate 640 and the plurality of structures 655 is formed.

Figure 6F:
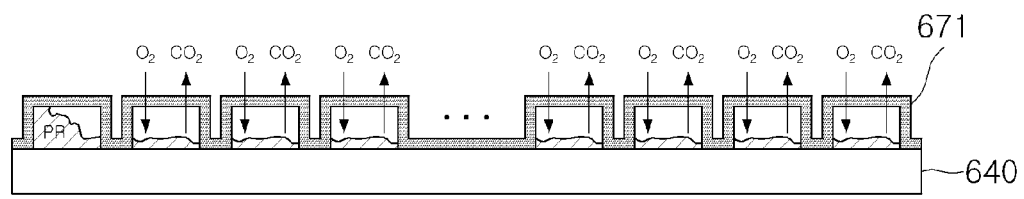
Figure 6G:
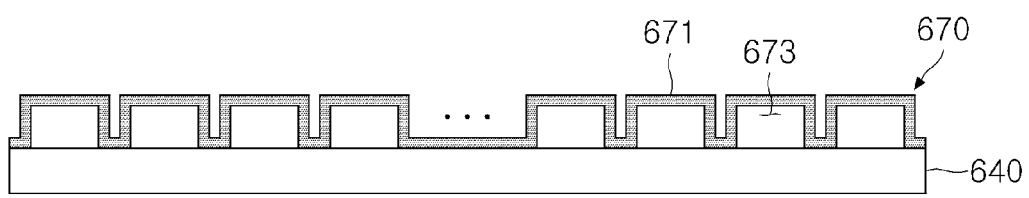

Referring to FIGS. 6F and 6G, a high temperature oxidation process may be performed with respect to the aluminum layer 671 formed on the upper light transmitting plate 640 and the plurality of structures 655. Thus, the plurality of photo resistors 655 which is present in the aluminum layer 671 gradually disappears through a chemical reaction and the aluminum layer 671 reacts with oxygen ($O_2$) to be converted into an aluminum oxide ($Al_2O_3$) layer.

Through such a high temperature oxidation process, a heat dissipation member 670 including the aluminum oxide layer 671 having a predetermined pattern and the plurality of cavity regions 673 formed below the aluminum oxide layer 671 may be formed on the upper light transmitting plate 640.

Figure 6H:
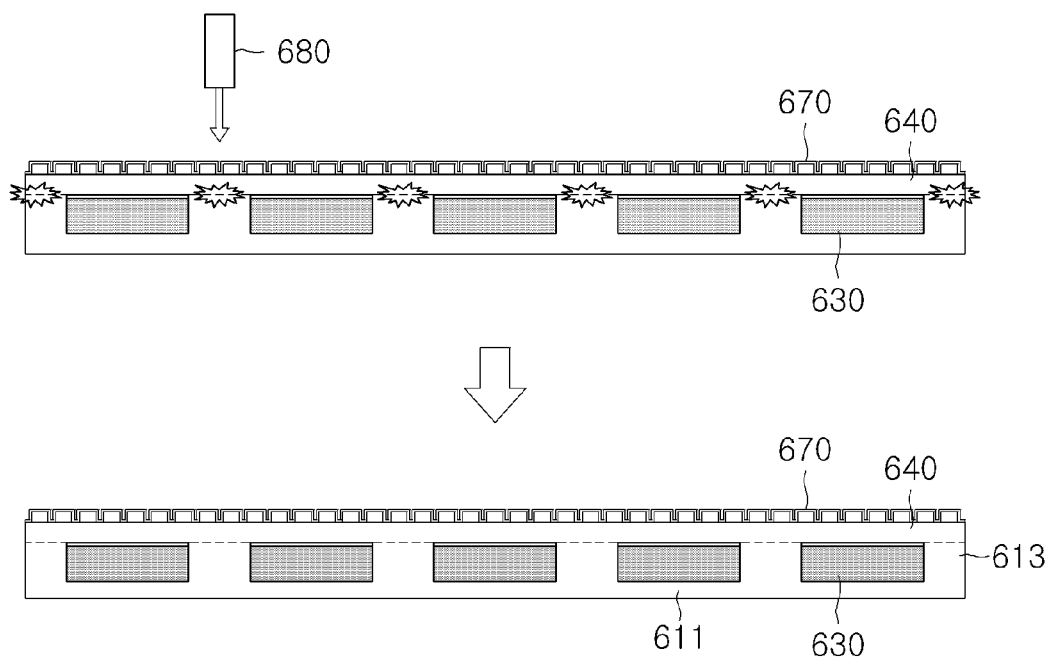

Referring to FIG. 6H, the upper light transmitting plate 640 with the heat dissipation member 670 is disposed above of the side light transmitting plates 613 to cover the QD phosphor 430 which is present in the plurality of empty portions 620.

While the lower and upper light transmitting plates 610 and 640 are stacked, a femto laser beam having a predetermined wavelength may be irradiated onto the upper surface of the upper light transmitting plate 640 in a vertical direction using the laser apparatus 680. The laser glass welding allows the QD phosphor 630 to be completely sealed in the plurality of empty portions 620 which is present between the lower light transmitting plate 610 and the upper light transmitting plate 640.

When welding the laser glass is completed, the plurality of side light transmitting plates 413 may be cut in the vertical direction to the upper surface of the upper light transmitting plate 640 along a midpoint between the respective empty portions 620 using a cutting device (not illustrated). That is, the plurality of side light transmitting plates 613 may be cut in the vertical direction by using the cutting device. A plurality of QD plate assemblies 500 may be fabricated through a cutting process depending on such a unit plate region.

Hereinabove, in the QD plate assembly 500 created through the aforementioned processes, the heat dissipation member is disposed on the upper surface of the upper light transmitting plate to improve the heat dissipation of the QD plate assembly 500.

Meanwhile, there is a problem that during the laser glass welding process, air permeates through a small gap between the plurality of side light transmitting plates and the upper light transmitting plate to degrade performance of the QD plate assembly. In order to solve such a problem, it is necessary to add a process of removing air which permeates into an empty space between the lower light transmitting plate and the upper light transmitting plate.

Figure 8A:
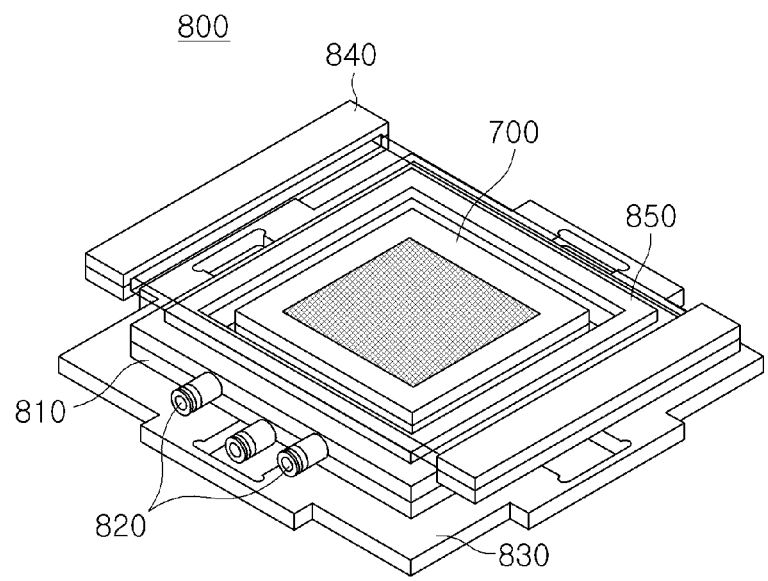
FIGS. 8A and 8B are a diagram illustrating a configuration of a jig for removing air, which is used in the laser welding process of FIG. 7.
Figure 8B:
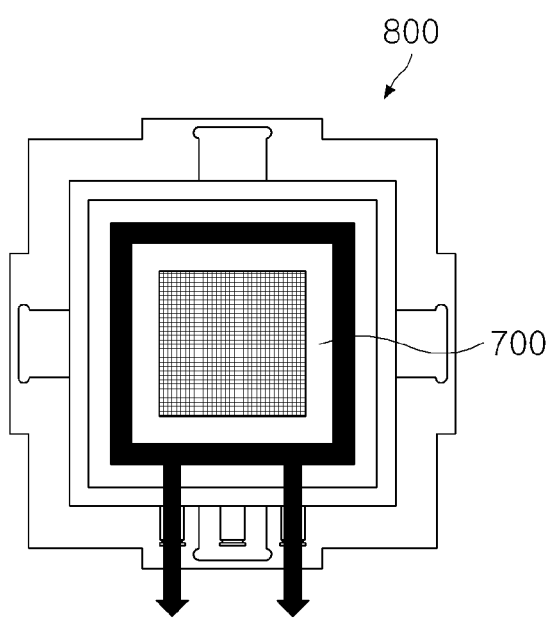

FIG. 7 is a flowchart for describing a laser welding process according to an exemplary embodiment of the present invention and FIGS. 8A and 8B are a diagram illustrating a configuration of a jig for removing air, which is used in the laser welding process of FIG. 7.

Referring to FIGS. 7, 8A and 8B, an air removing jig 600 for removing air existing in an empty space between the lower light transmitting plate and the upper light transmitting plate during the laser welding process may be provided (S710).

The air removing jig 800 may include a chamber 810 for mounting a light transmitting plate assembly 700, at least one vacuum port 820 for removing air inside the chamber 810, a mounting unit 830 for installing the chamber 810 in a laser welding jig (not illustrated), an upper plate portion 840 for covering an opened upper surface of the chamber 810, and a sealing portion 850 disposed between the chamber 810 and the upper plate portion 840.

The chamber 810 may have an internal space for mounting the light transmitting plate assembly 700. The chamber 810 may be made of a metal material having heat resistance.

The vacuum port 820 may be formed to protrude outward from one side of the chamber 810. The vacuum port 820 may be made of the same material as the chamber 810.

The mounting unit 830 may be installed below the chamber 810 and may include one or more fastening members for mounting the air removing jig 800 to a laser welding jig. Accordingly, the air removing jig 800 may be used while being fixed to the laser welding jig.

The upper plate portion 840 is disposed above the chamber 810 to cover the opened upper surface of the chamber 810. At least a part of the upper plate portion 840 may be made of a quartz material capable of transmitting a laser beam.

The sealing portion 850 is disposed between the chamber 810 and the upper plate portion 840 to seal the chamber 810 and the upper plate portion 840 so as to prevent external air from entering between the chamber 810 and the upper plate portion 840. The sealing portion 850 may be made of a material having elastic force.

The air removing jig 800 may be installed in the laser welding jig located below the laser apparatus (S720). Here, the laser welding jig as a mechanical equipment for assisting the laser welding process may include a fixation unit for fixing the air removing jig 800 and a driving unit for moving the air removing jig 800 in a 2-axis (X-axis/Y-axis) or 3-axis (X-axis/Y-axis/Z-axis) direction.

When installation of the air removing jig 800 is completed, the light transmitting plate assembly 700 may be formed by assembling the lower light transmitting plate and the upper light transmitting plate (S730). That is, the upper light transmitting plate may be stacked on the upper portion of the lower light transmitting plate into which the QD phosphor is injected.

After the upper plate portion 840 of the air removing jig 800 is separated, the light transmitting plate assembly 700 may be moved to the inside of the chamber 810 of the air removing jig 800 (S740). When movement of the light transmitting plate assembly 700 is completed, the upper plate portion 840 is fastened to the upper portion of the air removing jig 800 so as to prevent the external air from entering the inside of the chamber 810.

Meanwhile, as another example, while the upper plate portion 840 of the air removing jig 800 is separated, the lower and upper light transmitting plates are moved to the inside of the chamber 810 and then, the lower and upper light transmitting plates may be assembled in the chamber 810. When assembling the lower and upper light transmitting plates is completed, the upper plate portion 840 is fastened to the upper portion of the air removing jig 800 so as to prevent the external air from entering the inside of the chamber 810.

Thereafter, all air existing in the chamber 810 may be removed through the vacuum port 820 installed at one side of the chamber 810 (S750). As a result, spaces which are present between the lower and upper light transmitting plates maintain a vacuum state.

While the inside of the chamber 710 maintains the vacuum state, a laser beam having a first wavelength band may be irradiated in a vertical direction to the upper surface of the air removing jig 800 by using the laser apparatus (S760). The laser beam is transmitted through the upper plate portion 840 of the air removing jig 800 to weld the lower and upper light transmitting plates which are present in the chamber 810.

When the laser glass welding is completed, the light transmitting plate assembly 800 which is present in the chamber 810 may be moved to a cutting process chamber by separating the upper plate portion 840 of the air removing jig 800 (S770). In the cutting process chamber, a plurality of QD plate assemblies may be manufactured by cutting the light transmitting plate assembly 700 along the unit plate region.

Meanwhile, as another example, the light transmitting plate assembly 700 may be cut by irradiating a laser beam having a second wavelength band different from the first wavelength band to the light transmitting plate assembly 700 which is present in the chamber 810 without a need of moving the light transmitting plate assembly 700 to the outside of the chamber 810. The plurality of QD plate assemblies manufactured through the cutting process may be moved out of the air removing jig 800.

As described above, according to the present invention, the laser glass welding is performed by using the air removing jig to manufacture a quantum dot plate assembly in which the empty space between the QD phosphor disposed in the empty portion of the lower light transmitting plate and the upper light transmitting plate may maintain the vacuum state.

Figure 10A:
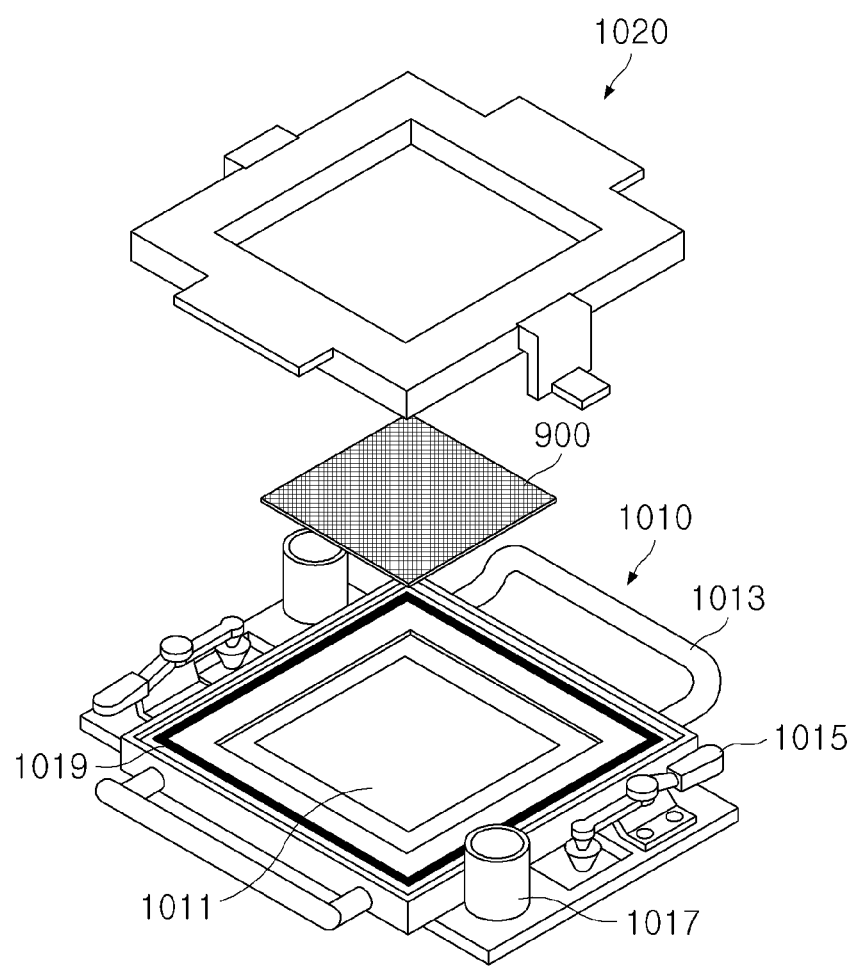
FIGS. 10A and 10B are a diagram illustrating a configuration of a jig for injecting nitrogen, which is used in the laser welding process of FIG. 9.
Figure 10B:
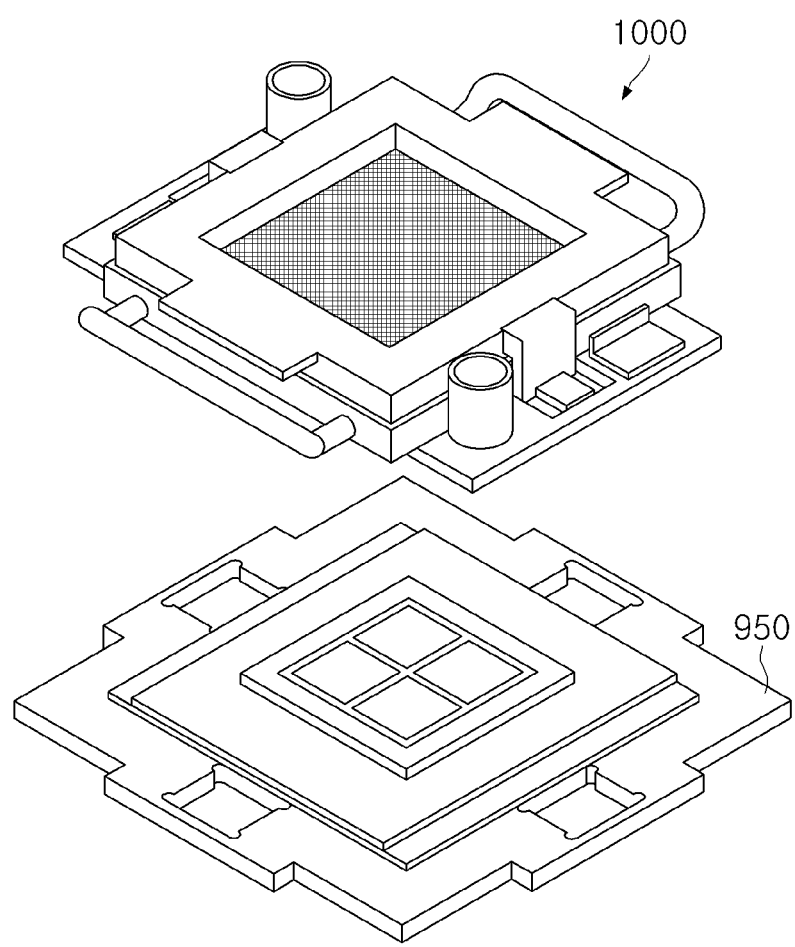

FIG. 9 is a flowchart for describing a laser welding process according to another exemplary embodiment of the present invention and FIGS. 10A and 10B are a diagram illustrating a configuration of a jig for injecting nitrogen, which is used in the laser welding process of FIG. 9.

Referring to FIGS. 9, 10A and 10B, a nitrogen injecting jig 1000 for injecting nitrogen ($N_2$) into the empty space between the lower light transmitting plate and the upper light transmitting plate may be provided in the laser welding process (S910).

The nitrogen injecting jig 1000 may include a lower jig module 1010 for mounting the light transmitting plate assembly 900 and an upper jig module 1020 for covering the opened upper surface of the lower jig module 1010.

The lower jig module 1010 may include a body portion 1011 for mounting the light transmitting plate assembly 900, a grip member 1013 for moving the nitrogen injecting jig 1000, a fastening member 1015 for coupling the upper jig module 1020 to the lower jig module 1010, a fixation member 1017 for fixing the nitrogen injecting jig 1000 to another facility, a sealing unit 1019 for blocking entry of external gas between the lower jig module 1010 and the upper jig module 1020, and the like.

The body portion 1011 may have an internal space for mounting the light transmitting plate assembly 900. The upper surface of the body portion 1011 may be made of the quartz material. The grip member 1013 may be formed to protrude outward from one side of the body portion 1011. The sealing unit 1019 is disposed in an upper periphery region of the body portion 1011 to seal the lower jig module 1010 and the upper jig module 1020 so as to prevent the external gas from entering between the lower jig module 1010 and the upper jig module 1020. The sealing unit 1019 may be made of a material having elastic force.

The upper jig module 1020 is disposed above the lower jig module 1010 to cover the opened upper surface of the lower jig module 1010. At least a part of the upper jig module 1020 may be made of the quartz material capable of transmitting the laser beam.

The nitrogen injecting jig 1000 may be moved to a nitrogen process chamber and the nitrogen injecting jig 1000 may be mounted on a fixation plate 950 installed in the nitrogen process chamber (S920). Here, the nitrogen process chamber means a process chamber filled with nitrogen ($N_2$) gas at 100%. The reason for working in the nitrogen process chamber is that a quantum dot does not react with the nitrogen ($N_2$) gas.

The lower and upper light transmitting plates are moved to the nitrogen process chamber together with the nitrogen injecting jig 1000 and the lower and upper light transmitting plates are assembled in the corresponding process chamber to form the light transmitting plate assembly 900 (S930). That is, in the nitrogen process chamber, the upper light transmitting plate may be stacked on the upper portion of the lower light transmitting plate into which the QD phosphor is injected.

Then, the light transmitting plate assembly 900 may be moved to the lower jig module 1010 of the nitrogen injecting jig 1000 (S940). When movement of the light transmitting plate assembly 900 is completed, the upper jig module 1020 is fastened to the lower jig module 1010 to prevent the external gas from entering the nitrogen injecting jig 1000.

Meanwhile, as another example, the lower and upper light transmitting plates may be moved to the lower jig module 1010 and then, the lower and upper light transmitting plates may be assembled in the corresponding module 1010. When assembling the lower and upper light transmitting plates is completed, the upper jig module 1020 is fastened to the lower jig module 1010 to prevent the external gas from entering the nitrogen injecting jig 1000. Through the processes, only the nitrogen ($N_2$) gas is filled in the spaces existing between the lower light transmitting plate and the upper light transmitting plate.

When assembly of the nitrogen injecting jig 1000 is completed, the light transmitting plate assembly 900 and the nitrogen injecting jig 1000 including the nitrogen gas may be moved from the nitrogen process chamber to the laser welding chamber (S950).

The nitrogen injecting jig 1000 may be installed in the laser welding jig located below the laser apparatus (S960). Here, the laser welding jig as mechanical equipment for assisting the laser welding process may include a fixation unit for fixing the nitrogen injecting jig 1000 and a driving unit for moving the nitrogen injecting jig 1000 in the 2-axis (X-axis/Y-axis) or 3-axis (X-axis/Y-axis/Z-axis) direction.

When installation of the nitrogen injecting jig 1000 is completed, the laser beam having the first wavelength band may be irradiated in the vertical direction to the upper surface of the nitrogen injecting jig 1000 by using the laser apparatus (S970). The laser beam is transmitted through the upper jig module 1020 to weld the lower light transmitting plate and the upper light transmitting plate existing in the lower jig module 1010.

When the laser glass welding is completed, the light transmitting plate assembly 900 which is present in the lower jig module 1010 may be moved to the cutting process chamber by separating the upper jig module 1020 of the nitrogen injecting jig 1000 (S980). In the cutting process chamber, a plurality of QD plate assemblies may be manufactured by cutting the light transmitting plate assembly 900 along the unit plate region.

Meanwhile, as another example, the light transmitting plate assembly 900 may be cut by irradiating the laser beam having the second wavelength band different from the first wavelength band to the light transmitting plate assembly 900 which is present in the corresponding jig 1000 without a need of moving the light transmitting plate assembly 900 to the outside of the nitrogen injecting jig 1000. The plurality of QD plate assemblies manufactured through the cutting process may be moved out of the nitrogen injecting jig 1000.

As described above, according to the present invention, the laser glass welding is performed by using the nitrogen injecting jig to manufacture a quantum dot plate assembly in which the empty space between the QD phosphor disposed in the empty portion of the lower light transmitting plate and the upper light transmitting plate may contain the nitrogen gas.

Figure 11:
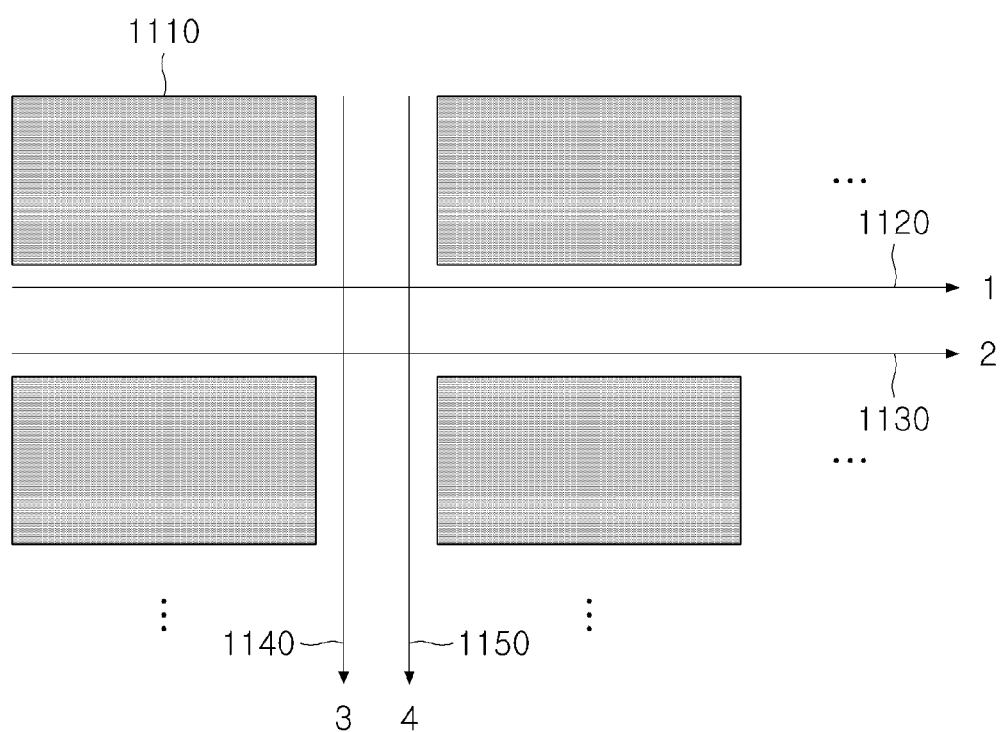
FIG. 11 is a diagram referred to for describing a laser welding process according to an exemplary embodiment of the present invention.

FIG. 11 is a diagram referred to for describing a laser welding process according to an exemplary embodiment of the present invention.

Referring to FIG. 11, the QD phosphor is injected into a plurality of empty portions 1110 formed on the upper surface of the lower light transmitting plate and then, the upper light transmitting plate is stacked to cover the QD phosphor and the lower light transmitting plate. In such a stacking state, a femto laser beam of a predetermined wavelength band may be irradiated onto the upper surface of the upper light transmitting plate by using a laser apparatus (not illustrated).

The laser apparatus may preset welding lines which are movement paths for irradiating the femto laser beam. In the exemplary embodiment, the laser apparatus may set first and second welding lines 1120 and 1130 in a direction corresponding to a longitudinal direction of empty portions 1110 arranged inside the light transmitting plate assembly and set third and fourth welding lines 1140 and 1150 in a direction corresponding to a short direction of the empty portions 1110. Here, the longitudinal direction of the empty portion 1110 refers to a direction indicated by a longer edge among four edges of the empty portion and the short direction of the empty portion 1110 refers to a direction indicated by a shorter edge among four edges of the empty portion.

The first welding line 1120 and the second welding line 1130 may be set between the empty portions 1110 arranged in a first direction (i.e., the longitudinal direction of the empty portions) and adjacent empty portions 1110 thereto. The third welding line 1140 and the fourth welding line 1150 may be set between the empty portions 1110 arranged in a second direction (i.e., the short direction of the empty portions) and the adjacent empty portions 1110 thereto. The first and second welding lines 1120 and 1130 may be set in adjacent regions of the empty portions 1110 arranged in the first direction and the third and fourth welding lines 1140 and 1150 may be set in adjacent regions of the empty portions 1110 arranged in the second direction.

The laser apparatus may irradiate the femto laser beam along the first welding line 1120 and then, irradiate the femto laser beam along the second welding line 1130. The laser apparatus may irradiate the femto laser beam along the third welding line 1140 and then, irradiate the femto laser beam along the fourth welding line 1150. That is, the laser apparatus may irradiate the femto laser beam in the order of the first welding line 1120, the second welding line 1130, the third welding line 1140, and the fourth welding line 1150.

When the laser glass welding is completed, the plurality of side light transmitting plates 413 may be cut in the vertical direction to the upper surface of the upper light transmitting plate along a midpoint between the respective empty portions 1110 using a cutting device (not illustrated).

As described above, in the laser welding process according to the present invention, the laser beam may be irradiated along the welding lines corresponding to the longitudinal direction of the empty portions 1110 and the laser beam may be irradiated along the welding lines corresponding to the short direction of the empty portions 1110. In the laser welding process may minimize generation of a crack in the lower and upper light transmitting plates.

However, the laser welding process causes a lifting phenomenon in which stress is intensively generated due to tensile force of the glass around the first welding line 1120 in which the laser welding is first performed, and as a result, there is a problem in that the crack is generated at points where the welding lines meet. In order to solve the problem, the laser welding needs to be performed by adding an auxiliary welding line.

Figure 12:
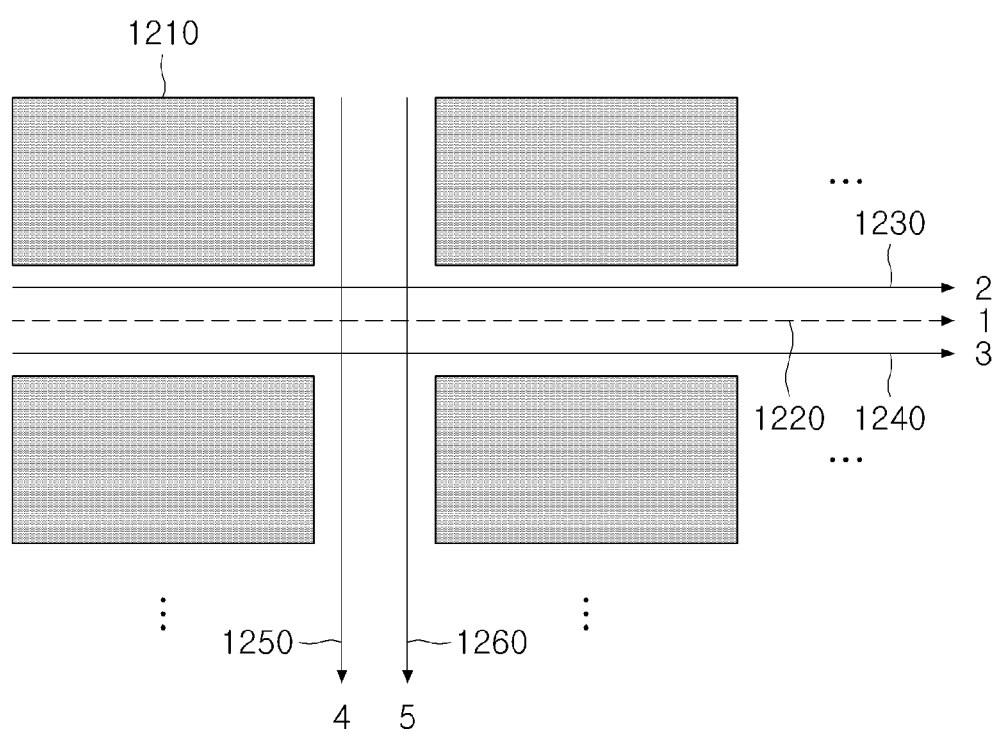
FIG. 12 is a diagram referred to for describing a laser welding process according to another exemplary embodiment of the present invention.

FIG. 12 is a diagram referred to for describing a laser welding process according to another exemplary embodiment of the present invention.

Referring to FIG. 12, the QD phosphor is injected into a plurality of empty portions 1210 formed by the upper surface of the lower light transmitting plate and then, the upper light transmitting plate is stacked to cover the QD phosphor and the lower light transmitting plate. In such a stacking state, a femto laser beam of a predetermined wavelength band may be irradiated onto the upper surface of the upper light transmitting plate by using a laser apparatus (not illustrated).

The laser apparatus may preset welding lines which are movement paths for irradiating the femto laser beam. In the exemplary embodiment, the laser apparatus may set an auxiliary welding line 1220, a first main welding line 1230, and a second main welding line 1240 corresponding to the longitudinal direction of empty portions 1210 arranged inside the light transmitting plate assembly and set third and fourth main welding lines 1250 and 1260 corresponding to the short direction of the empty portions 1210.

The auxiliary welding line 1220, the first main welding line 1230, and the second main welding line 1240 may be set between the empty portions 1210 arranged in a first direction (i.e., the longitudinal direction of the edge portions) and adjacent empty portions 1210 thereto. Here, the auxiliary welding line 1220 may be set between the first main welding line 1230 and the second main welding line 1240. Further, the auxiliary welding line 1220 may be set along a midpoint between the empty portions 1210 arranged in the first direction and the adjacent empty portions 1210 thereto. The first and second main welding lines 1230 and 1240 may be set in adjacent regions of the empty portions 1210 arranged in the first direction.

The third welding line 1250 and the fourth welding line 1260 may be set between the empty portions 1210 arranged in a second direction (i.e., the short direction of the empty portions) and the adjacent empty portions 1210 thereto. The third and fourth main welding lines 1250 and 1260 may be set in adjacent regions of the empty portions 1210 arranged in the second direction.

The laser apparatus may first irradiate the femto laser beam along the auxiliary welding line 1220 and irradiate the femto laser beam along the first welding line 1230 and then, irradiate the femto laser beam along the second main welding line 1240. Thereafter, the laser apparatus may irradiate the femto laser beam along the third main welding line 1250 and then, irradiate the femto laser beam along the fourth main welding line 1260. That is, the laser apparatus may irradiate the femto laser beam in the order of the auxiliary welding line 1220, the first main welding line 1230, the second main welding line 1240, the third main welding line 1250, and the fourth main welding line 1260.

When the laser glass welding is completed, the plurality of side light transmitting plates 413 may be cut in the vertical direction to the upper surface of the upper light transmitting plate along a midpoint between the respective empty portions 1210 by using a cutting apparatus (not illustrated). In this case, the cutting apparatus may cut the side light transmitting plate in the vertical direction to the upper surface of the light transmitting plate assembly along the auxiliary welding line 1220.

Meanwhile, as another example, the laser apparatus may set the auxiliary welding line, the first main welding line, and the second main welding line corresponding to the short direction of the empty portions 1210 arranged inside the light transmitting plate assembly and set the third and fourth main welding lines in the direction corresponding to the longitudinal direction of the empty portions 1210. In this case, the laser apparatus may irradiate the femto laser beam in the order of the auxiliary welding line, the first main welding line, the second main welding line, the third main welding line, and the fourth main welding line.

As described above, in the laser welding process according to the present invention, the laser welding is first performed along the auxiliary welding line so that the stress due to the tensile force of the glass is generated intensively around the auxiliary welding line, thereby minimizing a phenomenon in which the stress is generated in the vicinity of the remaining main welding lines. Accordingly, the laser welding process may minimize the occurrence of the lifting phenomenon in the vicinity of the main welding lines and significantly enhance a yield of the QD plate assembly.

A method in which the laser apparatus irradiates the laser beam along predetermined welding lines generally includes a vertical irradiation method in which the laser beam is irradiated in the vertical direction to the upper surface of the upper light transmitting plate and a diagonal irradiation method in which the laser beam is irradiated in a diagonal direction to the upper surface of the upper light transmitting plate. In addition, the vertical irradiation method includes a single irradiation method in which the laser beam is irradiated to the predetermined welding lines only once and a double irradiation method in which the laser beam is irradiated to the predetermined welding lines twice.

Figure 13:
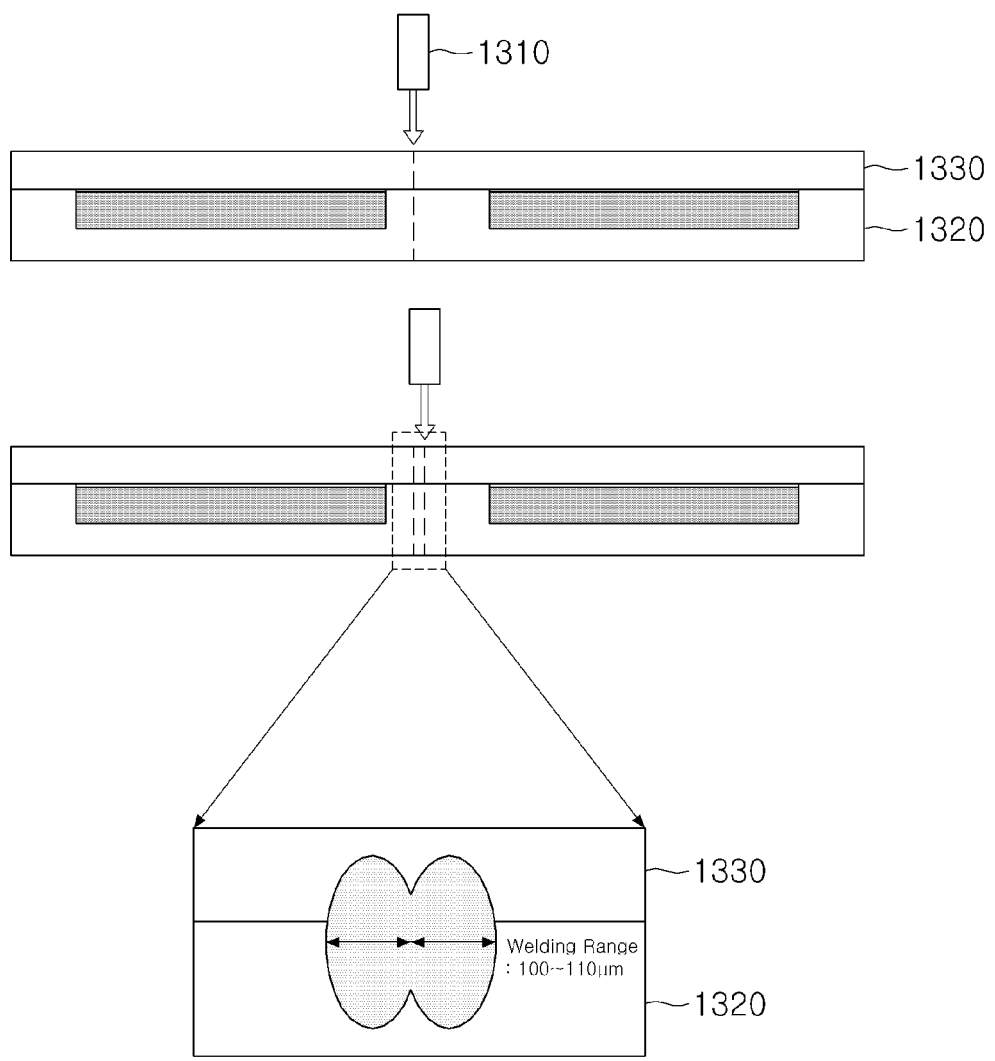
FIG. 13 is a diagram referred to for describing a laser welding method according to an exemplary embodiment of the present invention.

FIG. 13 is a diagram referred to for describing a laser welding method according to an exemplary embodiment of the present invention. The laser welding method described in the exemplary embodiment is the double irradiation method which is one of the vertical irradiation methods.

Referring to FIG. 13, a laser apparatus 1310 may irradiate the femto laser beam twice in a vertical direction to the upper surface of an upper light transmitting plate 1330 along predetermined welding lines.

That is, the laser apparatus 1310 may irradiate the femto laser beam once along the predetermined welding lines and then, irradiate the femto laser beam once again along the corresponding welding lines. In this case, the laser apparatus 1310 may irradiate the femto laser beam by slightly differentiating a first irradiation location and a second irradiation location based on each welding line. This is to enhance coupling force between a lower light transmitting plate 1320 and an upper light transmitting plate 1330 by expanding a laser welding region.

A welding range formed between the respective empty portions may be approximately 100 to 110 μm through the double irradiation method and is not particularly limited thereto.

However, the double irradiation method has a disadvantage in that a time required for the laser welding process increases because a plurality of welding lines is irradiated with the femto laser beam twice in a predetermined order.

Figure 14:
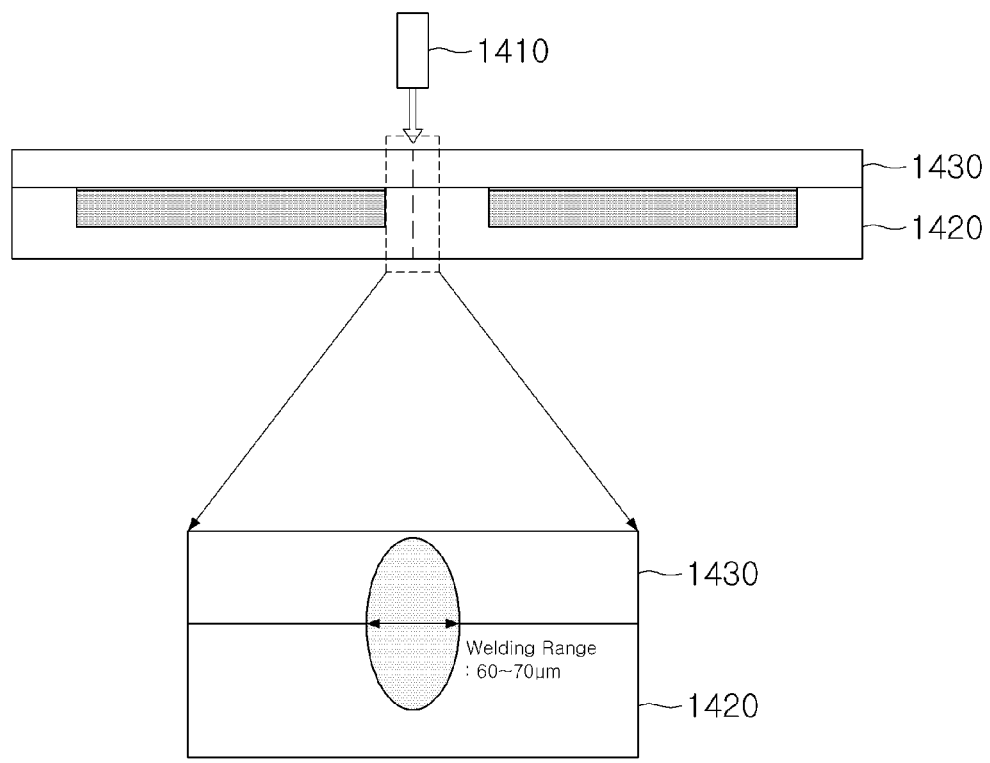
FIG. 14 is a diagram referred to for describing a laser welding method according to another exemplary embodiment of the present invention.

FIG. 14 is a diagram referred to for describing a laser welding method according to another exemplary embodiment of the present invention. The laser welding method described in the exemplary embodiment is the single irradiation method which is one of the vertical irradiation methods.

Referring to FIG. 14, a laser apparatus 1410 may irradiate the femto laser beam once in the vertical direction to the upper surface of an upper light transmitting plate 1430 along predetermined welding lines.

That is, the laser apparatus 1410 may irradiate the femto laser beam once along a plurality of welding lines in a predetermined order. The welding range formed between the respective empty portions may be approximately 60 to 70 μm through the single irradiation method and is not particularly limited thereto.

The single irradiation method is advantageous in that the time required for the laser welding process is shortened because the plurality of welding lines are irradiated only once with the femto laser beam in a predetermined order, but is disadvantageous in that the welding range is narrowed, and as a result, the coupling force between the lower light transmitting plate 1420 and the upper light transmitting plate 1430 is weakened.

Figure 15:
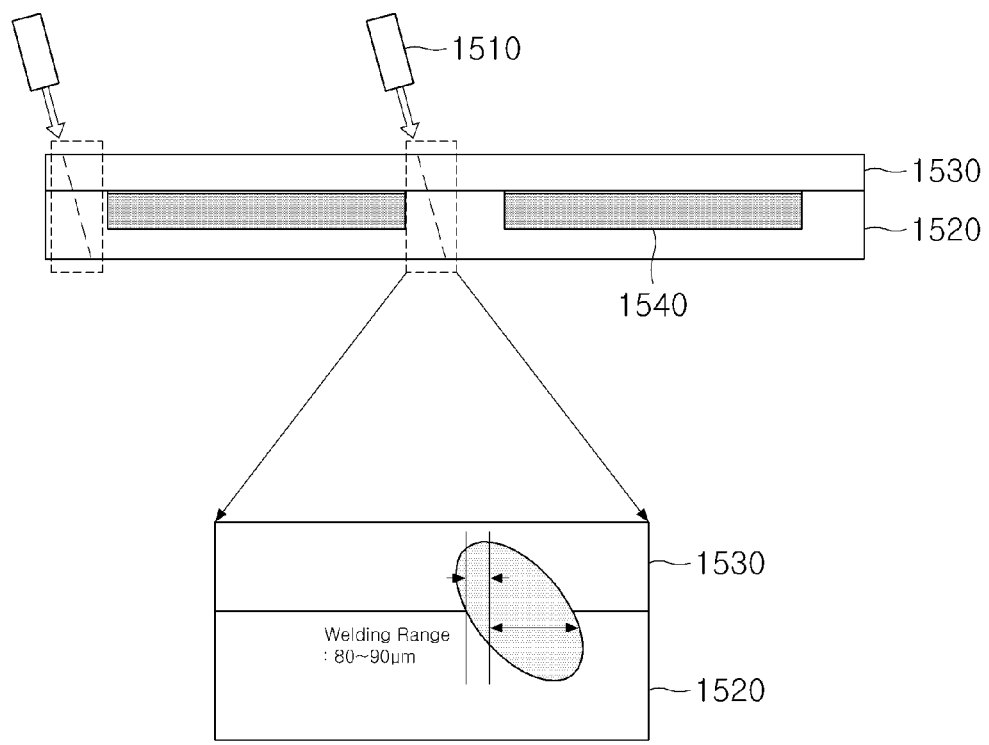
FIG. 15 is a diagram referred to for describing a laser welding method according to yet another exemplary embodiment of the present invention.

FIG. 15 is a diagram referred to for describing a laser welding method according to yet another exemplary embodiment of the present invention. The laser welding method described in the exemplary embodiment is the diagonal irradiation method.

Referring to FIG. 15, a laser apparatus 1510 may irradiate the femto laser beam once in the diagonal direction to the upper surface of an upper light transmitting plate 1530 along predetermined welding lines. In this case, an angle at which the upper surface of the upper light transmitting plate 1530 and the diagonal line of the laser beam meet may be in the range of approximately 20 to 70° and is not particularly limited thereto.

The laser apparatus 1510 may irradiate the plurality of welding lines with the femto laser beam once in a predetermined order. The welding range formed between the respective empty portions may be approximately 80 to 90 μm through the diagonal irradiation method and is not particularly limited thereto.

The laser apparatus 1510 may irradiate respective welding lines in the same diagonal direction. Further, the laser apparatus 1510 may irradiate the femto laser beam in the diagonal direction so as not to meet an empty portion 1540.

The diagonal irradiation method is advantageous in that the time required for the laser welding process may be shortened because the plurality of welding lines is irradiated only once with the femto laser beam in a predetermined order and the coupling force between the lower light transmitting plate 1520 and the upper light transmitting plate 1530 is enhanced because the welding range is widened as compared with the single irradiation method.

Figure 16:
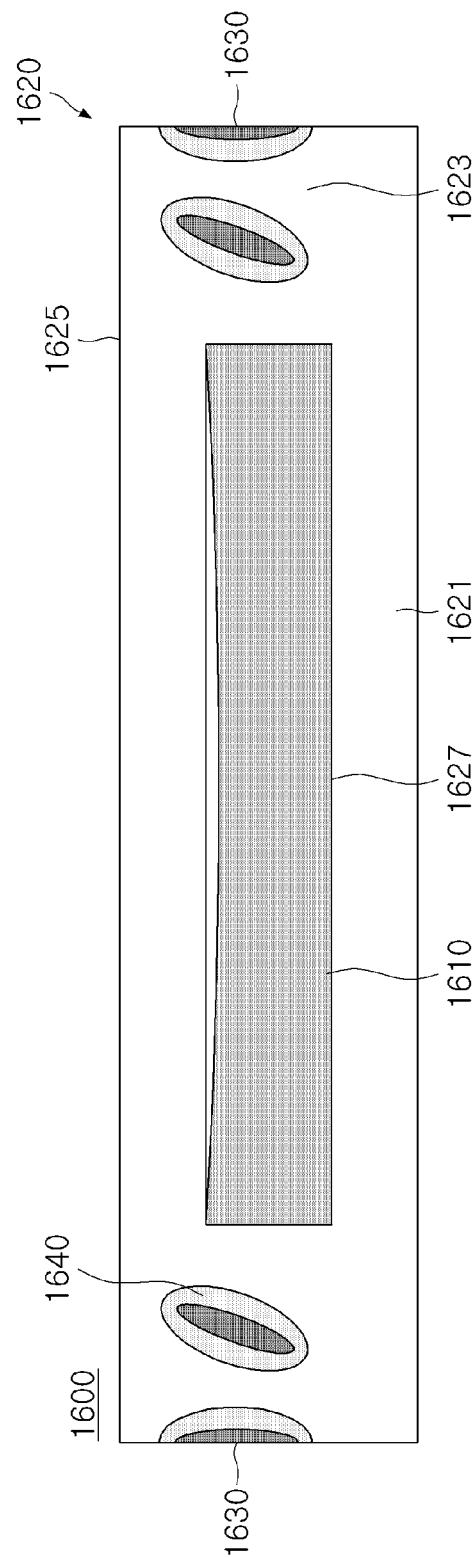
FIG. 16 is a cross-sectional view of a QD plate assembly manufactured using the laser welding method of FIG. 15.

FIG. 16 is a cross-sectional view of a QD plate assembly manufactured using the laser welding method of FIG. 15.

Referring to FIG. 16, a quantum dot plate assembly 1600 according to an exemplary embodiment of the present invention may include a QD material 1610 for converting a wavelength of light and a light transmitting plate body 1620 on which the QD material 1610 is mounted.

The QD material 1610 as a color light conversion material including quantum dots may be formed by mixing or dispersing the quantum dots in a matrix material such as acrylate or epoxy polymer or a combination thereof.

The light transmitting plate body 1620 may include a lower light transmitting plate 1621, a plurality of side light transmitting plates 1623 formed on the upper surface of the lower light transmitting plate 1621, and an upper light transmitting plate 1625 corresponding to the upper surface of the lower light transmitting plate 1621 and formed on the upper surfaces of the plurality of side light transmitting plates 1623. An empty portion 1627 for accommodating the QD material 1610 may be formed inside the light transmitting plate body 1620.

A first welding region 1630 having a predetermined shape (for example, a semi-elliptical shape or a half-water droplet shape) may be formed on one side of the light transmitting plate body 1620. The first welding region 1630 may be formed such that a long radius of a semi-ellipse is oriented in the vertical direction. The first welding region 1630 may be formed by welding and cutting the side light transmitting plates and the upper light transmitting plate by irradiating the laser beam in the vertical direction along a predetermined auxiliary welding line.

A second welding region 1640 having a predetermined shape (e.g., an elliptical shape or a water droplet shape) may be formed between the first welding region 1630 and the empty portion 1627. The second welding region 1640 may be formed such that the long radius of an ellipse is oriented in the diagonal direction. The second welding region 1640 may be formed by welding the side light transmitting plates and the upper light transmitting plate by irradiating the laser beam in the diagonal direction along predetermined (main) welding lines.

The lower light transmitting plate 1621 may be made of a transparent material having good transparency. The empty portion 1627 and the side light transmitting plate 1623 may be formed on the upper surface (or upper portion) of the lower light transmitting plate 1621.

The overall shape of the lower light transmitting plate 1621 may be formed by the thin plate shape. The overall shape of the empty portion 1627 may be formed by the same or similar shape as the outer shape of the lower light transmitting plate 1621. The plurality of side light transmitting plates 1623 may be formed to surround the empty portion 1627 along the top edge region of the upper surface of the lower light transmitting plate 1621.

The upper light transmitting plate 1625 may be made of the same material as the lower light transmitting plate 1621, that is, a transparent material having good transparency and weldability. The upper light transmitting plate 1625 is disposed on upper portions of the side light transmitting plates 1623 to cover the QD material 1610 which is present in the empty portion 1627. A region where the upper light transmitting plate 1625 and the plurality of side light transmitting plates 1623 meet is welded with a femto laser beam to form the QD plate assembly 1600.

The QD plate assembly 1600 is disposed on a light emitting device (not illustrated) to effectively convert the wavelength of the light emitted from the light emitting device. In addition, the QD plate assembly 1600 may safely protect the QD material which is vulnerable to external environmental conditions by sealing the QD material 1610 in the empty portion 1627 of the light transmitting plate body 1620 using the laser beam.

Figure 17:
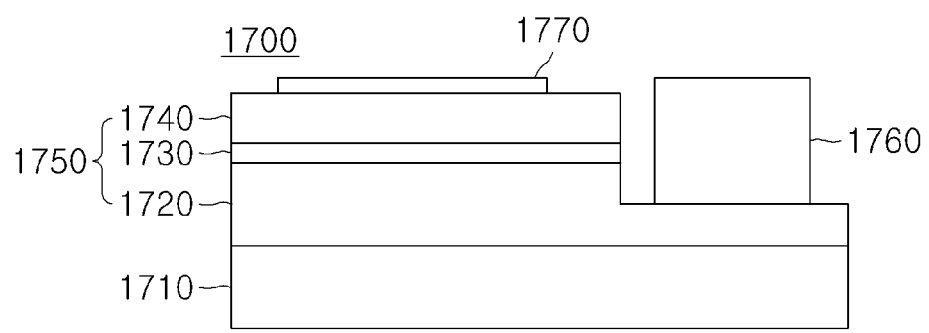
FIG. 17 is a cross-sectional view of a light emitting device according to an exemplary embodiment of the present invention.
Figure 18A:
FIGS. 18A to 18D are a diagram for describing a manufacturing method of a light emitting device according to an exemplary embodiment of the present invention.
Figure 18B:
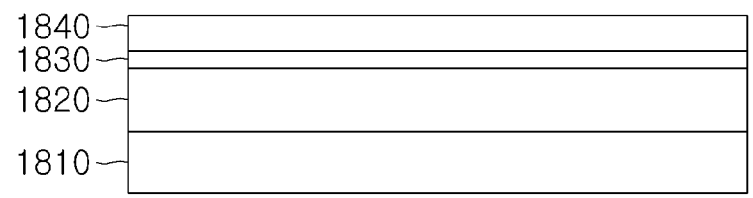
Figure 18C:
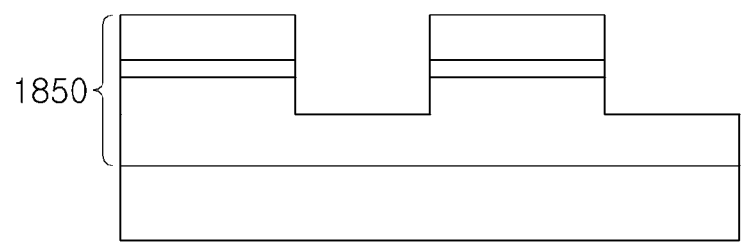
Figure 18D:
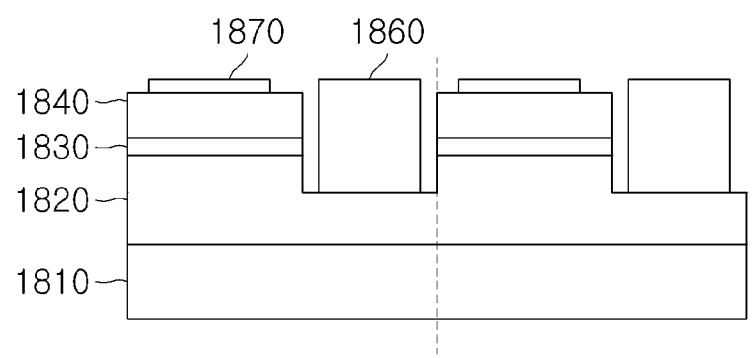

FIG. 17 is a cross-sectional view of a light emitting device according to an exemplary embodiment of the present invention and FIGS. 18A to 18D are a diagram for describing a manufacturing method of a light emitting device according to an exemplary embodiment of the present invention.

Referring to FIGS. 17 and 18A to 18D, a light emitting device 1700 according to an exemplary embodiment of the present invention may include substrates 1710 and 1810, light emitting structures 1750 and 1850 on the substrates 1710 and 1810, and first electrodes 1760 and 1860 and second electrodes 1770 and 1870 on the light emitting structures 1750 and 1850.

The substrates (or growth substrates) 1710 and 1810 may be made of at least one of a material having the transparency, for example, sapphire ($Al_2O_3$), a single crystal substrate, SiC, GaAs, GaN, ZnO, AlN, Si, GaP, InP, and Ge, but are not limited thereto.

First conductive semiconductor layers 1720 and 1820, active layers 1730 and 1830, and second conductive semiconductor layers 1740 and 1840 are sequentially grown on the substrates 1710 and 1810 to form the light emitting structures 1750 and 1850.

The light emitting structures 1750 and 1850 may be made of a group III-V compound semiconductor, for example, AlInGaN, GaAs, GaAsP, and GaP-based compound semiconductors and electrons and holes provided from the first conductive semiconductor layers 1720 and 1820 and the second conductive semiconductor layers 1740 and 1840 are recombined in the active layers 1730 and 1830 to generate light. The light emitting structures 1750 and 1850 may emit light of different wavelengths depending on a composition ratio of the compound semiconductor.

The first conductive semiconductor layers 1720 and 1820 may include compound semiconductors of group III-V elements doped with an n-type dopant. The first conductive semiconductor layers 1720 and 1820 may be selected from semiconductor materials having a composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, AlInN, InGaN, AlN, InN and the like, and may be doped with the n-type dopant such as Si, Ge, Sn, etc.

The active layers 1730 and 1830 are layers that emit light by a ban gap difference of energy bands depending on formed materials of the active layers 1730 and 1830 as the electrons (or holes) injected through the first conductive semiconductor layers 1720 and 1820 and the holes (or electrons) injected through the second conductive semiconductor layers 1740 and 1840 meet each other. The active layers 1730 and 1830 may be made of a semiconductor material having a composition formula of $In_xAl_yGa_{1-x-y}N$ ($0 \leq x \leq 1$, $0 \leq y \leq 1$, $0 \leq x+y \leq 1$).

The second conductive semiconductor layers 1740 and 1840 may include compound semiconductors of group III-V elements doped with a p-type dopant. The second conductive semiconductor layers 1740 and 1840 may be selected from semiconductor materials having the composition formula of $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlInN, AlN, InN, and the like and may be doped with the p-type dopant such as Mg, Zn, Ca, Sr, Ba, etc.

Isolation etching is performed with respect to the light emitting structures 1750 and 1850 according to a unit chip region to form a plurality of light emitting devices. One upper surface of each of the first conductive semiconductor layers 1720 and 1820 is exposed through the isolation etching.

Second conductive metal layers (i.e., p electrode) 1770 and 1870 may be formed on one upper surface of each of the second conductive semiconductor layers 1730 and 1830 and first conductive metal layers (i.e., n electrode) 1760 and 1860 may be formed on one upper surface of the first conductive semiconductor layers 1720 and 1820 which are mesa-etched. The first conductive metal layers 1760 and 1860 provide negative power to the light emitting device 1700 and the second conductive metal layers 1770 and 1870 provide positive power to the light emitting device 1700.

The light emitting structures 1750 and 1850 thus formed may be separated into the unit chip region through a chip separation process, thereby manufacturing a plurality of light emitting devices. The chip separating process may include, for example, a braking process of separating a chip by applying the physical force by using the blade, a laser scribing process of separating the chip by irradiating a chip boundary with the laser, an etching process of separating the chip by using the wet etching or dry etching, etc. and is not limited thereto.

Figure 19A:
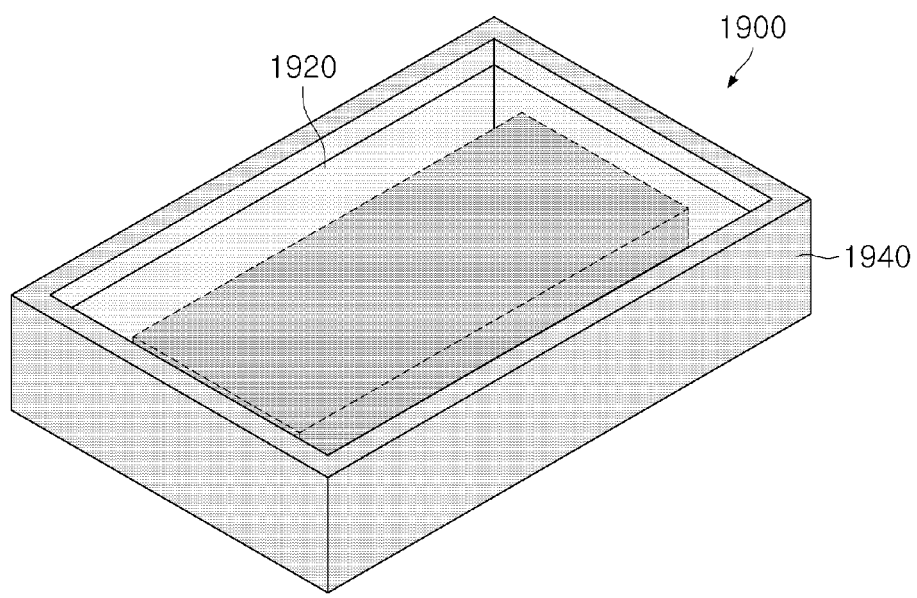
FIG. 19A is a perspective view of a light emitting device package according to an exemplary embodiment of the present invention.
Figure 19B:
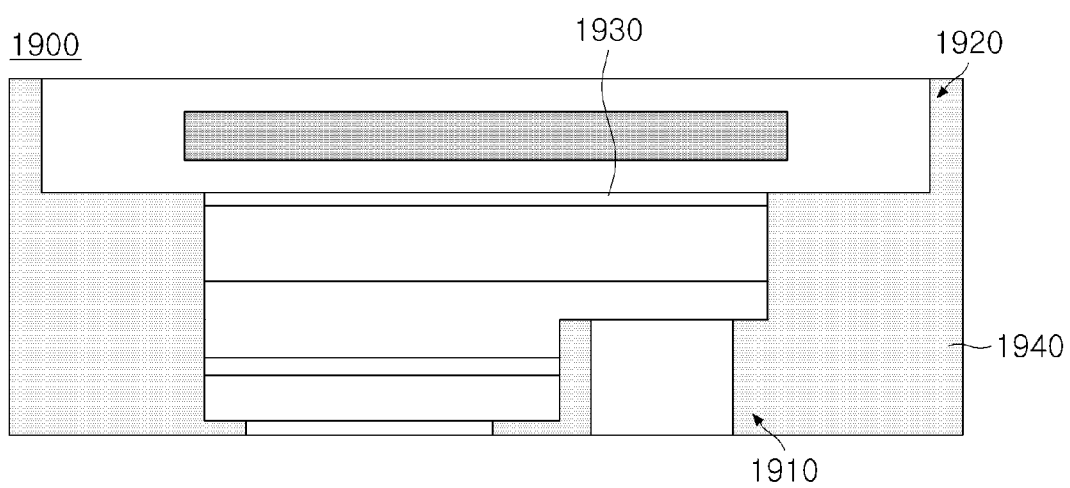
FIG. 19B is a cross-sectional view of a light emitting device package according to an exemplary embodiment of the present invention.
Figure 20B:
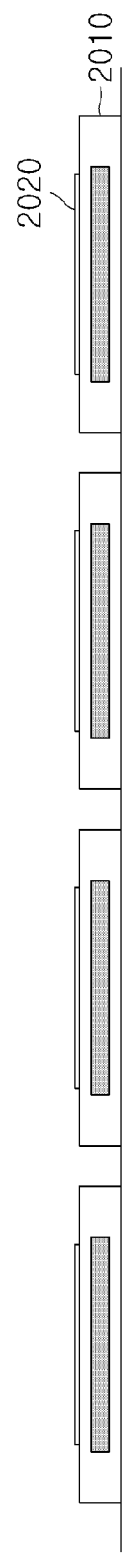
Figure 20C:
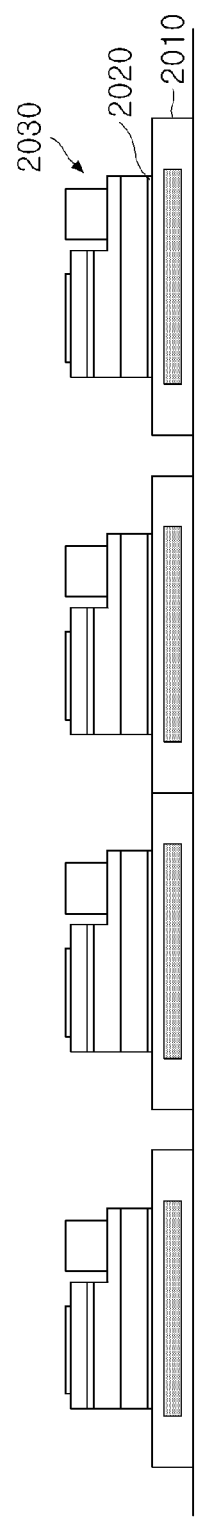
Figure 20D:
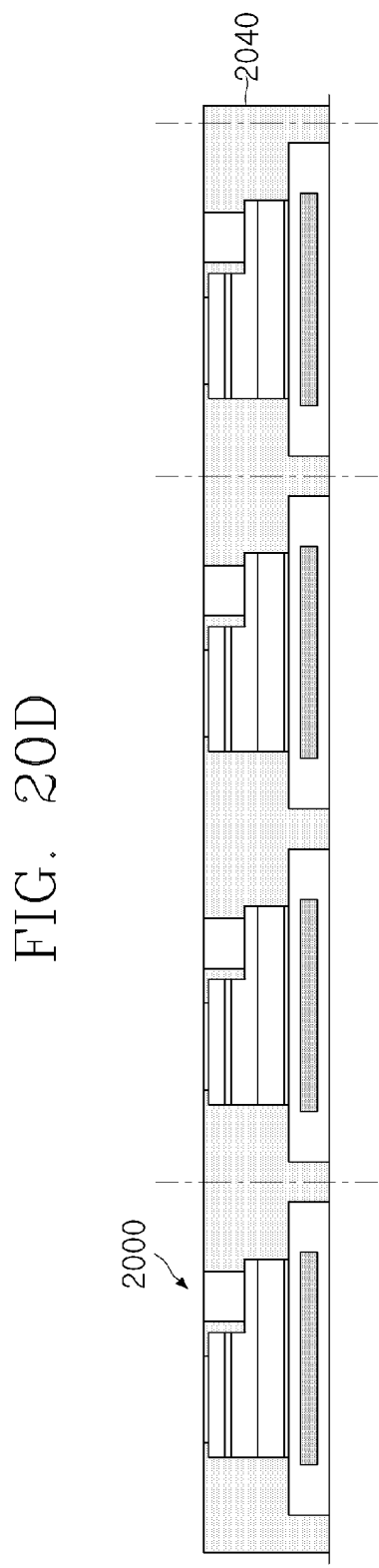

FIG. 19A is a perspective view of a light emitting device package according to an exemplary embodiment of the present invention and FIG. 19B is a cross-sectional view of a light emitting device package according to an exemplary embodiment of the present invention.

Referring to FIGS. 19A and 19B, a light emitting device package 1900 according to an exemplary embodiment of the present invention may include a light emitting device 1910, a QD plate assembly 1920, an adhesive layer 1930 between the light emitting device 1910 and the QD plate assembly 1920, and a reflection member 1940 surrounding the light emitting device 1910 and the QD plate assembly 1920.

The light emitting device 1910 may include a substrate, a first conductive semiconductor layer below the substrate, an active layer below the first conductive semiconductor layer, a second conductive semiconductor layer below the active layer, a second conductive metal layer below the second conductive semiconductor layer, and a first conductive metal layer below the first conductive semiconductor layer. The light emitting device 1910 is a flip chip type light emitting device in which the light emitting device 1700 of FIG. 17 is inverted upside down.

The QD plate assembly 1920 is disposed on the light emitting device 1910 to convert the wavelength of the light emitted from the light emitting device 1910. As an example, the QD plate assembly 1920 may convert light of a blue wavelength emitted from the light emitting device 1910 into light of a white wavelength.

The QD plate assembly 1920 may include a QD phosphor, a lower light transmitting plate accommodating the QD phosphor, and an upper light transmitting plate covering the QD phosphor and the lower light transmitting plate. A region where the lower light transmitting plate and the upper light transmitting plate meet each other is welded with the femto laser beam to seal the QD phosphor in the upper and lower light transmitting plates.

The adhesive layer (or adhesive sheet) 1930 is disposed between the light emitting device 1910 and the QD plate assembly 1920 to bond the light emitting device 1910 and the QD plate assembly 1920. The adhesive layer 1930 may be entirely applied to the upper surface of the light emitting device 1910. Further, the adhesive layer 1930 may be made of the transparent material so that the light emitted from the light emitting device 1910 may be easily transmitted.

The adhesive layer 1930 includes barrier metal or bonding metal. For example, the adhesive layer 1930 may be formed by a layer including any one or two or more of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu— Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—P, Ni—Mn—Pd, Ni—P, and Pd—Ni. As a preferred exemplary embodiment, the adhesive layer 1930 may be made of a silicon material.

The reflection member 1940 may be formed to surround the light emitting device 1910 and the QD plate assembly 1920. The reflection member 1940 may protect the light emitting device 1910 and the QD plate assembly 1920 from an external environment and/or external impact. Further, the reflection member 1940 may reflect the light emitted from the light emitting device 1910 in a specific direction (for example, an upward direction).

The reflection member 1940 may be made of at least one of a resin material such as polyphthalamide (PPA), silicon (Si), aluminum (Al), aluminum nitride (AlN), $AlO_x$, liquid crystal polymer (photo sensitive glass (PSG)), polyimide 9T (PA9T), syndiotactic polystyrene (SPS), a metal material, sapphire ($Al_2O_3$), and beryllium oxide (BeO). As a preferred exemplary embodiment, the reflection member 1940 may be made of the silicon material.

The light emitting device package 1900 may implement high color reproducibility by placing the QD plate assembly 1920 on the light emitting device 1910. Further, since the light emitting device package 1900 is manufactured in a chip size package type, a packaging process may be simplified.

FIGS. 20A to 20D are diagrams for describing a manufacturing method of a light emitting device package according to an exemplary embodiment of the present invention.

Referring to FIGS. 20A to 20D, a plurality of QD plate assemblies 2010 may be arranged in line or in matrix within a jig. Respective QD plate assemblies 2010 may be spaced apart from each other by a predetermined distance.

An adhesive layer (or an adhesive sheet) 2020 may be applied onto the upper surface of each QD plate assembly 2010. A light emitting device 2030 may be disposed on the QD plate assembly 2010 to which the adhesive layer 2020 is applied. The adhesive layer 2020 is cured under a predetermined temperature condition so as to bond the respective light emitting devices 2030 and the respective QD plate assemblies 2010 corresponding thereto to each other.

When the silicon (Si) material is used in the adhesive layer 2020, low temperature silicon is applied onto each QD plate assembly 2010, each light emitting device 2030 is disposed thereon, and the corresponding silicon is cured under a predetermined temperature condition (for example, a temperature condition of 150° C. or lower) to bond each QD plate assembly 2010 and each light emitting device 2030.

Thereafter, the reflection member 2040 may be filled to surround the plurality of QD plate assemblies 2010 and the plurality of light emitting devices 2030 using a silicon injecting device. The reflection member 2040 may be filled up to an uppermost end of each light emitting device 2030 such that only the first and second conductive metal layers of each light emitting device 2030 are exposed to the outside. When a predetermined time has elapsed under a predetermined temperature condition (for example, a condition of 100° C. or lower), the reflection member 2040 is solidly cured.

When the light emitting structure formed thus is separated into unit package regions through a package separating process, a plurality of light emitting device packages 2000 may be manufactured. The package separating process may include, for example, a breaking process of separating a chip by applying the physical force by using the blade, a laser scribing process of separating the chip by irradiating a chip boundary with the laser, an etching process of separating the chip by using the wet etching or dry etching, etc. and is not limited thereto.

The plurality of light emitting device packages 2000 separated through the package separating process may be used in an upside down fashion such that the light emitting device 2030 is positioned in a downward direction and the QD plate assembly 2010 is positioned in the upward direction.

Figure 21:
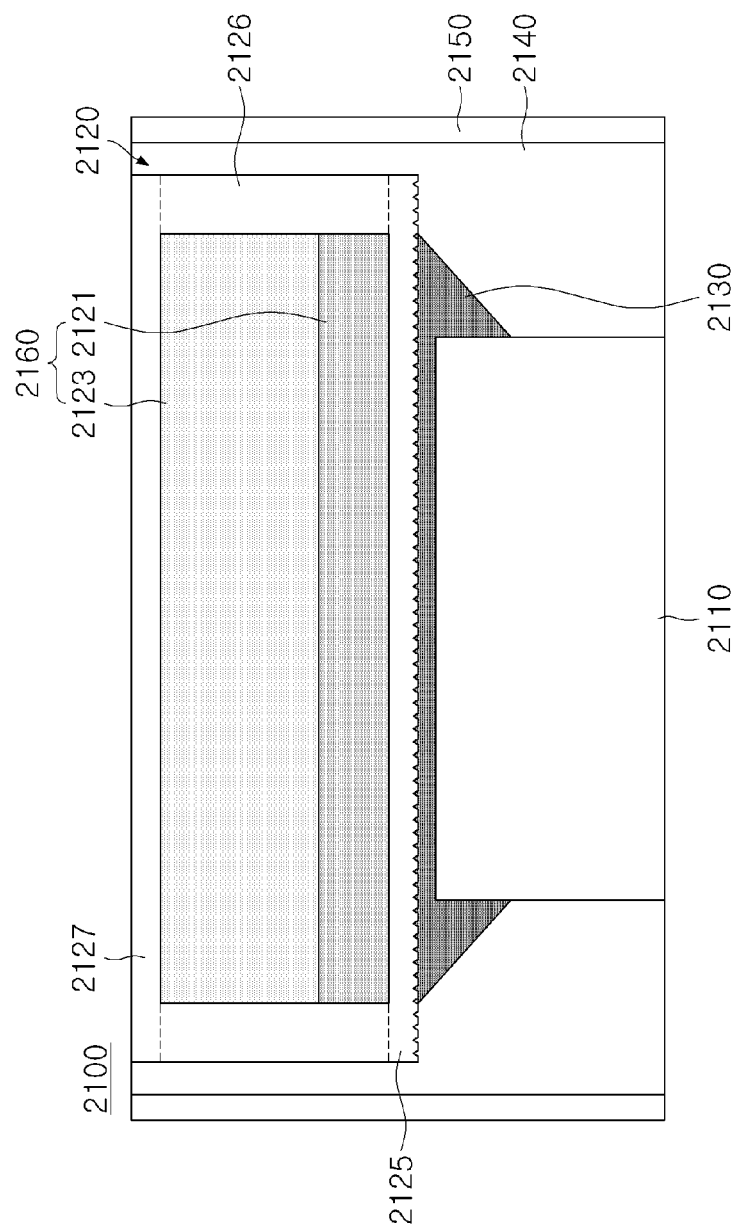
FIG. 21 is a cross-sectional view of a light emitting device package according to another exemplary embodiment of the present invention.
Figure 22A:
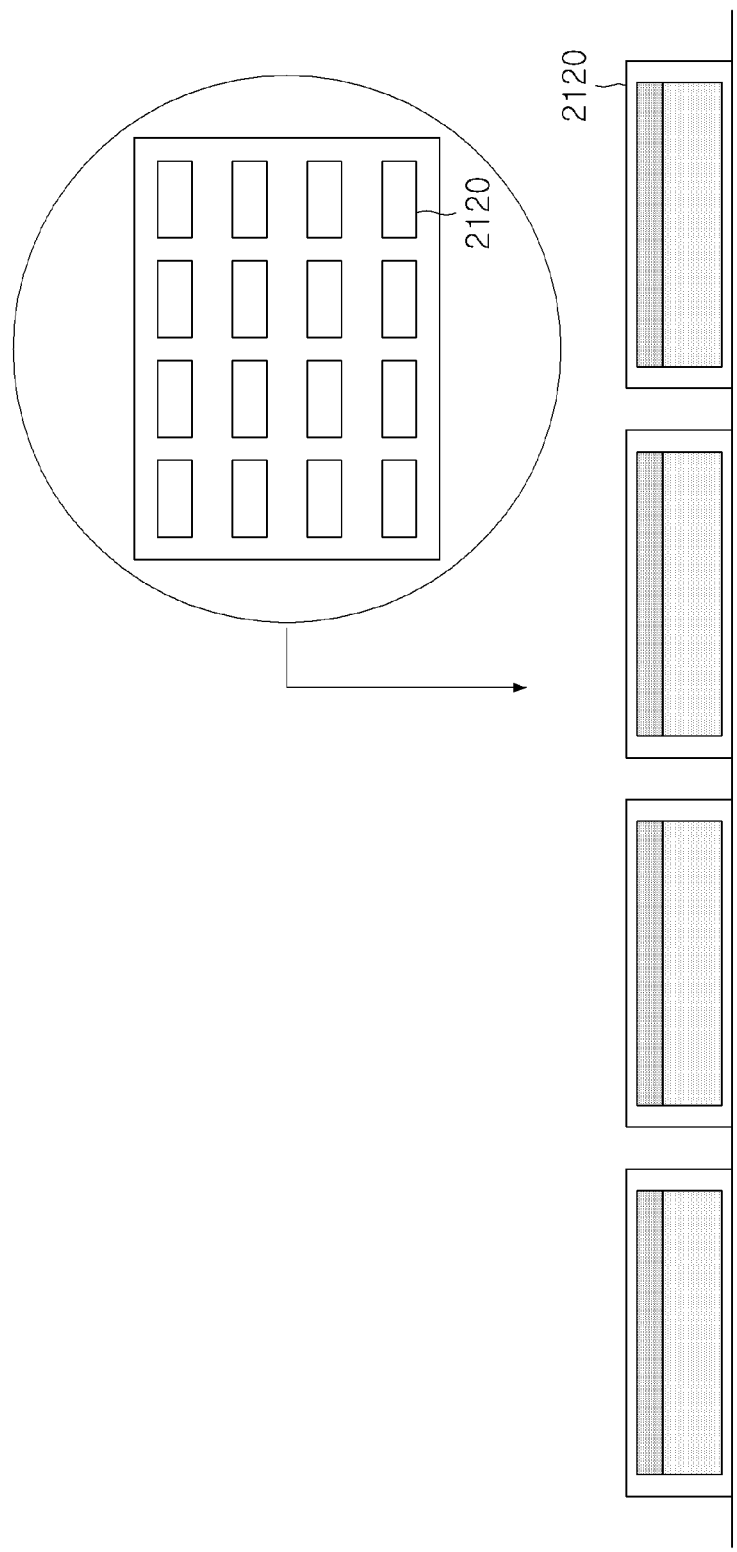
FIGS. 22A to 22E are diagrams for describing a method for manufacturing the light emitting device package of FIG. 21.
Figure 22B:
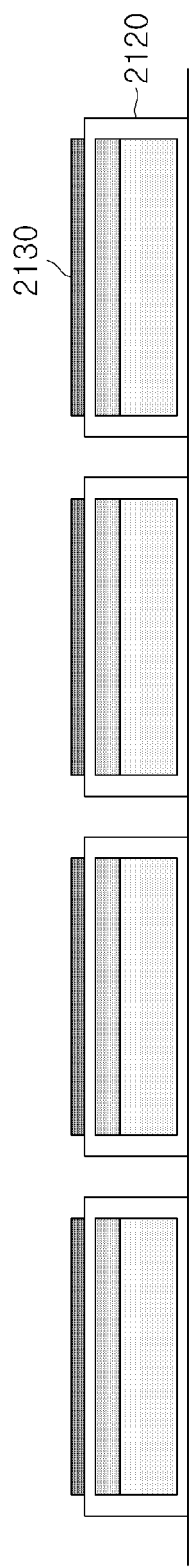
Figure 22C:
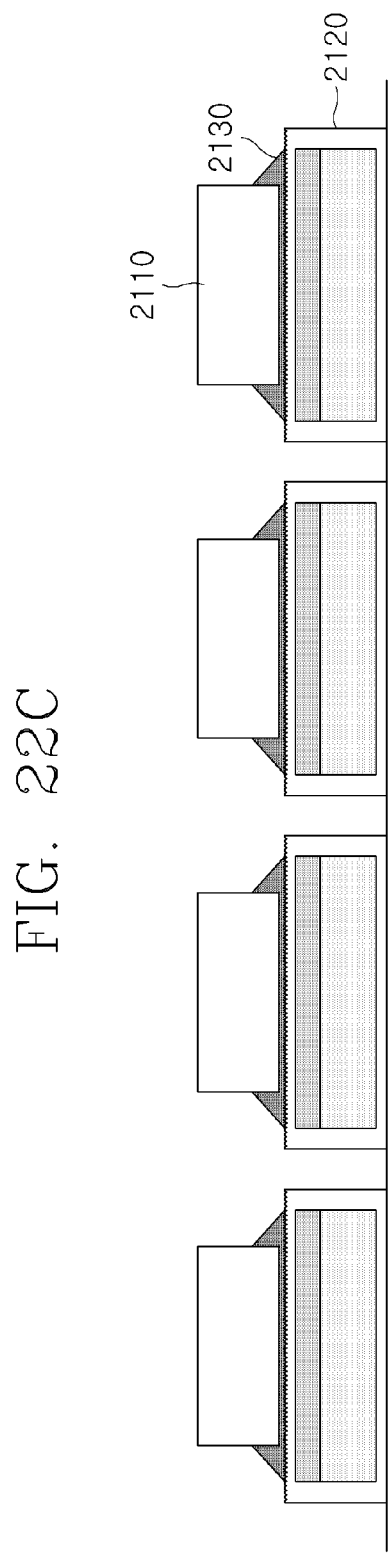
Figure 22D:
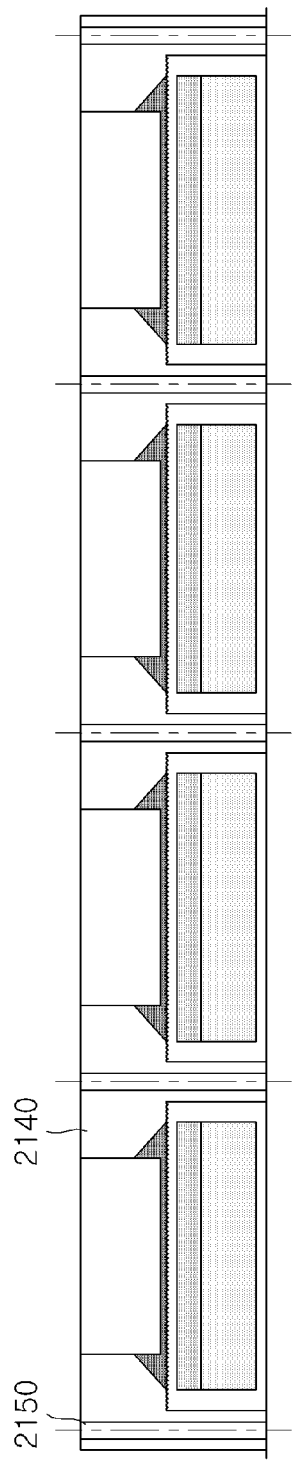
Figure 22E:
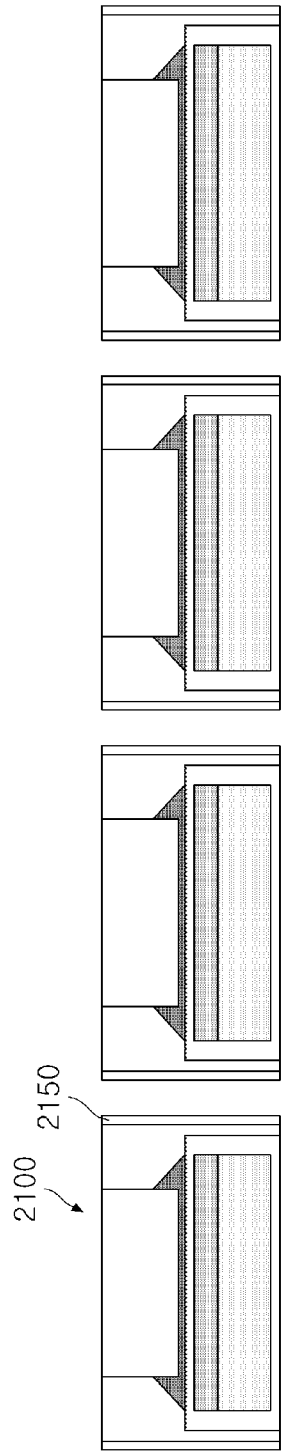

FIG. 21 is a cross-sectional view of a light emitting device package according to another exemplary embodiment of the present invention.

Referring to FIG. 21, a light emitting device package 2100 according to another exemplary embodiment of the present invention may include a light emitting device 2110, a quantum dot plate assembly 2120 on the light emitting device 2110, an adhesive layer 2130 between the light emitting device 2110 and the quantum dot plate assembly 2120, a molding member 2140 surrounding the light emitting device 2110 and the quantum dot plate assembly 2120, and a reflection member 2150 disposed on the side of the molding member 2140.

The light emitting device 2110 may include a substrate, a first conductive semiconductor layer below the substrate, an active layer below the first conductive semiconductor layer, a second conductive semiconductor layer below the active layer, a second conductive metal layer below the second conductive semiconductor layer, and a first conductive metal layer below the first conductive semiconductor layer. The light emitting device 2110 may be a flip chip type light emitting device. The light emitting device 2110 may emit light of different wavelengths depending on the composition ratio of the compound semiconductor.

The quantum dot plate assembly 2120 may include a wavelength converting unit 2160 and a light transmitting plate body sealing the wavelength converting unit 2160.

The light transmitting plate body may have an empty portion formed therein, and the wavelength converting unit 2160 disposed in the empty portion may be sealed so as not to be exposed to the external environment.

The light transmitting plate body may include a lower light transmitting plate 2125, a plurality of side light transmitting plates 2126 formed on the upper surface of the lower light transmitting plate 2125, and an upper light transmitting plate 2127 corresponding to the upper surface of the lower light transmitting plate 2125 and formed on the upper surfaces of the plurality of side light transmitting plates 2126.

An empty portion for accommodating the wavelength converting unit 2160 may be formed inside the light transmitting plate body. The empty portion may be in the vacuum state.

A region where the upper surfaces of the plurality of side light transmitting plates 2126 and the lower surface of the upper light transmitting plate 2127 meet each other is welded with the femto laser beam to seal a first wavelength converting layer 2121 and a second wavelength converting layer 2123 in the empty portion of the light transmitting plate body.

The wavelength converting unit 2160 may convert the wavelength of the light emitted from the light emitting device 2110. As an example, the wavelength converting unit 2160 may convert the light of the blue wavelength emitted from the light emitting device 2110 into the light of the white wavelength.

The wavelength converting unit 2160 may include the first wavelength converting layer 2121 and the second wavelength converting layer 2123 on the first wavelength converting layer 2121.

The first wavelength converting layer 2121 may include one or more bulk phosphor materials. The first wavelength converting layer 2121 may convert the light of the blue wavelength emitted from the light emitting device 2110 into a light of a predetermined wavelength.

The first wavelength converting layer 2121 may serve as a buffer that prevents the light of the blue wavelength from being directly incident on the second wavelength converting layer 2123. Accordingly, it is possible to minimize the damage to the quantum dot of the second wavelength converting layer 2123 due to the light of the blue wavelength emitted from the light emitting device 2110.

The second wavelength converting layer 2123 may include one or more quantum dot materials. The second wavelength converting layer 2123 may convert light of a predetermined wavelength emitted from the first wavelength converting layer 2121 into the light of the white wavelength. The second wavelength converting layer 2123 may have a thickness of 80 to 120 μm.

The light transmitting plate body may have a predetermined pattern formed on a surface facing the light emitting device 2110 to scatter the light emitted from the light emitting device 2110. Through such light scattering, the damage to the quantum dot may be minimized by preventing the light of the blue wavelength from being directly incident on the quantum dot of the second wavelength converting layer 2123.

The patterns formed on the lower surface of the light transmitting plate body may be a prism type pattern or an embossing type pattern and are not particularly limited thereto. The patterns may be formed through laser etching, wet etching, or dry etching.

The adhesive layer 2130 is disposed between the light emitting device 2110 and the quantum dot plate assembly 2120 to bond the light emitting device 2110 and the quantum dot plate assembly 2120. The adhesive layer 2130 may be entirely applied to the upper surface of the light emitting device 2110. Further, the adhesive layer 2130 may be made of the transparent material so that the light emitted from the light emitting device 2110 may be easily transmitted.

The adhesive layer 2130 may include a silicon resin or an epoxy resin. Further, the adhesive layer 2130 may include a light scattering agent. The light scattering agent is a material that scatters the light by using a deviation of a refractive index. As the light scattering agent, BN, $TiO_2$, $SiO_2$, and the like which have a different refractive index from the substrate of the light emitting device 2110 may be used.

The light scattering agent may scatter the light of the blue wavelength emitted from the light emitting device 2110. Through such light scattering, the damage to the quantum dot may be minimized by preventing the light of the blue wavelength from being directly incident on the quantum dot of the second wavelength converting layer 2123. Further, the light scattering agent may diffuse heat generated from the light emitting device 2110 and/or the wavelength converting unit 2160 to the outside.

Meanwhile, as another example, the adhesive layer may be formed by a foamed adhesive sheet containing multiple air. Since multiple air formed in the foamed adhesive sheet has a smaller refractive index (i.e., a refractive index of 1.0) than the substrate of the light emitting device 2110, the light emitted from the light emitting device 2110 may be effectively scattered. Further, the foamed adhesive sheet additionally includes the light scattering agent such as BN, $TiO_2$, SiO2, etc. to diffuse the heat generated from the light emitting device 2110 and/or the wavelength converting unit 2160 to the outside.

The molding member 2140 may be formed to surround the light emitting device 2110 and the quantum dot plate assembly 2120. The molding member 2140 may protect the light emitting device 2110 and the quantum dot plate assembly 2120 from the external environment and/or external impact. Further, the molding member 2140 may reflect the light emitted from the light emitting device 2110 in a specific direction (for example, an upward direction).

The molding member 2140 may be made of at least one of a resin material such as polyphthalamide (PPA), silicon (Si), aluminum (Al), aluminum nitride (AlN), $AlO_x$, liquid crystal polymer (photo sensitive glass (PSG)), polyimide 9T (PA9T), syndiotactic polystyrene (SPS), a metal material, sapphire ($Al_2O_3$), and beryllium oxide (BeO). As a preferred exemplary embodiment, the molding member 2140 may be made of the silicon material.

The molding member 2140 may include one or more heat transfer materials (media). The molding member 2140 may transfer the heat generated from the light emitting device 2110 through the heat transfer material toward the reflection member 2150.

The reflection member 2150 may be formed to surround the side of the molding member 2140. The reflection member 2150 supports the molding member 2140 to enhance durability of the light emitting device package 2100. Further, the reflection member 2150 may emit the heat generated from the light emitting device 2110 and/or the wavelength converting unit 2160 to the outside. The reflection member 2150 may be made of a metal material such as aluminum (Al) or silver (Ag).

Meanwhile, in the exemplary embodiment, it is exemplified that a predetermined pattern is formed on the lower surface of the light transmitting plate body and the light scattering agent is included in the adhesive layer 2130, but the present invention is not limited thereto. Therefore, when the predetermined pattern is formed on the lower surface of the light transmitting plate body, the light scattering agent may be configured not to be included in the adhesive layer 2130. Further, when the light scattering agent is included in the adhesive layer 2130, the predetermined pattern may be configured not to be formed on the lower surface of the light transmitting plate body.

Hereinabove, as described above, the light emitting device package 2100 according to the present invention may minimize the damage to the quantum dot due to the light of the blue wavelength by placing the first wavelength converting layer below the second wavelength converting layer. In addition, the light emitting device package 2100 may minimize the damage to the quantum dot due to the light of the blue wavelength by applying the light scattering agent between the quantum dot plate assembly and the light emitting device. In addition, the light emitting device package 2100 may minimize the damage to the quantum dot due to the light of the blue wavelength by forming a predetermined pattern on the lower surface of the light transmitting plate body.

FIGS. 22A to 22E are diagrams for describing a method for manufacturing the light emitting device package of FIG. 21.

Referring to FIGS. 22A to 22E, a plurality of quantum dot plate assemblies 2120 may be arranged in line or in matrix within the jig. Respective quantum dot plate assemblies 2120 may be spaced apart from each other by a predetermined distance. Here, the quantum dot plate assembly 2120 may include a wavelength converting unit and a light transmitting plate body sealing the wavelength converting unit.

An adhesive layer 2130 including the light scattering agent may be applied onto the upper surface of each quantum dot plate assembly 2120. The light emitting device 2110 may be disposed on the quantum dot plate assembly 2120 to which the adhesive layer 2130 is applied. The adhesive layer 2130 is cured under a predetermined temperature condition so as to bond the respective light emitting devices 2110 and the respective quantum dot plate assemblies 2120 corresponding thereto to each other.

When the silicon (Si) material is used in the adhesive layer 2130, low temperature silicon is applied onto each quantum dot plate assembly 2120, each light emitting device 2110 is disposed thereon, and the corresponding silicon is cured under a predetermined temperature condition (for example, a temperature condition of 150° C. or lower) to bond each quantum dot plate assembly 2120 and each light emitting device 2110. When the bonding process is completed, a plurality of reflection members 2150 may be arranged between the quantum dot plate assembly 2120 and the adjacent quantum dot plate assembly 2120. Thereafter, the molding member 2140 may be filled between the respective reflection members 2150 to surround the plurality of quantum dot plate assemblies 2120 and the plurality of light emitting devices 2110 using the silicon injecting device. The molding member 2140 may be filled up to the uppermost end of each light emitting device 2110 such that only the first and second conductive metal layers of each light emitting device 2110 are exposed to the outside. When a predetermined time has elapsed under a predetermined temperature condition (for example, a condition of 100° C. or lower), the molding member 2140 is solidly cured.

The light emitting structure formed thus may be separated into the unit package regions through the package separating process. The plurality of light emitting device packages 2100 may be manufactured through the package separating process. The plurality of light emitting device packages 2100 may be used in the upside down fashion such that the light emitting device 2110 is positioned in the downward direction and the quantum dot plate assembly 2120 is positioned in the upward direction.

Figure 23A:
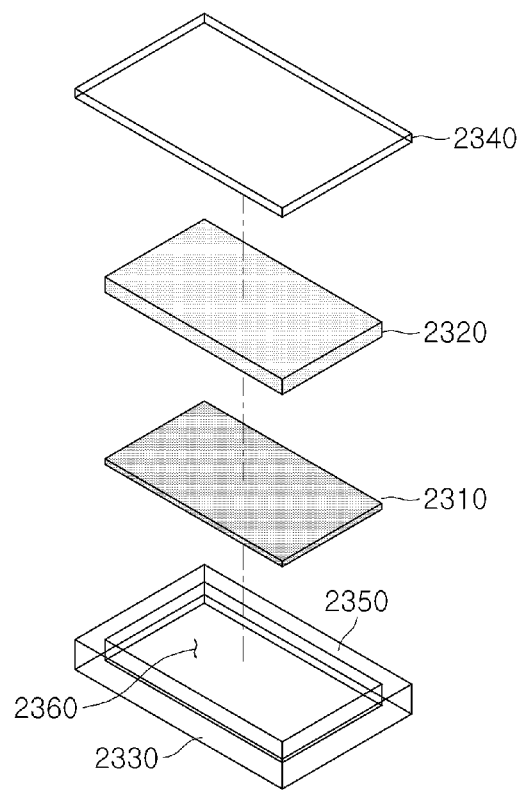
FIGS. 23A and 23B are a diagram illustrating a configuration of a quantum dot plate assembly included in the light emitting device package of FIG. 21.
Figure 23B:
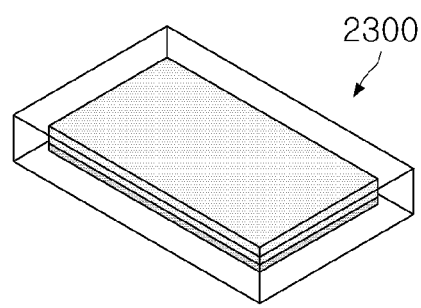

FIGS. 23A and 23B are a diagram illustrating a configuration of a quantum dot plate assembly included in the light emitting device package of FIG. 21.

Referring to FIGS. 23A and 23B, a quantum dot plate assembly 2300 according to an exemplary embodiment of the present invention may include a wavelength converting unit and a light transmitting plate body sealing the wavelength converting unit.

The wavelength converting unit may include a first wavelength converting layer 2310 and a second wavelength converting layer 2320 on the first wavelength converting layer 2310.

The first wavelength converting layer 2310 may include one or more bulk phosphor materials. The first wavelength converting layer 2310 may convert the light of the blue wavelength emitted from the light emitting device into light of a predetermined wavelength. The first wavelength converting layer 2310 may serve as the buffer that prevents the light of the blue wavelength from being directly incident on the second wavelength converting layer 2320.

The second wavelength converting layer 2320 may include one or more quantum dot (QD) materials. The second wavelength converting layer 2320 is disposed above the first wavelength converting layer 2320 to convert light of a predetermined wavelength emitted from the first wavelength converting layer 2320 into the light of the white wavelength.

The QD material as a color light conversion material including quantum dots may be formed by mixing or dispersing the quantum dots in a matrix material such as acrylate or epoxy polymer or a combination thereof.

The first and second wavelength converting layers 2310 and 2320 may be formed in a sheet type or a resin type. The first and second wavelength converting layers 2310 and 2320 may made of various combinations of composition materials according to a usage of the light emitting device package.

Table 1 below is a table showing combinations of composition materials constituting the first wavelength converting layer 2310 and the second wavelength converting layer 2320. As shown in Table 1, as an exemplary embodiment, the first wavelength converting layer 2310 may include a red phosphor material and a green phosphor material and the second wavelength converting layer 2320 corresponding thereto may include a red quantum dot material and a green quantum dot material. As another exemplary embodiment, the first wavelength converting layer 2310 may include the red phosphor material and the second wavelength converting layer 2320 corresponding thereto may include the red quantum dot material, the green quantum dot material, and the green phosphor material. As yet another exemplary embodiment, the first wavelength converting layer 2310 may include the green phosphor material and the second wavelength converting layer 2320 corresponding thereto may include the red quantum dot material, the green quantum dot material, and the red phosphor material. Meanwhile, besides, it will be apparent to those skilled in the art that the first wavelength converting layer 2310 and the second wavelength converting layer 2320 may be made of various combinations of composition materials.

TABLE 1

|  | First exemplary embodiment | Second exemplary embodiment | Third exemplary embodiment |
| --- | --- | --- | --- |
| First wavelength converting layer | Red PH + Green PH | Red PH | Green PH |
| Second wavelength converting layer | Red QD + Green QD | Red QD + Green QD + Green PH | Red QD + Green QD + Red PH |

The light transmitting plate body may include a lower light transmitting plate 2330, a plurality of side light transmitting plates 2350 formed on the upper surface of the lower light transmitting plate 2330, and an upper light transmitting plate 2340 corresponding to the upper surface of the lower light transmitting plate 2330 and formed on the upper surfaces of the plurality of side light transmitting plates 2350.

An empty portion 2360 for accommodating the first and second wavelength converting layers 2310 and 2320 may be formed inside the light transmitting plate body. The empty portion may be in the vacuum state.

A method for forming the empty portion 2360 and the side light transmitting plates 2350 on the upper surface of the lower light transmitting plate 2330 generally includes three processes, i.e., a mechanical processing process, a chemical processing process, and an assembly process.

The overall shape of the lower light transmitting plate 2330 may be formed by the thin plate shape and is not particularly limited thereto. Further, the lower light transmitting plate 2330 may be formed to have the uniform thickness.

The overall shape of the empty portion 2360 may be formed by the same or similar shape as the outer shape of the lower light transmitting plate 2330, but is not particularly limited thereto. The empty portion 2360 may be formed to have the uniform thickness. Further, the empty portion 2360 may be formed to have a thickness corresponding to the thickness of the side light transmitting plate 2350.

The plurality of side light transmitting plates 2350 may be formed to surround the empty portion 2360 along the top edge region of the upper surface of the lower light transmitting plate 2330. As an example, the side light transmitting plates 2350 may have a rectangular annular shape.

Figure 24A:
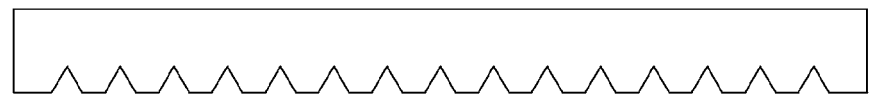
FIGS. 24A and 24B are a diagram illustrating shapes of patterns formed on a lower surface of the quantum dot plate assembly of FIGS. 23A and 23B.
Figure 24B:

A plurality of patterns for scattering the light emitted from the light emitting device may be formed on the lower surface of the lower light transmitting plate 2330. The plurality of patterns may be the prism type pattern illustrated in FIG. 24A. Further, the plurality of patterns may be the embossing type pattern illustrated in FIG. 24B.

The upper light transmitting plate 2340 is disposed on the upper portions of the side light transmitting plates 2350 to cover the first and second wavelength converting layers 2310 and 2320 which are present in the empty portion 2360.

A region where the upper light transmitting plate 2340 and the plurality of side light transmitting plates 2350 meet each other is welded with the femto laser beam to form the quantum dot plate assembly 2300. Through such laser glass welding, the first and second wavelength converting layers 2310 and 2320 may be sealed in the empty space (i.e., empty portion) 2360 between the lower light transmitting plate 2330, the upper light transmitting plate 2340, and the side light transmitting plate 2350.

The upper light transmitting plate 2340 may include a contact portion which meets the upper portions of the side light transmitting plates 2350 and a flat portion corresponding to the empty portion 2360.

The overall shape of the upper light transmitting plate 2340 may be formed by the thin plate shape and is not particularly limited thereto. The upper light transmitting plate 2340 may be formed to have the uniform thickness.

The upper light transmitting plate 2340 may be formed to have the same shape and size as the lower light transmitting plate 2330. The lower surface of the upper light transmitting plate 2340 and the upper surfaces of the plurality of side light transmitting plates 2350 are formed to have high flatness, so that bonding rate due to laser welding may be enhanced. As an example, the upper light transmitting plate 2340 and the plurality of side light transmitting plates 2350 may have flatness of 1 micrometer ($\mu m$) or less.

The quantum dot plate assembly 2300 including the first wavelength converting layer 2310, the second wavelength converting layer 2320, the lower light transmitting plate 2330, the upper light transmitting plate 2340, and the side light transmitting plates 2350 is disposed on a light emitting device (not illustrated) to effectively convert the wavelength of the light emitted from the light emitting device. Further, in the quantum dot plate assembly 2300, the first wavelength converting layer 2310 is disposed below the second wavelength converting layer 2320 to minimize the damage to the quantum dot due to the light of the blue wavelength emitted from the light emitting device.

FIGS. 25A to 25F are diagrams for describing a method for manufacturing the quantum dot plate assembly of FIGS. 23A and 23B.

Figure 25A:
FIGS. 25A to 25F are diagrams for describing a method for manufacturing the quantum dot plate assembly of FIGS. 23A and 23B.
Figure 25B:
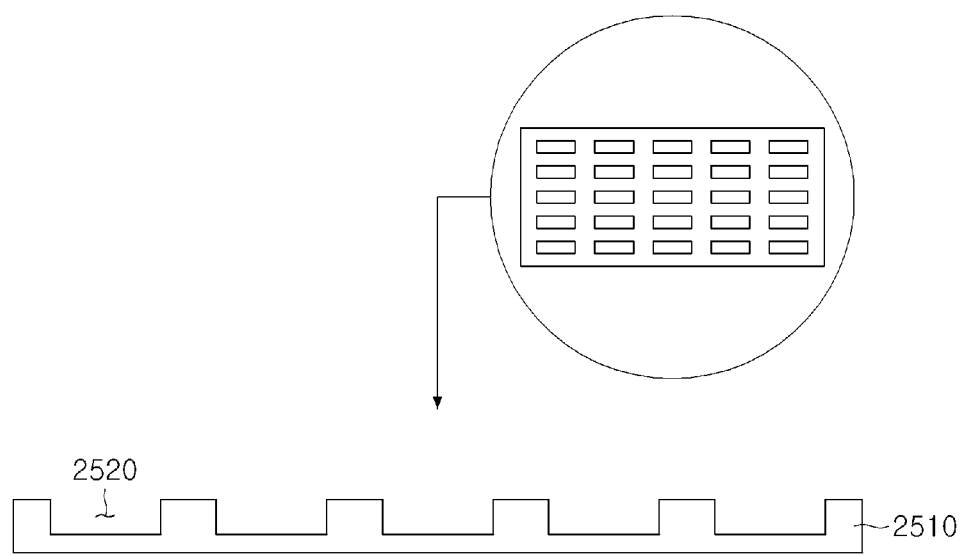
Figure 25C:
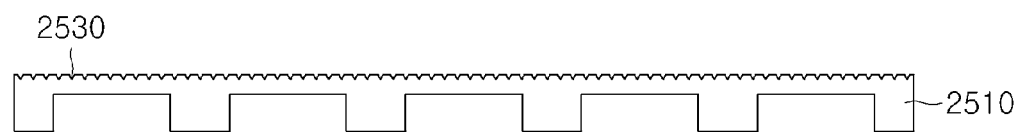

Referring to FIGS. 25A to 25C, a first glass plate (or a lower light transmitting plate) 2510 having a predetermined size and thickness may be created. The first glass plate 2510 may have a plate shape having a predetermined shape (e.g., a rectangular shape or a square shape).

A plurality of empty portions 2520 may be formed on the upper surface of the first glass plate 2510. The plurality of empty portions 2520 may be formed to be arranged on the upper surface of the first glass plate 2510 in a matrix form. Respective empty portions 2520 may be formed to be placed at a predetermined interval. Further, the respective empty portions 2520 may be formed to have the same shape and size.

Prism type patterns 2530 may be formed on the lower surface of the first glass plate 2510. The patterns 2530 may be formed through laser etching, wet etching, or dry etching.

Figure 25D:
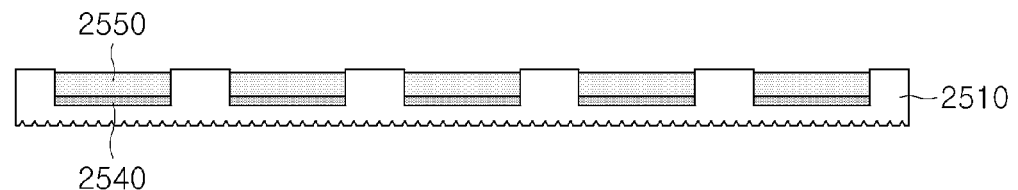

Referring to FIG. 25D, the first glass plate 2510 of which the trench process and the pattern process are completed is moved to the inside of the chamber and then, the air in the chamber is discharged to the outside to vacuum the inside of the chamber.

In such a vacuum condition, a bulk phosphor 2540 may be injected into the empty portions 2520 formed on the upper surface of the first glass plate 2510 by using a phosphor injection device (not illustrated). In this case, the first wavelength converting layer configured by the bulk phosphor 2540 may have a thickness of 100 $\mu m$ or less.

Thereafter, a QD phosphor 2550 may be injected into the upper portion of the bulk phosphor 2540 by using the phosphor injection device (not illustrated). In this case, the second wavelength converting layer configured by the QD phosphor 2550 may have a thickness of 80 to 120 μm. Since the bulk phosphor 2540 and the QD phosphor 2550 are generally in the sol state, the bulk phosphor 2540 and the QD phosphor 2550 are filled in the upward direction from the lower portion of each empty portion 2520. The QD phosphor 2550 may be injected up to a height equal to or slightly lower than the upper surface of the side light transmitting plate through the phosphor injection device. Further, the QD phosphor 2550 may be injected so that the sum of the heights of the first wavelength converting layer and the second wavelength converting layer is equal to or larger than the height of the light emitting device.

When the injection of both the bulk phosphor 2540 and the QD phosphor 2550 is completed, the temperature inside the chamber is raised up to a predetermined temperature to solidly cure the phosphors 2540 and 2550 injected into the plurality of empty portions 2520. As a result, the bulk phosphor 2540 and the QD phosphor 2550 correspond to the shape of the empty portion 2520.

Figure 25E:
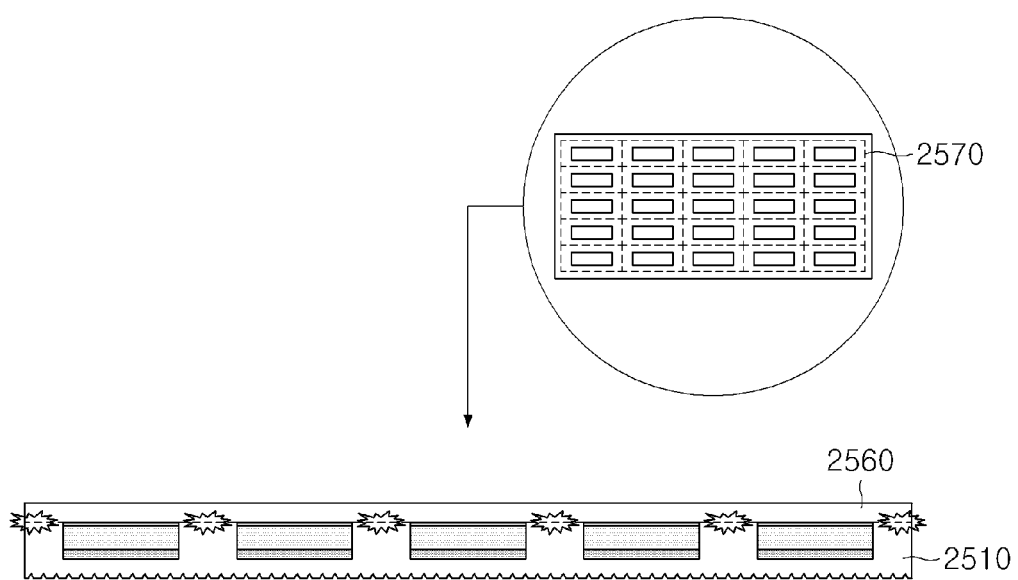

Referring to FIG. 25E, a second glass plate (or an upper light transmitting plate) 2560 having the same shape and size as the first glass plate 2510 may be created. Similarly, the second glass plate 2560 may have the plate shape having the predetermined shape (e.g., the rectangular shape or square shape).

The second glass plate 2560 is disposed on the upper portion of the first glass plate 2510 to cover the first and second wavelength converting layers 2540 and 2550 which are present in the empty portions 2560 of the first glass plate 2510.

The first glass plate 2510 and the second glass plate 2560 are formed to have high flatness to enhance the bonding rate due to the laser welding.

While the first glass plate 2510 and the second glass plate 2560 are stacked, a femto laser beam having a predetermined wavelength may be irradiated onto the upper surface of the second glass plate 2560 in the vertical direction using a laser apparatus (not illustrated).

The laser apparatus (not illustrated) may irradiate the femto laser beam along a region (i.e., a dotted line region illustrated in FIG. 25E) 2570 where the upper surface (i.e., the upper surface of the side light transmitting plate) of the first glass plate 2510 and the lower surface of the second glass plate 2560 meet each other. A glass region to which the femto laser beam is irradiated is melted at a high temperature (e.g., 2000 to 3000° C.) to bond the first glass plate 2510 and the second glass plate 2560.

Through such a laser glass welding, the first and second wavelength converting layers 2540 and 2550 may be sealed in the plurality of empty portions 2520 which is present between the first glass plate 2510 and the second glass plate 2560.

Figure 25F:
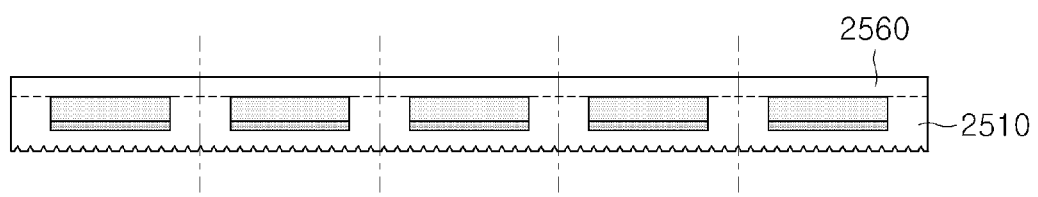

Referring to FIG. 25F, when welding the laser glass is completed, a boundary portion between the respective empty portions 2520 may be cut in the vertical direction to the upper surface of the second glass plate 2560 by using a cutting device (not illustrated). A plurality of quantum dot plate assemblies may be manufactured through such a cutting process.

Figure 26:
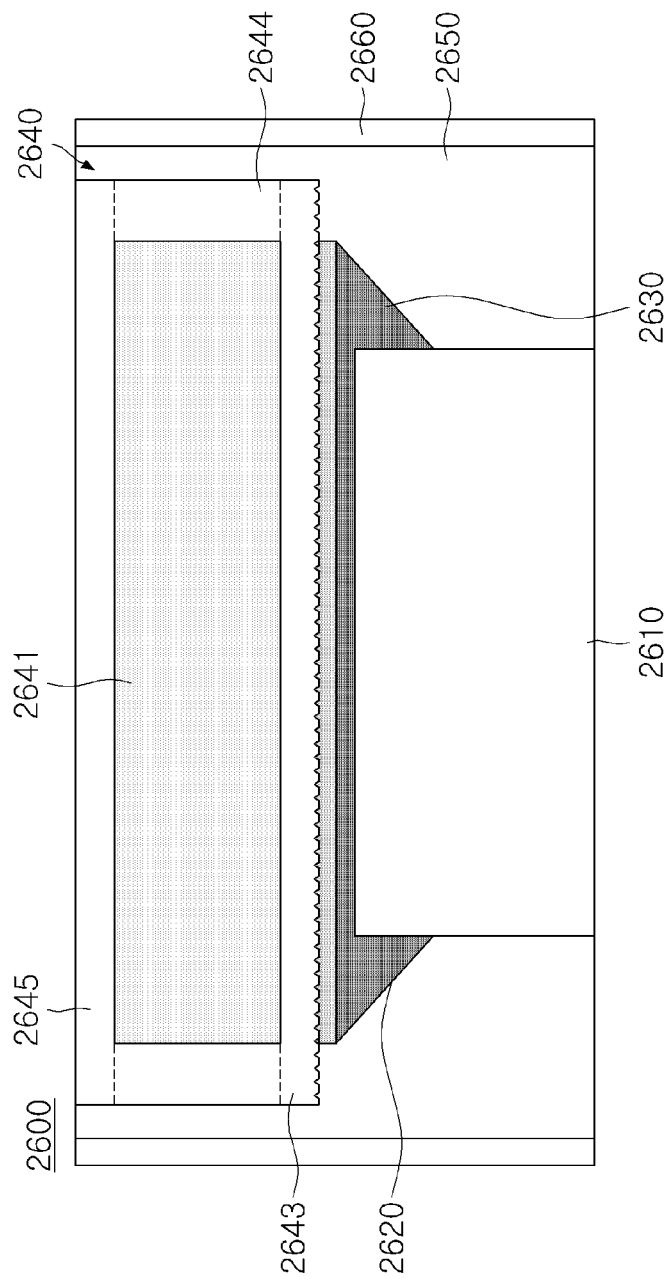
FIG. 26 is a cross-sectional view of a light emitting device package according to yet another exemplary embodiment of the present invention.

FIG. 26 is a cross-sectional view of a light emitting device package according to yet another exemplary embodiment of the present invention.

Referring to FIG. 26, a light emitting device package 2600 according to yet another exemplary embodiment of the present invention may include a light emitting device 2610, an adhesive layer 2620 on the light emitting device 2610, a first wavelength converting layer 2630 on the adhesive layer 2620, a quantum dot plate assembly 2640 on the first wavelength converting layer 2630, a molding member 2650 surrounding the light emitting device 2610 and the quantum dot plate assembly 2640, and a reflection member 2660 disposed on the side of the molding member 2650. Since the light emitting device 2610, the molding member 2650, and the reflection member 2660 are the same as the light emitting device 2110, the molding member 2140, and the reflection member 2150 of the light emitting device package 2100 described above in FIG. 21, a detailed description thereof will be omitted.

The adhesive layer 2620 is disposed between the light emitting device 2610 and the first wavelength converting layer 2630 to bond the light emitting device 2610 and the first wavelength converting layer 2630. The adhesive layer 2620 may be entirely applied to the upper surface of the light emitting device 2610. Further, the adhesive layer 2620 may be made of the transparent material so that the light emitted from the light emitting device 2610 may be easily transmitted.

The adhesive layer 2620 may include a silicon resin or an epoxy resin. Further, the adhesive layer 2620 may include a light scattering agent. The light scattering agent is a material that scatters the light by using a deviation of a refractive index.

The light scattering agent may scatter the light of the blue wavelength emitted from the light emitting device 2610. Through such light scattering, the damage to the quantum dot may be minimized by preventing the light of the blue wavelength from being directly incident on the quantum dot of the second wavelength converting layer 2641. Further, the light scattering agent may diffuse heat generated from the light emitting device 2610 and/or the quantum dot plate assembly 2640 to the outside.

The first wavelength converting layer 2630 may be disposed between the adhesive layer 2620 and the quantum dot plate assembly 2640. The first wavelength converting layer 2630 may be formed by a phosphor film or a phosphor sheet. The first wavelength converting layer 2630 may include one or more bulk phosphor materials. The first wavelength converting layer 2630 may convert the light of the blue wavelength emitted from the light emitting device 2610 into light of a predetermined wavelength.

The first wavelength converting layer 2630 may serve as a buffer that prevents the light of the blue wavelength from being directly incident on the second wavelength converting layer 2641. Accordingly, it is possible to minimize the damage to the quantum dot of the second wavelength converting layer 2641 due to the light of the blue wavelength emitted from the light emitting device 2610.

The quantum dot plate assembly 2640 is disposed on the first wavelength converting layer 2630 to convert the wavelength of the light emitted from the first wavelength converting layer 2630.

The quantum dot plate assembly 2640 may include the second wavelength converting unit 2641 and a light transmitting plate body sealing the second wavelength converting unit 2641.

The light transmitting plate body may have an empty portion formed therein, and the second wavelength converting layer 2641 disposed in the empty portion may be sealed so as not to be exposed to the external environment.

The light transmitting plate body may include a lower light transmitting plate 2643, a plurality of side light transmitting plates 2644 formed on the upper surface of the lower light transmitting plate 2643, and an upper light transmitting plate 2645 corresponding to the upper surface of the lower light transmitting plate 2643 and formed on the upper surfaces of the plurality of side light transmitting plates 2644.

An empty portion for accommodating the second wavelength converting layer 2641 may be formed inside the light transmitting plate body. The empty portion may be in the vacuum state.

A region where the upper surfaces of the plurality of side light transmitting plates 2644 and the lower surface of the upper light transmitting plate 2645 meet each other is welded with the femto laser beam to seal the second wavelength converting layer 2641 in the empty portion of the light transmitting plate body.

The second wavelength converting layer 2641 may include one or more quantum dot materials. The second wavelength converting layer 2641 may convert light of a predetermined wavelength emitted from the first wavelength converting layer 2630 into the light of the white wavelength.

The light transmitting plate body may have a predetermined pattern formed on a surface facing the first wavelength converting layer 2630 to scatter the light emitted from the first wavelength converting layer 2630. Through such light scattering, the damage to the quantum dot may be minimized by preventing the light of the blue wavelength from being directly incident on the quantum dot of the second wavelength converting layer 2641.

The molding member 2650 may be formed to surround the light emitting device 2610 and the quantum dot plate assembly 2640. The molding member 2650 may protect the light emitting device 2610 and the quantum dot plate assembly 2640 from the external environment and/or external impact.

The reflection member 2660 may be formed to surround the side of the molding member 2650. Further, the reflection member 2660 may emit the heat generated from the light emitting device 2610 and the quantum dot plate assembly 2640 to the outside.

Hereinabove, as described above, the light emitting device package 2600 according to the present invention may minimize the damage to the quantum dot due to the light of the blue wavelength by placing the first wavelength converting layer below the quantum dot plate assembly. In addition, the light emitting device package 2600 may minimize the damage to the quantum dot due to the light of the blue wavelength by applying the light scattering agent between the first wavelength converting layer and the light emitting device.

Figure 27:
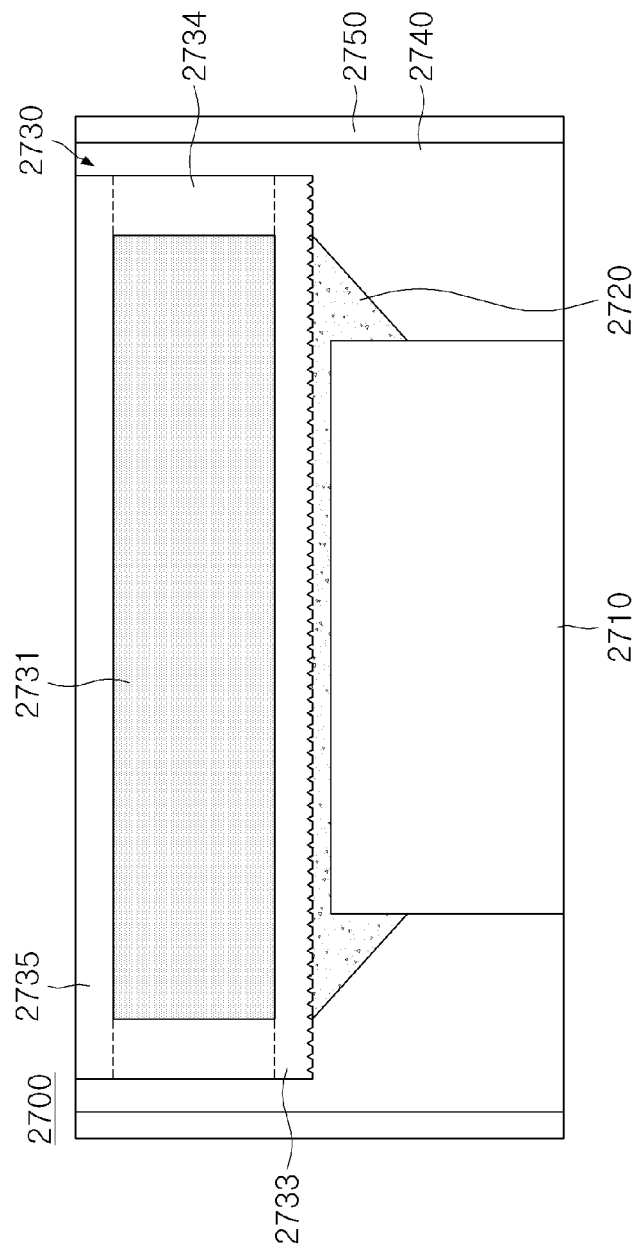
FIG. 27 is a cross-sectional view of a light emitting device package according to still yet another exemplary embodiment of the present invention.

FIG. 27 is a cross-sectional view of a light emitting device package according to still yet another exemplary embodiment of the present invention.

Referring to FIG. 27, a light emitting device package 2700 according to another exemplary embodiment of the present invention may include a light emitting device 2710, a first wavelength converting layer 2720 on the light emitting device 2710, a quantum dot plate assembly 2730 on the first wavelength converting layer 2720, a molding member 2740 surrounding the light emitting device 2710 and the quantum dot plate assembly 2730, and a reflection member 2750 disposed on the side of the molding member 2740. Since the light emitting device 2710, the molding member 2740 and the reflection member 2750 are the same as the light emitting device 2110, the molding member 2140 and the reflection member 2150 of the light emitting device package 2100 described in FIG. 21, a detailed description thereof will be omitted.

The first wavelength converting layer (or adhesive layer) 2720 may be disposed between the light emitting device 2710 and the quantum dot plate assembly 2730 to adhere the quantum dot plate assembly 2730 to the light emitting device 2710. The first wavelength converting layer 2720 may be entirely applied to the upper surface of the light emitting device 2710. In addition, the first wavelength converting layer 2720 may be formed of a transparent material so that light emitted from the light emitting device 2710 can be easily transmitted.

The first wavelength converting layer 2720 may include a silicon resin or an epoxy resin. In addition, the first wavelength converting layer 2720 may include a light scattering agent. The light scattering agent is a material that scatters light using a deviation of a refractive index.

The light scattering agent may scatter blue wavelength light emitted from the light emitting device 2710. Through such light scattering, the damage to the quantum dot may be minimized by preventing the blue wavelength light from being directly incident on the quantum dot of the second wavelength converting layer 2731. Further, the light scattering agent may diffuse heat generated from the light emitting device 2710 and/or the quantum dot plate assembly 2730 to the outside.

The first wavelength converting layer 2720 may include one or more bulk phosphor materials. The first wavelength converting layer 2720 may convert the blue wavelength light emitted from the light emitting device 2710 into light having a predetermined wavelength through the bulk phosphor material.

The first wavelength converting layer 2720 may function as a buffer to prevent the blue wavelength light from being directly incident on the second wavelength converting layer 2731. Accordingly, it is possible to minimize the damage to the quantum dot of the second wavelength converting layer 2731 due to the blue wavelength light emitted from the light emitting device 2710.

The quantum dot plate assembly 2730 may be disposed on the first wavelength converting layer 2720 to convert a wavelength of light emitted from the first wavelength converting layer 2720.

The quantum dot plate assembly 2730 may include a second wavelength converting layer 2731 and a light transmitting plate body for sealing the second wavelength converting layer 2731.

The light transmitting plate body has an empty portion formed therein, and the second wavelength converting layer 2731 disposed in the empty portion may be sealed so as not to be exposed to the external environment.

The light transmitting plate body may include a lower light transmitting plate 2733, a plurality of side light transmitting plates 2734 formed on the upper surface of the lower light transmitting plate 2733, and an upper light transmitting plate 2735 corresponding to the upper surface of the lower light transmitting plate 2733 and formed on the upper surfaces of the plurality of side light transmitting plates 2734.

An empty portion for accommodating the second wavelength converting layer 2341 may be formed on the inner side of the light transmitting plate body. The empty portion may be in a vacuum state.

The second wavelength converting layer 2731 may be sealed in the empty portion of the light transmitting plate body by welding an area where the upper surface of the plurality of side light transmitting plates 2734 and the lower surface of the upper light transmitting plate 2735 meet each other with a femto laser beam.

The second wavelength converting layer 2731 may include one or more quantum dot materials. The second wavelength converting layer 2731 may convert light of a predetermined wavelength emitted from the first wavelength converting layer 2720 into light of a white wavelength.

A predetermined pattern is formed on the surface of the light transmitting plate body facing the first wavelength converting layer 2720 to scatter light emitted from the first wavelength converting layer 2720. Through such light scattering, the damage to the quantum dot may be minimized by preventing the light of the blue wavelength from being directly incident on the quantum dot of the second wavelength converting layer 2731.

The molding member 2740 may be formed to surround the light emitting device 2710 and the quantum dot plate assembly 2730. The molding member 2740 may protect the light emitting device 2710 and the quantum dot plate assembly 2730 from an external environment and/or an external impact.

The reflection member 2750 may be formed to surround the side surface of the molding member 2740. Further, the reflection member 2750 may emit the heat generated from the light emitting device 2710 and/or the quantum dot plate assembly 2730 to the outside.

As described above, the light emitting device package 2700 according to the present invention may minimize damage to the quantum dot due to the light of the blue wavelength by disposing the first wavelength converting layer including the bulk phosphor materials between the light emitting device and the quantum dot plate assembly. In addition, the light emitting device package 700 may minimize the damage to the quantum dot due to the light of the blue wavelength by disposing the first wavelength converting layer including the light scattering agent between the light emitting device and the quantum dot plate assembly.

Figure 28:
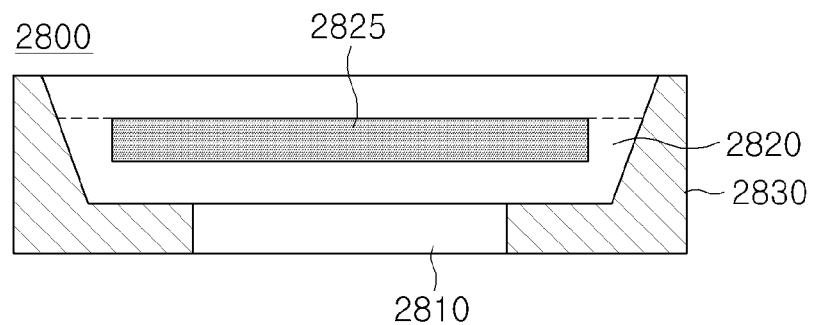
FIG. 28 is a cross-sectional view of a light emitting device package according to still yet another exemplary embodiment of the present invention.

FIG. 28 is a cross-sectional view of a light emitting device package according to still yet another exemplary embodiment of the present invention.

Referring to FIG. 28, a light emitting device package 2800 according to the present invention may include a light emitting device 2810, a QD plate assembly 2820 on the light emitting device 2810, and a reflector 2830 surrounding the light emitting device 2810 and the QD plate assembly 2820.

The light emitting device 2810 is a configuration for emitting predetermined light, and a flip chip type LED device may be representatively exemplified. The light emitting device 2810 may output light through the top and sides. The light emitting device 2810 may be manufactured by including a substrate, a conductive semiconductor layer, an active layer, a conductive metal layer, and the like.

The light emitting device 2810 may be adhered to the QD plate assembly 2820 through an adhesive layer (not illustrated). The adhesive layer may be applied entirely on the upper surface of the light emitting device 2810 and formed of a transparent material so that the light emitted from the light emitting device 2810 may be easily transmitted.

The lower surface of the light emitting device 2810 may include at least one electrode, and the electrode may protrude further downward than the lower surface of the reflector 2830 in a state where the reflector 2830 to be described below is formed. The light emitting device 2810 may be electrically connected to the outside through the protruding electrode.

The QD plate assembly 2820 may include a QD material 2825 that converts the wavelength of light, and a light transmitting plate body that contains the QD material 2825. A method of manufacturing the QD plate assembly 2820 will be described below.

The light transmitting plate body may include a lower light transmitting plate, a plurality of side light transmitting plates formed on the upper surface of the lower light transmitting plate, and an upper light transmitting plate formed on the upper surface of the plurality of side light transmitting plates.

Both sides of the light transmitting plate body may be formed so as to have diagonally inclined surfaces. That is, the both sides of the light transmitting plate body may be gradually widened from the bottom to the top.

The reflector 2830 may be formed to surround the QD plate assembly 2820 and the light emitting device 2810. The reflector 2830 may protect the light emitting device 2810 and the QD plate assembly 2820 from an external environment and/or an external impact. Further, the reflector 2830 may reflect light emitted from the light emitting device 2810 in a specific direction (e.g., an upward direction).

The reflector 2830 may be formed of at least one of a resin material such as polyphthalamide (PPA), silicon (Si), aluminum (Al), aluminum nitride (AlN), AlOx, liquid crystal polymer (photo sensitive glass (PSG)), polyamide 9T (PA9T), syndiotactic polystyrene (SPS), a metal material, sapphire ($Al_2O_3$), and beryllium oxide (BeO). As a preferred example, the reflector 2830 may be formed of a silicon material.

The reflector 2830 may surround the sides of the QD plate assembly 2820 and the light emitting device 2810 in correspondence with the shape of the QD plate assembly 2820 of which both sides are inclined. Accordingly, the reflector 2830 surrounding the side of the QD plate assembly 2820 has a relatively larger width of the lower portion than that of the upper portion. Accordingly, the light output from the light emitting device 2810 may be reflected by the reflector and efficiently output to the upper portion of the light emitting device package.

In addition, since the thickness of the reflector 2830 may be relatively increased as compared with the light emitting device package having the same size, the amount of light emitted to the outside through the reflector 2830 may be reduced. As a result, the amount of light output to the upper portion of the light emitting device package may be increased.

FIGS. 29A to 29E are diagrams for describing a method for manufacturing the QD plate assembly of FIG. 28.

Figure 29A:
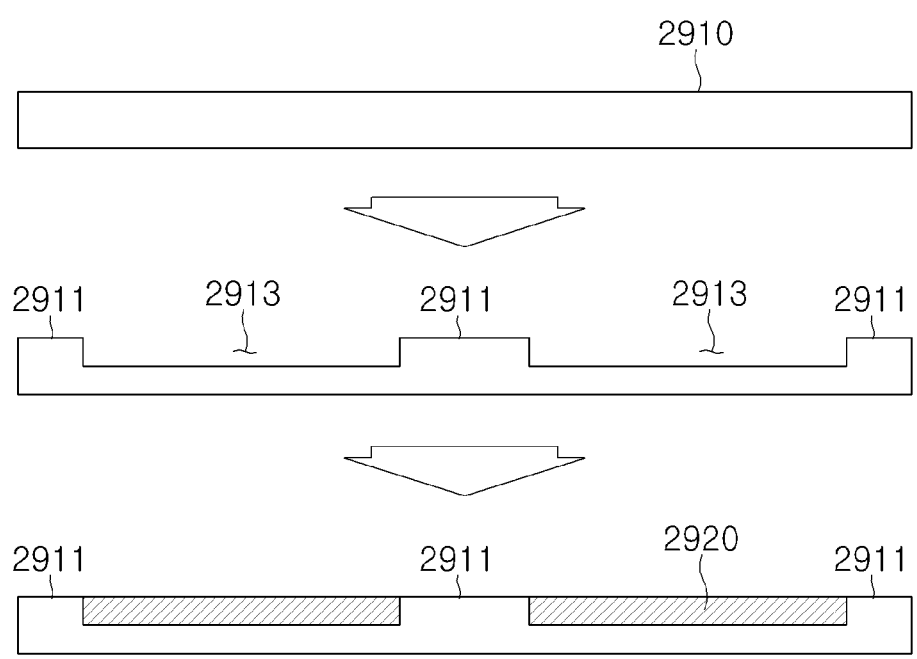
FIGS. 29A to 29E are diagrams for describing a method for manufacturing the quantum dot plate assembly of FIG. 28.

FIG. 29A is a diagram for describing providing a lower light transmitting plate 2910, forming an empty portion 2913 and a side light transmitting plate 2911 through an etching process on the lower light transmitting plate 2910, and injecting a quantum dot phosphor into the empty portion 2913.

As illustrated in FIG. 29A, the lower light transmitting plate 2910 may be provided and the empty portion 2913 and the side light transmitting plate 2911 may be formed on the lower light transmitting plate 2910. Thereafter, while the quantum dot phosphor 2920 is injected into the empty portion 2913, the lower light transmitting plate 2910 may accommodate the quantum dot phosphor 2920 through the empty portion 2913 and the side light transmitting plate 2911 surrounding the empty portion 2913.

Figure 29B:
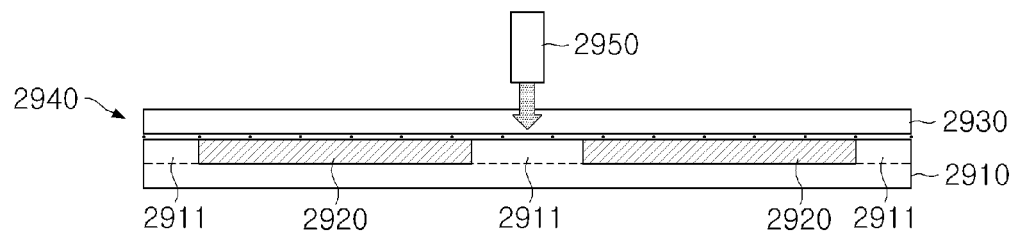

It may be understood that FIG. 29B is a diagram for describing a process of producing the light transmitting plate assembly. As shown in FIG. 29B, an upper light transmitting plate 2930 and a lower light transmitting plate 2910 may be welded by a laser device 2950 to form a light transmitting plate assembly 2940. The laser device 2950 melts and welds a point at which the upper light transmitting plate 2930 and the side light transmitting plate 2911 of the lower light transmitting plate 2910 are in contact with each other by the laser to seal the quantum dot phosphor 2920 injected into the empty portion in the previous process therein.

Figure 29C:
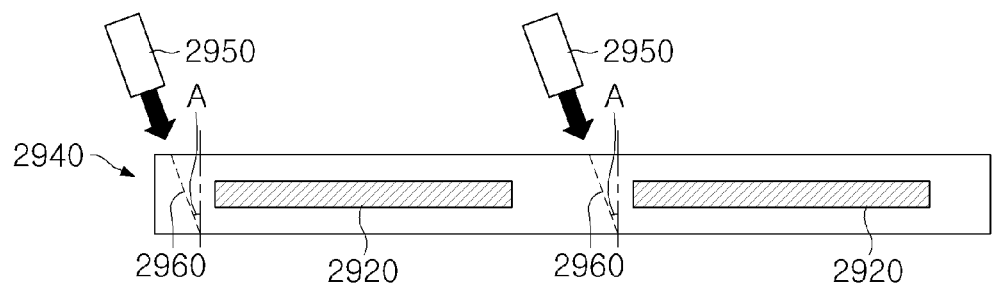
Figure 29D:
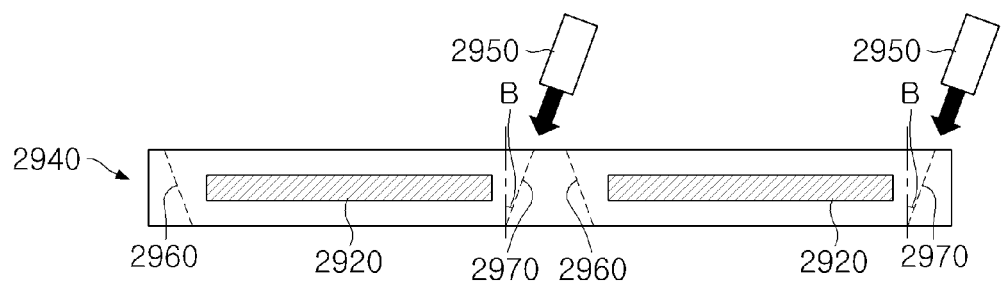

It will be understood that FIGS. 29C and 29D are diagrams for describing a process of cutting the light transmitting plate assembly. As shown in FIG. 29C, the laser device 2950 may irradiate the laser with being inclined at a predetermined angle in a direction perpendicular to the upper surface of the light transmitting plate assembly 2940. Through the process of FIG. 29C, the quantum dot plate assembly may form a first side 2960 having an inclined slope.

As illustrated in FIG. 29D, the laser device 2950 may form a second side 2970 that is opposite to the first side 2960 through irradiation of the laser. At this time, the laser device 2950 may adjust incident angles A and B to which the laser is irradiated so that the first side 2960 and the second side 2970 are formed symmetrically with respect to the quantum dot phosphor.

The incident angle A of the laser irradiated to form the first side 2960 and the incident angle B of the laser irradiated to form the second side 2970 may vary depending on the size, the use, and the like of the light emitting device package to be manufactured and may be the same as or different from each other. In the exemplary embodiment, the incident angles A and B of the laser are preferably in the range of 10 to 30°.

Through the process of cutting the light transmitting plate assembly 2940, the light transmitting plate assembly 2940 may generate a quantum dot plate assembly in which the width of the upper surface is larger than the width of the lower surface. Each quantum dot plate assembly may include a single quantum dot phosphor 2920.

The process of cutting the light transmitting plate assembly 2940 may be performed on all of four front/rear/left/right sides surrounding the quantum dot plate assembly.

Figure 29E:
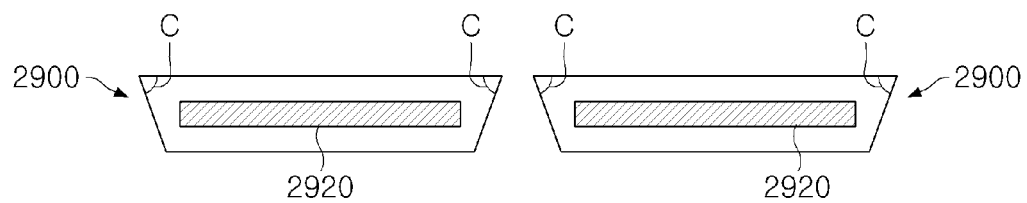

It may be understood that FIG. 29E is a diagram for describing a process of separating the light transmitting plate assembly. Referring to FIG. 29E, it can be seen that through the braking process for the light transmitting plate assembly 2940, the light transmitting plate assembly 2940 is divided into one or more quantum dot plate assemblies 2900. An internal angle C formed by the upper surface and the side of each quantum dot plate assembly 2900 may be formed to be 60° to 80° corresponding to the incident angles A and B of the laser of 10° to 30°.

Figure 30:
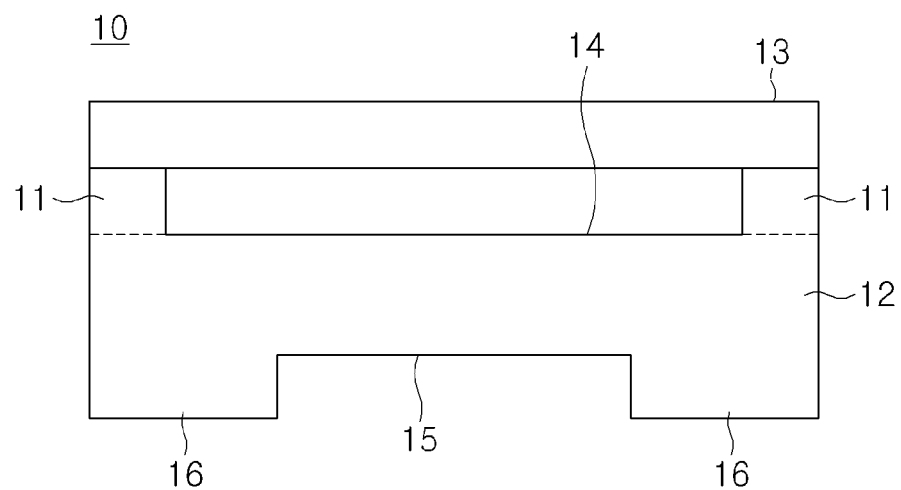
FIG. 30 is a cross-sectional view of a light transmitting plate body according to an exemplary embodiment of the present invention.

FIG. 30 is a cross-sectional view of a light transmitting plate body according to an exemplary embodiment of the present invention.

Referring to FIG. 30, a light transmitting plate body 10 according to an exemplary embodiment of the present invention may include a side light transmitting plate 11, a lower light transmitting plate 12, and an upper light transmitting plate 13.

The light transmitting plate body 10 includes a lower light transmitting plate 12 of which an insertion groove into which a part of the light emitting device is inserted is formed in a central portion of the lower surface, a plurality of side light transmitting plates 11 formed on the upper surface of the lower light transmitting plate 12, and an upper light transmitting plate 13 corresponding to the upper surface of the lower light transmitting plate 12 and formed on the upper surface of the plurality of side light transmitting plates 11 and an empty portion 14 formed therein.

The light transmitting plate body 10 may receive a QD phosphor for converting a wavelength of light emitted from the light emitting device through the empty portion 14 formed therein. The upper light transmitting plate 13 is welded to the upper portion of the empty portion 14 accommodating the QD phosphor so as to face the upper surface of the side light transmitting plate 11, thereby sealing the QD phosphor to be blocked from the outside.

The light transmitting plate body 10 may include the empty portion 14 for accommodating the QD phosphor and an insertion groove 15 for accommodating the light emitting device. Here, the empty portion 14 may be formed by at least a part of the upper surface of the lower light transmitting plate 12 and the side light transmitting plate 11 formed so as to surround a part of the upper surface of the lower light transmitting plate 12 in order to accommodate the QD phosphor.

The upper and lower surfaces of the lower light transmitting plate 12 may be formed in a predetermined shape (e.g., rectangular, square, circular, oval, etc.). The overall shape of the empty portion 14 may be formed in the same or similar shape as or to the outer shape of the lower light transmitting plate 12. The side light transmitting plate 11 may be formed to surround the empty portion 14 along the top edge portion of the light transmitting plate body 10 at the upper portion of the lower light transmitting plate 12.

The insertion groove 15 may be formed on the lower surface of the light transmitting plate body 10 (that is, the lower surface of the lower light transmitting plate 12). The insertion groove 15 may be provided with a partition wall (or a separator) 16 adjacent to the insertion groove 15 as a portion for accommodating the light emitting device below the empty portion 14. The lower surface of the lower light transmitting plate 12 may be formed to have a predetermined step between the insertion groove 15 and the partition wall 16.

The overall shape of the insertion groove 15 may be formed by the same or similar shape as or to an outer shape of the light transmitting plate body 10, but is not particularly limited thereto. The insertion groove 15 may be formed by a predetermined shape (e.g., rectangular, square, circular, oval, etc.).

The partition wall 16 may be formed to surround the insertion groove 15 along an outermost edge portion of the lower light transmitting plate 12. For example, the partition wall 16 may be formed in a rectangular annular shape.

The partition wall 16 may be provided adjacent to the insertion groove 15 closer to the center of the lower light transmitting plate 12 than the side light transmitting plate 11 so that the insertion groove 15 has a smaller area than the empty portion 14.

The insertion groove 15 may be opened downward to accommodate the light emitting device. Thus, a portion of the light emitting device corresponding to at least 50% of the height of the light emitting device may be accommodated in the insertion groove 15. The portion of the light emitting device corresponding to 50% of the height of the light emitting device from the upper surface of the light emitting device is accommodated in the insertion groove 15 and the remaining portion of the light emitting device may protrude from the lower portion of the insertion groove 15 while being accommodated. At this time, an electrode of the light emitting device may be included in the remaining region of the light emitting device protruding to the lower portion of the insertion groove 15.

The insertion groove 15 may prevent the light emitting device from flowing in the completed light emitting device package by fixing the light emitting device to be accommodated through the partition wall 16. To this end, the partition wall 16 may be formed adjacent to the insertion grooves 15 in correspondence with the size of the light emitting device to be accommodated later.

Here, the empty portion 14 is opened toward the upper portion of the light transmitting plate body 10 while being surrounded by the side light transmitting plate 11 and the insertion groove 15 may be opened toward the lower portion of the light transmitting plate body 10 while being surrounded by the partition wall 16. That is, it may be understood that the empty portion 14 and the insertion groove 15 are opened to face each other.

The upper light transmitting plate 13 may be disposed on the upper portion of the light transmitting plate body 10 to cover the QD phosphor accommodated in the empty portion 14 of the light transmitting plate body 10. The area where the side light transmitting plate 11 and the upper light transmitting plate 13 meet each other is welded with a femto laser beam to form the light transmitting plate body 10 in which the side light transmitting plate 11 and the upper light transmitting plate 13 are integrally formed. Through such laser glass welding, the QD phosphor may be sealed in the empty portion 14 which is an empty space between the lower light transmitting plate 12, the side light transmitting plate 11, and the upper light transmitting plate 13.

Figure 31:
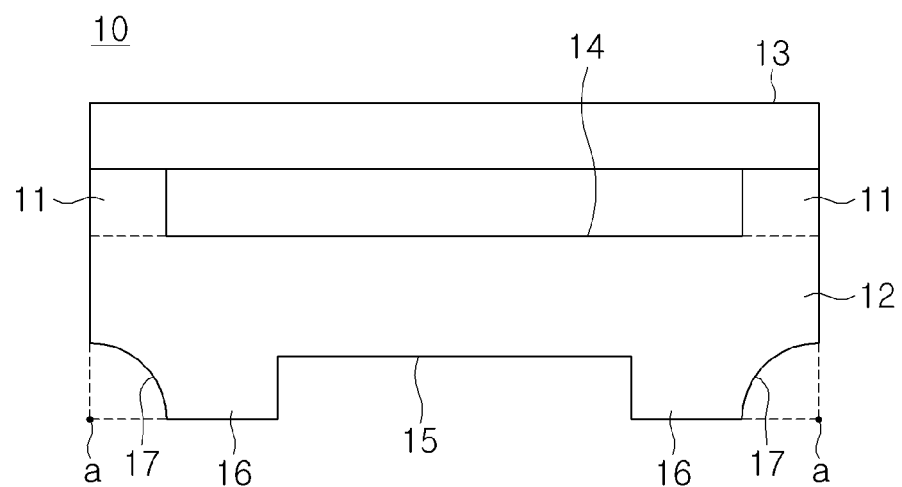
FIG. 31 is a cross-sectional view of a light transmitting plate body according to another exemplary embodiment of the present invention.

FIG. 31 is a diagram for describing the light transmitting plate body 10 according to another exemplary embodiment of the present invention. Referring to FIG. 31, unlike FIG. 30, it can be seen that a curvature portion 17 having a curvature is formed on the outer surface of the lower light transmitting plate 12. In the description of FIG. 31, the description of the configuration or effect overlapping with FIG. 30 will be omitted.

A reflector may be provided to surround the outside of the light transmitting plate body 10 in the process of manufacturing the light emitting device package. The reflector is a component for reflecting the light output from the light emitting device. The reflector functions to reflect light output from the light emitting device and irradiated through the light transmitting plate body 10 to the QD phosphor. The curvature portion 17 may be formed at the edge of the lower light transmitting plate 12 so that such a reflector more efficiently reflects the light emitted from the side of the light emitting device.

The curvature portion 17 may be formed along the outer surface of the lower end of the partition wall 16. The curvature portion 17 may have a shape protruding toward the empty portion 14. The protruding degree of the curvature portion 17 may vary depending on the size or length of the lower light transmitting plate 12 or the partition wall 16. The curvature portion 17 may be formed to have a predetermined radial length around a point a in FIG. 31, or formed in the shape of an elliptical arc having different radial lengths.

Figure 32:
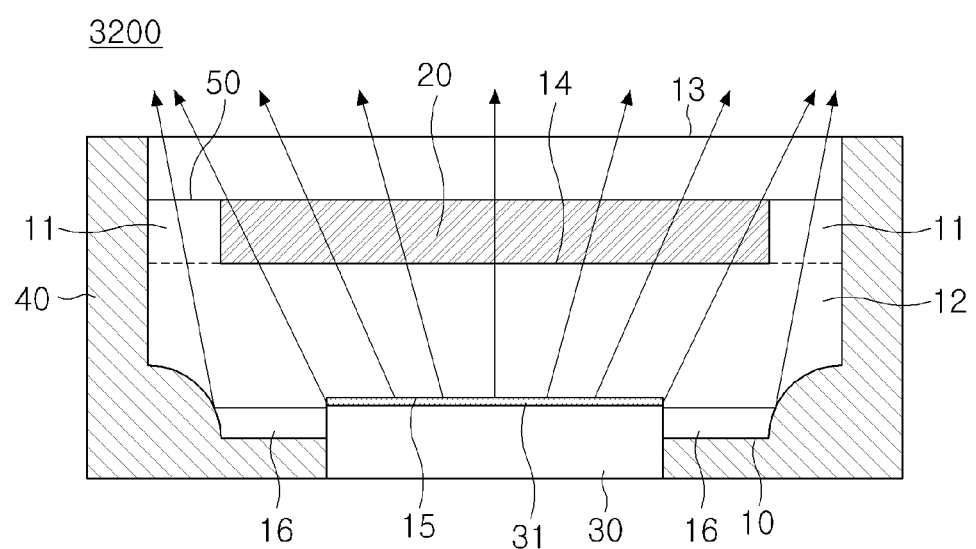
FIG. 32 is a cross-sectional view of a light emitting device package including the light transmitting plate body of FIG. 31.

FIG. 32 is a cross-sectional view of a light emitting device package including the light transmitting plate body of FIG. 31.

Referring to FIG. 32, a light emitting device package 3200 according to the present invention may include a light transmitting plate body 10, a QD phosphor 20, a light emitting device 30, and a reflector 40.

The light transmitting plate body 10 may be a configuration corresponding to the light transmitting plate body 10 described with reference to FIG. 30 or 31.

The light transmitting plate body 10 and the QD phosphor 20 are disposed on the light emitting device 30 to effectively convert the wavelength of the light emitted from the light emitting device 30. Further, the QD phosphor 20 is sealed in the empty portion 14 of the light transmitting plate body 10 to safely protect the QD phosphor vulnerable to the external environmental condition.

The light emitting device 30 is a configuration for emitting predetermined light, and a flip chip type LED chip may be representatively exemplified. The light emitting device 30 may output light through the top and sides. The light emitting device 30 may be manufactured by including a substrate, a conductive semiconductor layer, an active layer, a conductive metal layer, and the like. The light emitting device 30 may emit light having different wavelengths according to a composition ratio of a compound semiconductor.

The light emitting device 30 may be adhered to the insertion groove 15 through the adhesive layer 31 while being accommodated in the insertion groove 15. The adhesive layer 31 (or an adhesive sheet) may be disposed between the light emitting device 30 and the insertion groove 15 of the light transmitting plate body 10 to adhere the light emitting device 30 and the light transmitting plate body 10. The adhesive layer 31 may be entirely applied onto the upper surface of the light emitting device 30. In addition, the adhesive layer 31 may be formed of a transparent material so that the light emitted from the light emitting device 30 may be easily transmitted.

The light emitting device 30 may include an electrode which is electrically connected to an external configuration of the light emitting device package so as to be positioned on the lower surface of the light emitting device 30.

The reflector 40 may be formed to surround the light transmitting plate body 10 and the light emitting device 30. The reflector 40 may protect the light emitting device 30 and the light transmitting plate body 10 from an external environment and/or an external impact. Further, the reflector 40 may reflect the light emitted from the light emitting device 30 in a specific direction (e.g., an upward direction).

The reflector 40 may be formed so as to surround the side of the light emitting device 30 which partially protrudes from the lower portion of the light transmitting plate body 10 without being completely inserted into the insertion groove 15. More specifically, as shown in the drawing, the reflector 40 may be formed to surround the side of the light emitting device 30 protruding to the lower portion of the light transmitting plate body 10 so that the lower surface of the light emitting device 30 coincides with the lower surface of the reflector. As a result, the lower surface of the reflector 40 may be formed on the same plane as the lower surface of the light emitting device 30.

Unlike the example, the lower surface of the light emitting device 30 may have a shape that further protrudes than the lower surface of the reflector 40 through at least one electrode formed on the lower surface of the light emitting device 30. That is, the lower surface of the light emitting device 30 may include at least one electrode, and the electrode may protrude further downward than the lower surface of the reflector 40.

The light emitted from the light emitting device 30 may be transmitted to the QD phosphor 20 through the light transmitting plate body 10. At this time, the light output from the upper portion of the light emitting device 30 reaches the QD phosphor 20 directly through the light transmitting plate body 10. In addition, the light output from the side of the light emitting device 30 reaches the reflector 40 through the light transmitting plate body 10.

The reflector 40 may have a shape that protrudes partially toward the empty portion 14 in correspondence with the shape of the curvature portion 17. Therefore, the light output from the side of the light emitting device 30 reaches the protruding portion of the reflector 40 and is reflected by the protruding reflector 40 and reflected toward the upper side of the light emitting device package 3200. As a result, the light emitted from the side of the light emitting device 30 may be transmitted to the QD phosphor 20 by the protruding reflector 40.

Therefore, since the light output from the side of the light emitting device 30 is relatively more reflected by the QD phosphor 20, the overall light amount of the light emitting device package 3200 is increased.

As described above, the light emitting device 30 is accommodated in the insertion groove 15, and the partition wall 16 supports a state in which the light emitting device 30 is adhered to the insertion groove 15 through the adhesive layer 31 to effectively prevent the lateral flow of the light emitting device 30.

Figure 33A:
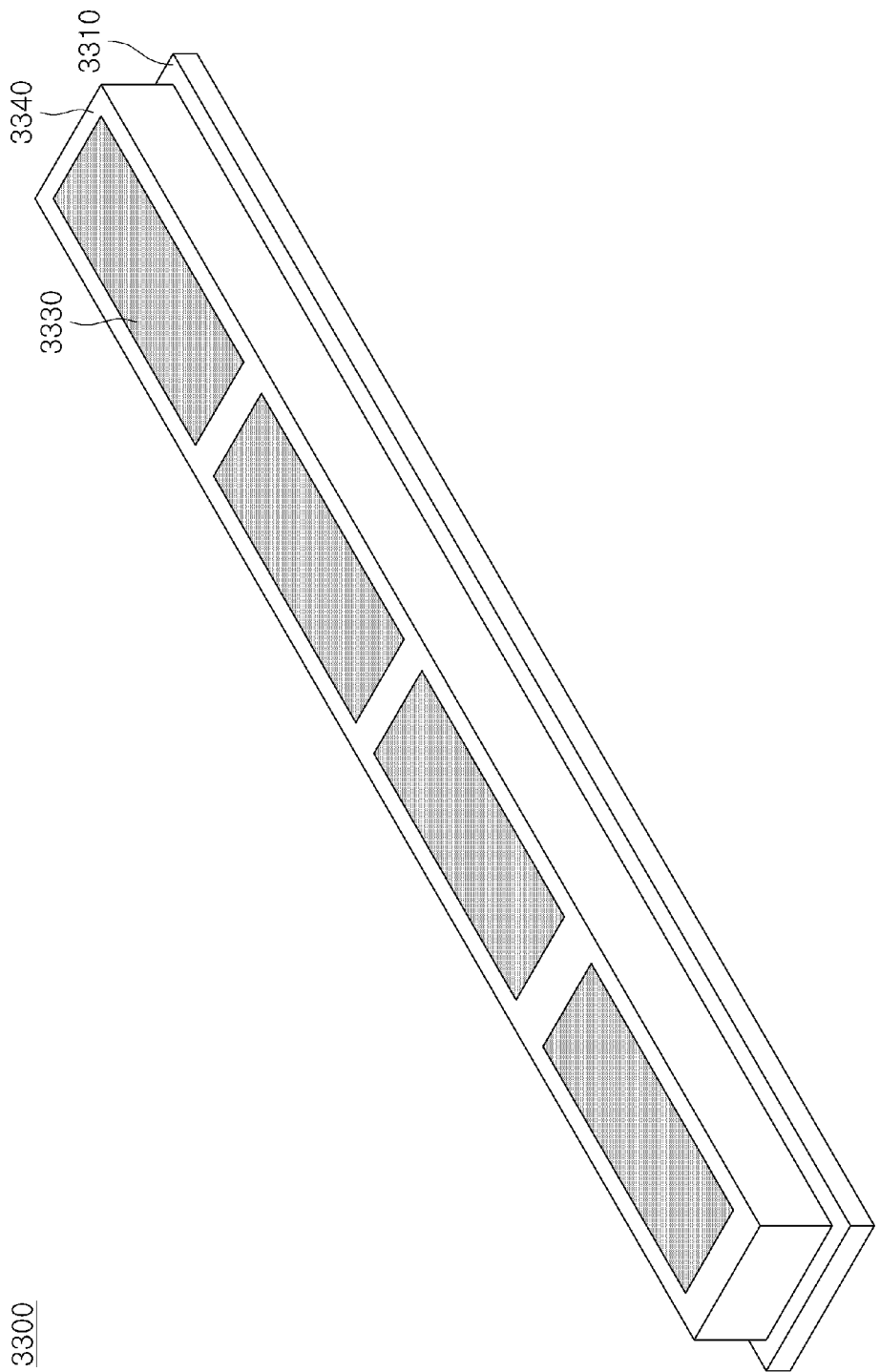
FIG. 33A is a perspective view of an LED module according to an exemplary embodiment of the present invention.
Figure 33B:
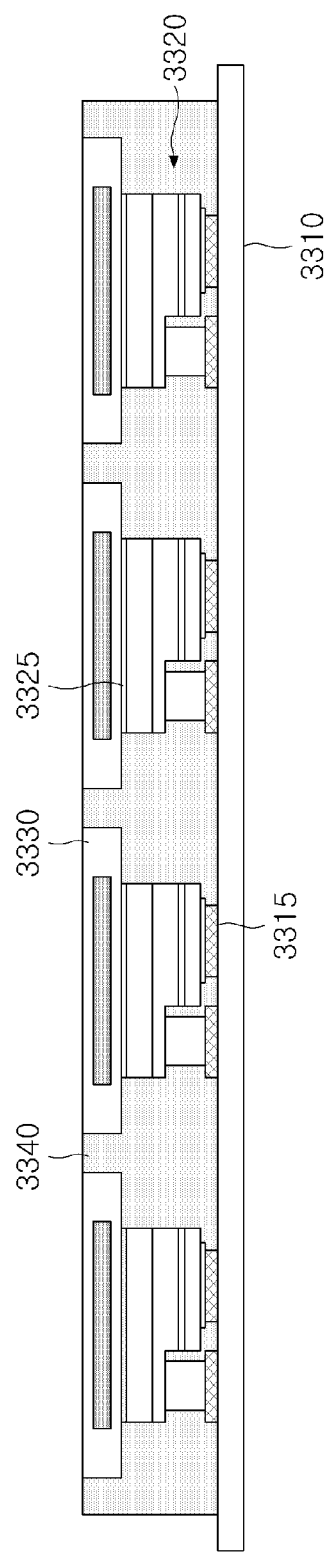
FIG. 33B is a cross-sectional view of an LED module according to an exemplary embodiment of the present invention.

FIG. 33A is a perspective view of an LED module according to an exemplary embodiment of the present invention, and FIG. 33B is a cross-sectional view of the LED module according to the exemplary embodiment of the present invention.

Referring to FIGS. 33A and 33B, an LED module 3300 according to an exemplary embodiment of the present invention may include a circuit board 3310, one or more light emitting devices 3320 mounted on the surface of the circuit board 3310, a QD plate assembly 3330 on each light emitting device 3320, and a reflection member 3340 surrounding the light emitting device 3320 and the QD plate assembly 3330.

The circuit board 3310 may include a circuit pattern for supplying power to each light emitting device 3320. For example, the circuit board 3310 may include first pads (not shown) for contacting a first conductive metal layer of each light emitting device 3320 and second pads (not shown) for contacting a second conductive metal layer of each light emitting device 3320.

The circuit board 3310 may be formed in various shapes according to functions and uses of the LED module 3300. As the circuit board 3310, a printed circuit board (PCB) substrate, a flexible printed circuit board (FPCB) substrate, or the like may be used, but it is not necessarily limited thereto.

The light emitting device 3320 may include a substrate (or a growth substrate), a first conductive semiconductor layer below the substrate, an active layer below the first conductive semiconductor layer, a second conductive semiconductor layer below the active layer, a second conductive metal layer below the second conductive semiconductor layer, and a first conductive metal layer below the first conductive semiconductor layer. The light emitting device 3320 is a flip chip type light emitting device in which the light emitting device 1700 of FIG. 17 is inverted upside down.

Bumps 3315 are disposed between the first and second pads of the circuit board 3310 and the first and second conductive metal layers of each light emitting device 3320 and then the plurality of light emitting devices 3320 may be surface-mounted on the circuit board 3310 by flip chip bonding.

The QD plate assembly 3330 may be disposed on each light emitting device 3320 to convert the wavelength of the light emitted from the light emitting device 3320. The QD plate assembly 3330 may include a QD phosphor, a lower light transmitting plate for accommodating the QD phosphor, and an upper light transmitting plate for covering the QD phosphor and the lower light transmitting plate.

An adhesive layer (or adhesive sheet) 3325 may be disposed between each light emitting device 3320 and each QD plate assembly 3330 to adhere the light emitting device 3320 to the QD plate assembly 3330. The adhesive layer 3325 may be entirely applied onto the upper surface of each light emitting device 3320.

The reflection member 3340 may be formed to surround the plurality of light emitting devices 3320 and the QD plate assembly 3330. The reflection member 3340 may protect the plurality of light emitting devices 3320 and the QD plate assembly 3330 from an external environment and/or an external impact. Further, the reflection member 3340 may reflect the light emitted from the plurality of light emitting devices 3320 in a specific direction (e.g., an upward direction).

The LED module 3300 may implement high color reproducibility by disposing a plurality of light emitting device packages on the circuit board. In addition, in the LED module 3300, a plurality of light emitting devices are surface-mounted on a circuit board, and then a QD plate assembly is adhered to each light emitting device so that QD phosphor included in the QD plate assembly is not exposed to a high temperature generated during the surface mounting.

FIGS. 34A to 34E are diagrams for describing a manufacturing method of an LED module according to an exemplary embodiment of the present invention.

Figure 34A:
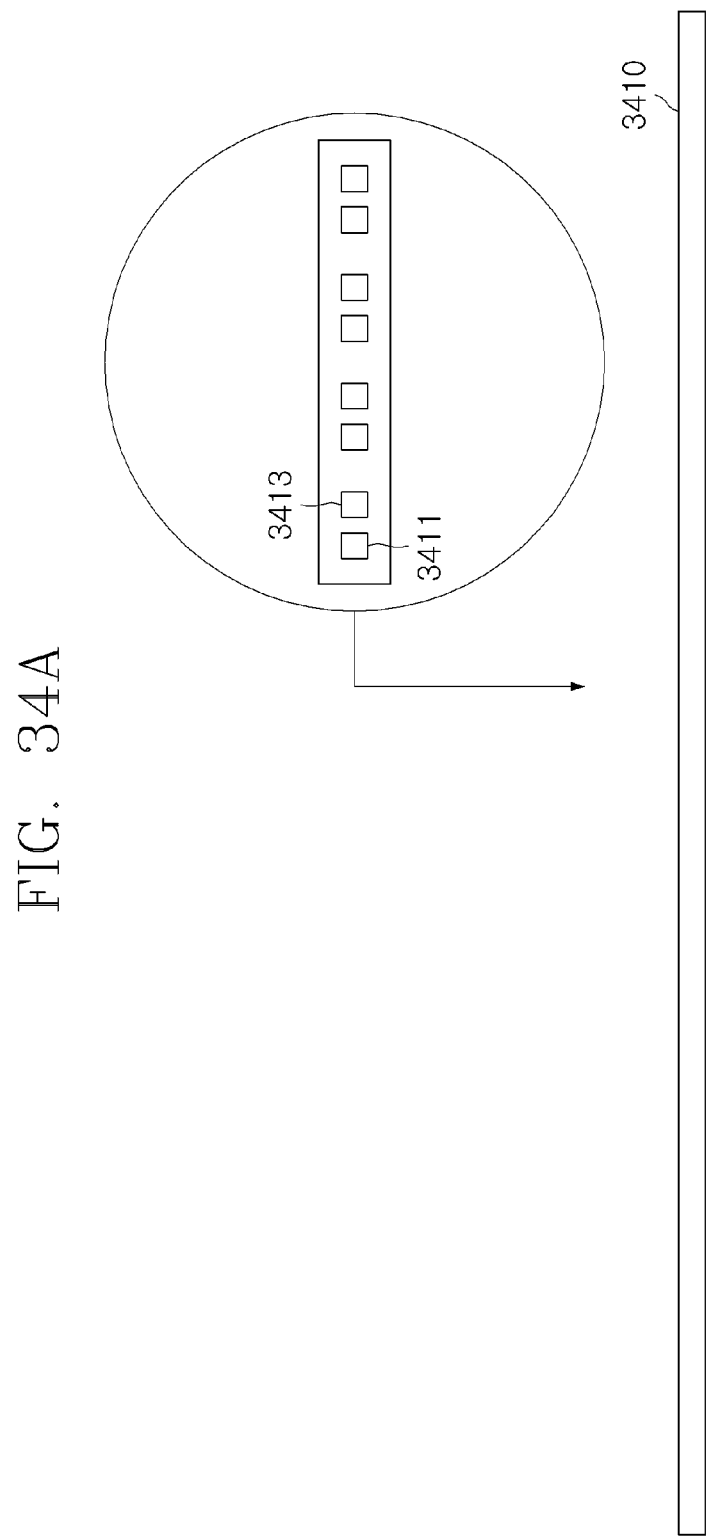
FIGS. 34A to 34E are diagrams for describing a manufacturing method of an LED module according to an exemplary embodiment of the present invention.
Figure 34B:
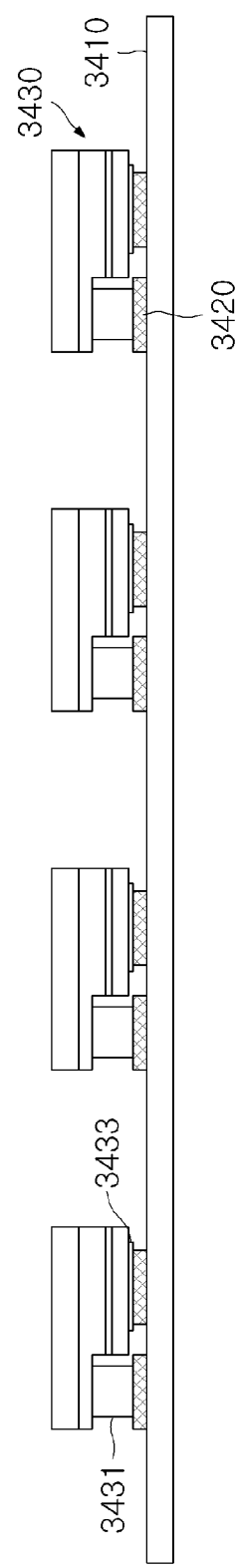

Referring to FIGS. 34A and 34B, a circuit board 3410 having first and second pads 3411 and 3413 may be formed or provided to surface-mount (surface mounting) a plurality of light emitting devices. Here, the first pads 3411 may be electrically connected to the first conductive metal layer of each light emitting device, and the second pads 3413 may be electrically connected to the second conductive metal layer of each light emitting device.

A plurality of bumps 3420 is disposed on the first and second pads 3411 and 3413 formed on the circuit board 3410. The circuit board 3410 in which the plurality of bumps 3420 is disposed and the plurality of light emitting devices 3430 are opposed to each other so that the first and second pads 3411 and 3413 and the first and second conductive metal layers 3431 and 3433 of the light emitting devices 3430 are brought into close contact with each other to correspond to each other one to one and then heated, respectively. The plurality of bumps 3420 is then melted so that the first and second pads 3411 and 3413 and the first and second conductive metal layers 3431 and 3433 corresponding thereto are electrically connected to each other.

Figure 34C:
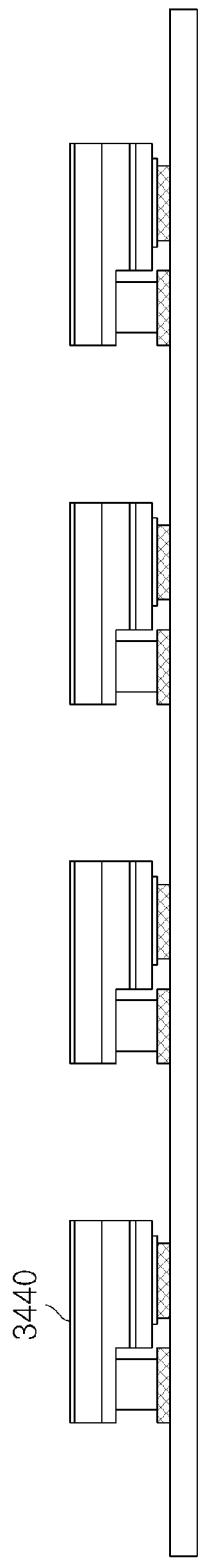
Figure 34D:
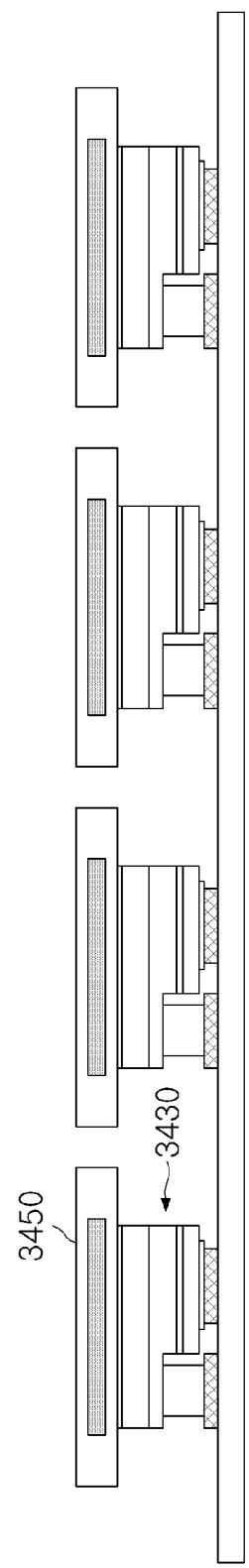

Referring to FIGS. 34C and 34D, when an SMT process is completed, an adhesive layer 3440 may be applied on each light emitting device 3430. At this time, the adhesive layer 3440 may be entirely applied onto the substrate of the light emitting device 3430.

A plurality of QD plate assemblies 3450 may be disposed on the plurality of light emitting devices 3430 to which the adhesive layer 3440 is applied. The adhesive layer 3440 may be cured under a constant temperature condition to adhere each light emitting device 3430 and each QD plate assembly 3450 corresponding thereto.

When a silicon (Si) material is used as the adhesive layer 3440, low temperature silicon is applied on each light emitting device 3430, each QD plate assembly 3450 is disposed thereon, and the corresponding silicon is cured under a constant temperature condition (e.g., a temperature condition of 150° C. or lower) to adhere each light emitting device 3430 and each QD plate assembly 3450.

Figure 34E:
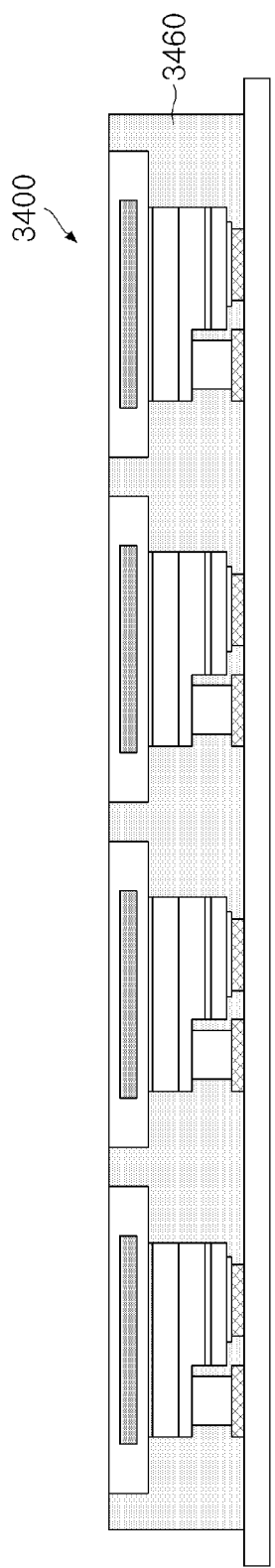

Referring to FIG. 34E, the reflection member 3460 may be filled using a silicon injection apparatus to surround the plurality of QD plate assemblies 3450 and the plurality of light emitting devices 3430. The reflection member 3460 may be filled up to the upper surface of the plurality of QD plate assemblies 3450. When a certain period of time has elapsed under a constant temperature condition (e.g., a condition of 100° or lower), the reflection member 3460 is solidly cured.

A chip on board (COB) type LED module 3400 may be implemented through the above-described processes. The LED module 3400 may be used as a backlight unit or a lighting unit for a display. In the LED module 3400 according to the present invention, a plurality of light emitting devices are surface-mounted on a circuit board, and then a QD plate assembly is adhered to each light emitting device so that QD phosphor included in the QD plate assembly is not exposed to a high temperature generated during the surface mounting.

As described above, effects of the quantum dot plate assembly and the light emitting device package including the same, and the LED module according to various exemplary embodiments of the present invention will be described as follows.

According to at least one of the exemplary embodiments of the present invention, the QD phosphor is injected into the empty space between the upper light transmitting plate and the lower light transmitting plate and then, the upper and lower light transmitting plates are welded with the laser beam to implement the QD plate assembly, thereby safely protecting the QD phosphor which is vulnerable to the external environmental conditions. Further, according to at least one of the exemplary embodiments of the present invention, by placing the heat dissipation member including the heat dissipation pattern layer having the predetermined repetition pattern and the plurality of cavity regions formed below the heat dissipation pattern layer on the upper surface of the upper light transmitting plate, emission of the heat generated from the QD plate assembly is improved, thereby enhancing reliability of the corresponding QD plate assembly.

According to at least one of the exemplary embodiments of the present invention, by keeping the empty space between the QD phosphor disposed in the empty portion of the light transmitting plate body and the upper light transmitting plate in the vacuum state through the laser glass welding using the air removing jig, degradation of the performance of the QD phosphor due to the external environmental conditions (moisture, oxygen, etc.) may be minimized. Further, according to at least one of the exemplary embodiments of the present invention, by injecting the nitrogen gas into the empty space between the QD phosphor disposed in the empty portion of the light transmitting plate body and the upper light transmitting plate in the vacuum state through the laser glass welding using the nitrogen injecting jig, the degradation of the performance of the QD phosphor due to the external environmental conditions (moisture, oxygen, etc.) may be minimized.

According to at least one of the exemplary embodiments of the present invention, by adding the auxiliary welding line in the direction corresponding to the longitudinal direction of the empty portions at the time of laser glass welding, the occurrence of the lifting phenomenon in the vicinity of the main welding lines may be minimized, thereby enhancing the yield of the QD plate assembly. In addition, according to at least one of the exemplary embodiments of the present invention, when the laser glass is welded, the time required for the laser welding process may be shortened and the coupling force between the lower light transmitting plate and the upper light transmitting plate may be enhanced by irradiating the laser beam in the diagonal direction along the predetermined welding lines.

According to at least one of the exemplary embodiments of the present invention, the QD plate assembly is disposed on the light emitting device to implement the light emitting device package, thereby implementing high color reproducibility in manufacturing the display and the light emitting device package is manufactured in the chip size package type, thereby simplifying a packaging process. Further, according to at least one of the exemplary embodiments of the present invention, the light passing through the glass of the light emitting device package is efficiently reflected by the reflector, thereby increasing the light amount of the light emitting device package.

According to at least one of the exemplary embodiments of the present invention, light emitting performance of the light emitting device package may be enhanced by reducing the fluidity of the light emitting device by further strengthening the adhesion and fixing states of the light emitting device with respect to the light transmitting plate body. Further, according to at least one of the exemplary embodiments of the present invention, the plurality of light emitting devices is surface-mounted on the circuit board and then, the QD plate assembly is bonded onto each light emitting device to implement the LED module, thereby preventing the QD phosphor included in the QD plate assembly from being exposed to a high temperature generated during the surface mounting.

Meanwhile, although the detailed exemplary embodiments have been described hereinabove, various modifications of the present invention can be made without departing from the scope of the present invention. Therefore, the scope of the present invention should not be limited to the exemplary embodiments and should be defined by the appended claims and equivalents to the appended claims.

What is claimed is:

1. A light emitting device package comprising:
    a light emitting device emitting light of a predetermined wavelength;
    a quantum dot (QD) plate assembly converting a wavelength of the light emitted from the light emitting device;
    an adhesive layer disposed between the light emitting device and the QD plate assembly to bond the light emitting device and the QD plate assembly; and
    a reflection member surrounding the light emitting device and the QD plate assembly,
    wherein the QD plate assembly includes a QD material converting the wavelength of the light, a light transmitting plate body for sealing the QD material, and a heat dissipation member disposed on the light transmitting plate body to discharge heat generated from the QD material to the outside,
    wherein the heat dissipation member includes a heat dissipation pattern layer having a predetermined repetition pattern structure and a plurality of cavity regions formed between a lower surface of the heat dissipation pattern layer and an upper surface of the light transmitting plate body.

2. The light emitting device package of claim 1, wherein the light transmitting plate body comprises a lower light transmitting plate including an empty portion for mounting the QD material and a plurality of side light transmitting plates surrounding the empty portion, and an upper light transmitting plate formed on an upper surface of the lower light transmitting plate.

3. The light emitting device package of claim 2, wherein a region where the upper light transmitting plate and the lower light transmitting plate meet each other is irradiated with a laser beam to be glass-welded and the laser beam is a femto laser beam having a wavelength of 1000 to 1100 nm.

4. The light emitting device package of claim 3, wherein the laser beam is irradiated in a vertical direction to an upper surface of the upper light transmitting plate.

5. The light emitting device package of claim 2, wherein the empty portion is formed by any one process of a mechanical manufacturing process, a chemical manufacturing process, and an assembly process.

6. The light emitting device package of claim 2, wherein upper portions of the plurality of side light transmitting plates and a contact portion of the upper light transmitting plate have flatness of 1 micrometer (μm) or less.

7. The light emitting device package of claim 2, wherein the adhesive layer is formed on a side surface and an upper surface of the light emitting device and a lower surface of the lower light transmitting plate.

8. The light emitting device package of claim 1, wherein the adhesive layer comprises a light scattering agent for scattering the light emitted from the light emitting device.

9. The light emitting device package of claim 1, wherein the adhesive layer is formed by a foamed adhesive sheet containing multiple air bubbles.

10. The light emitting device package of claim 2, wherein the empty portion is in a vacuum state.

11. The light emitting device package of claim 1, wherein a lower surface of the light emitting device includes at least one electrode and the at least one electrode is further protruded downward than a lower surface of the reflection member.

12. The light emitting device package of claim 1, wherein the light transmitting plate body comprises a lower light transmitting plate including an insertion groove into which a part of the light emitting device is inserted, a plurality of side light transmitting plates formed on an upper surface of the lower light transmitting plate, an upper light transmitting plate corresponding to the upper surface of the lower light transmitting plate and formed on upper surfaces of the plurality of side light transmitting plates, and an empty portion formed therein.

13. The light emitting device package of claim 2, wherein a curvature portion having a curvature is formed at an edge of a lower surface of the lower light transmitting plate.

14. The light emitting device package of claim 13, wherein the curvature portion has a shape protruding toward the empty portion.

15. The light emitting device package of claim 2, wherein a side surface of the light transmitting plate body is formed in a directional shape having a predetermined angle, and a width of the upper light transmitting plate is greater than a width of the lower light transmitting plate.

16. The light emitting device package of claim 15, wherein the predetermined angle is 60° to 80°.

17. The light emitting device package of claim 1, wherein the heat dissipation pattern layer is made of a metal oxide having light transmittance and thermal conductivity.

18. The light emitting device package of claim 1, wherein each of the plurality of cavity regions exists in a vacuum state.

* * * * *